(12) United States Patent
Sakai et al.

(10) Patent No.: US 8,201,047 B2
(45) Date of Patent: Jun. 12, 2012

(54) DECODING APPARATUS AND COMMUNICATIONS APPARATUS

(75) Inventors: Rui Sakai, Tokyo (JP); Wataru Matsumoto, Tokyo (JP); Yoshikuni Miyata, Tokyo (JP); Hideo Yoshida, Tokyo (JP); Takahiko Nakamura, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 1409 days.

(21) Appl. No.: 11/791,996

(22) PCT Filed: Dec. 1, 2005

(86) PCT No.: PCT/JP2005/022104
§ 371 (c)(1),
(2), (4) Date: May 31, 2007

(87) PCT Pub. No.: WO2006/059688
PCT Pub. Date: Jun. 8, 2006

(65) Prior Publication Data
US 2008/0246639 A1     Oct. 9, 2008

(30) Foreign Application Priority Data
Dec. 2, 2004 (JP) ................. 2004-350168

(51) Int. Cl.
*H03M 13/00* (2006.01)
(52) U.S. Cl. ........ 714/755; 714/786; 714/794; 714/795; 714/796; 375/262; 375/341
(58) Field of Classification Search .................. 714/755, 714/786, 794–796; 375/262, 341
See application file for complete search history.

(56) References Cited

U.S. PATENT DOCUMENTS

| 6,633,856 B2 | 10/2003 | Richardson et al. |
| 6,829,308 B2 | 12/2004 | Eroz et al. |
| 2004/0109507 A1* | 6/2004 | Kanter et al. ............ 375/259 |

(Continued)

FOREIGN PATENT DOCUMENTS

JP    2003-204272 A    7/2003

(Continued)

OTHER PUBLICATIONS

Guilloud, "Architecture générique de décodeur de codes LDPC,", These présentée pour obtenir le grade de docteur de l'Ecole nationale supérieure des télécommunications, Jul. 2, 2004, pp. 1-166, XP-002370625.

(Continued)

*Primary Examiner* — Guy Lamarre
(74) *Attorney, Agent, or Firm* — Birch, Stewart, Kolasch & Birch, LLP

(57) ABSTRACT

A decoding apparatus includes a row processing unit 5 and a column processing unit 6 for performing a calculation and an update of probability information with row processing and column processing according to a Min-Sum algorithm on a received signal which is low-density parity-check coded in batches of 1 bit or a predetermined number of bits, a decoded result judgment unit 8 for determining a decoded result from a hard decision of a posterior value, for performing a parity check on the decoded result, and for judging whether or not the decoded result is correct, and a control unit for controlling iteration of decoding processing by the row processing unit 5 and column processing unit 6 on the basis of the judgment result of the decoded result judgment unit 8.

4 Claims, 24 Drawing Sheets

U.S. PATENT DOCUMENTS

2008/0109698 A1* 5/2008 Yang et al. .................... 714/758

FOREIGN PATENT DOCUMENTS

| JP | 2004-274186 A | 9/2004 |
|---|---|---|
| JP | 2005-532766 A | 10/2005 |
| WO | WO-2004/010588 A | 1/2004 |

OTHER PUBLICATIONS

Lechner et al., "Implementation of an LDPC Decoder on a Vector Signal Processor," RPOC., The 38th Asilomar Conference on Signals, Systems and Computers, vol. 7, Nov. 7, 2004, pp. 549-553.

Juntan Zhang & Marc Fossorier, Shuffled Belief Propagation Decoding, Signals, Systems and Computers, 2002. Conference Record of the Thrity-Conference on, vol. 1, Nov. 3, 2002, pp. 8 to 15.

Farhad Zarkeshvari Amir H. Banihashemi, On Implementation of Min-Sum algorithm for Decoding Low-Density Parity-Check (LDPC) Codes, Global Telecommunications Conference, 2002. GLOBECOM'02, IEEE, Nov. 17, 2002, pp. 1349 to 1353.

Marc P. C. Fossorier & Miodrag Mihaljevic & Hideki Imai, Reduced Complexity Interative Decoding of Low-Density Parity Check Codes Based on Belief Propagation, IEEE Transactions on Communications, vol. 47, Issue 5, May 1999, pp. 673 to 680.

Jinghu Chen & Marc P. C. Fossorier, Density Evolution for BP-Based Decoding Algorithms of LDPC Codes and Their Quantized Versions, Global Telecommunications Conference, 2002. GLOBECOM'02. IEEE, vol. 2, Nov. 17, 2002, pp. 1378 to 1382.

Achilleas Anastasopoulos, A comparison between the sum-product and the min-sum iterative detection algorithm based desity evolution, Global Telecommunications Conference, 2001. GLOBECOM'01, IEEE, vol. 2, Nov. 25, 2001, pp. 1021 to 1025.

Rui Sakai, Ayumu Matsumoto, Hideo Yoshida, "LDPC Fugo no Kan'i Fugoho to noso Risanka Mitsudo Hattenho- $\delta$-min Fugoho to noso Risanka Mitsudo Hattenho ni yoru Tokusei Hyoka-", The Institute of Electronics, Information and Communication Engineers Gijutsu Kenkyu Hokoku (RCS2005-42), vol. 105, No. 196, Jul. 21, 2005, pp. 13 to 18.

Tadashi Wadayama, "Low-Density Parity-Check Code, and Decoding Method LDPC (Low Density Parity Check) code/Sum-Product Decoding Method", Triceps, Jun. 5, 2002, pp. 76 to 99.

J. Chen et al.. "Reduced-Complexity Decoding of LDPC Codes". Dept. Electrical Engineering, Univ. Hawaii at Manoa, Honolulu, U.S.A. & IBM Research, Zurich Research Laboratory, Ruschlikon, Switzerland.

Jinghu Chen and Marc P. C. Fossorier "Density Evolution for Two Improved BP-Based Decoding Algorithms of LDPC Codes", IEEE Communication Letters, vol. 6, No. 5, May 2002.

Hu, Xiao-Yu et al., "Efficient Implementations of the Sum-Product Algorithm for Decoding LDPC Codes", IBM Research, Zurich Research Laboratory, Ruschlikon, Switzerland.

Hagiwara, Haruo, "Foundation of turbo code", Triceps, Oct. 7, 1999. pp. 37 to 46.

Vogt, J. et al., "Improving the max-log-MAP turbo decoder", Electronics Letters, vol. 36, No. 23, pp. 1937 to 1939.

* cited by examiner

Output of Result

Output of Result

Output of Result

Output of Result

$1 \sim n_1-1$  $\quad n_1 \sim N$

```
1 1 0 0 1 0 0 0 | 1 0 0 0 0 0 0 0
1 0 1 0 0 0 0 0 | 1 1 0 0 0 0 0 0
0 0 0 1 0 0 1 0 | 0 1 1 0 0 0 0 0
0 0 0 0 0 1 0 1 | 0 0 1 1 0 0 0 0
1 0 0 0 0 0 1 0 | 0 0 0 1 1 0 0 0
0 0 0 1 0 1 0 0 | 0 0 0 0 1 1 0 0
0 1 0 0 1 0 0 0 | 0 0 0 0 0 1 1 0
0 0 1 0 0 0 0 1 | 0 0 0 0 0 0 1 1
```

$\} 1 \sim M$

Except LSB  $\quad$  Except MSB

Decoded Result

1st-Row-Related Processing    2nd-Row-Related Processing

1st-To-Pth-Column-Related Processing pth-to-2pth-Column-Related Processing

Decoded Result

DECODING APPARATUS AND COMMUNICATIONS APPARATUS

FIELD OF THE INVENTION

The present invention relates to an error correction technology for use in digital communications. More particularly, it relates to a decoding apparatus which decodes an encoded signal which is a low-density parity-check LDPC (Low-Density Parity Check) code or a turbo code, and a communications apparatus provided with this decoding apparatus.

BACKGROUND OF THE INVENTION

A Sum-Product algorithm and a Min-Sum algorithm are known as fundamental algorithms used for decoding an LDPC coded signal. According to each of these decoding algorithms, a decoding apparatus decodes a received signal by calculating a log-likelihood ratio LLR (Log Likelihood Ratio) as probable reliability information on the received signal while performing an iterative operation on the received signal (for example, refer to nonpatent reference 1).

In the Sum-Product algorithm, arithmetic operations (e.g., an addition of real numbers and an evaluation of functions) using, for example, mathematical functions, such as a tan h function, are required, and therefore the calculation cost is high. For this reason, it is necessary to lower the calculation cost by, for example, preparing a table holding values of each of the functions in order to implement the Sum-Product algorithm. On the other hand, because exact arithmetic operations are performed in the Sum-Product algorithm, an advantage of improving the decoding performance is provided.

On the other hand, because simple equations which approximate the mathematical functions for use in the Sum-Product algorithm are used in the Min-Sum algorithm, the Min-Sum algorithm can be implemented via only four types of arithmetic operations including an addition, a judgment of a minimum, a judgment of whether a number is positive or negative, and a multiplication of the signs of positive and negative numbers. For this reason, the calculation cost becomes small. However, the decoding performance degrades under the influence of the approximation.

In the prior art decoding algorithms used for decoding an LDPC encoded signal, iterative decoding is carried out on the basis of transmission of probability information. In accordance with the Sum-Product algorithm and the Min-Sum algorithm, column processing is performed on all the bits of the encoded signal after all row processings on the encoded signal are completed at an arbitrary iteration of the iterative decoding.

For example, assuming that the check matrix of a LDPC code to be decoded is a binary m×n matrix $H=[H_{m,n}]$ (n is an integer equal to or larger than 0 and smaller than N, and m is an integer equal to or larger than 0 and smaller than M), the row processing is performed on all members (m,n) which satisfy $H_{m,n}=1$ in order of m=1, 2, 3, . . . , and M, and, after that, the column processing is performed on all the members (m,n) which satisfy $H_{m,n}=1$ in order of n=1, 2, 3, . . . , and N.

For this reason, when the number of times that iteration is carried out in the decoding processing increases, there arises a problem that a delay which occurs in the decoding processing increases. To solve this problem, there has been provided a Shuffled BP (Belief Propagation) algorithm as a decoding algorithm which reduces the number of times of iterative decoding (for example, refer to nonpatent reference 2).

In accordance with the Shuffled BP algorithm, a calculation and an update of probability information with row processing and column processing are performed on an encoded signal in batches of 1 bit. Thus, the Shuffled BP algorithm provides an advantage of making it possible to carry out transmission of the probability information efficiently, thereby speeding up the convergence. Hereafter, this Shuffled BP algorithm will be explained briefly.

First, in an initialization step, the number of iterations i is set to i=1, a maximum number of iterations is expressed as $I_{max}$, and an initial value $z_{m,n}^{(0)}$ of the log-likelihood ratio LLR (Log Likelihood Ratio) is defined as $F_n(z_{m,n}^{(0)}:=F_n)$. The check matrix H of the LDPC code to be decoded is a binary m×n matrix $H=[H_{m,n}]$ (n is an integer equal to or larger than 0 and smaller than N, and m is an integer equal to or larger than 0 and smaller than M), and $H_{m,n}$ is an element in the mth row and nth column of the matrix H.

Next, in step 1, a row process of computing the following equations (2) and (3) under a condition shown by the following equation (1) is carried out. Here, N(m) and M(n) are subsets of the set [1,N], and they are defined as follows: $N(m):=\{n:H_{m,n}=1\}$ and $M(n):=\{m:H_{m,n}=1\}$. That is, N(m) means a set of column indices which have 1 in the mth row of the check matrix H, and M(n) means a set of column indices which have 1 in the mth row of the LDPC check matrix H.

[Equation 1]

$$0 \le g < G \ (g: \text{Integer}, G = N/N_g) \quad (1)$$
$$g \cdot N_g + 1 \le n \le (g+1) \cdot N_g, m \in M(n)$$

$$\tau_{m,n}^{(i)} = \prod_{\substack{n' \in N(m) \setminus n \\ n' \le g \cdot N_g}} \tanh(z_{m,n'}^{(i)}/2) \prod_{\substack{n' \in N(m) \setminus n \\ n' \ge g \cdot N_g + 1}} \tanh(z_{m,n'}^{(i-1)}/2) \quad (2)$$

$$\varepsilon_{m,n}^{(i)} = \log \frac{1 + \tau_{m,n}^{(i)}}{1 - \tau_{m,n}^{(i)}} \quad (3)$$

In addition, a set which is acquired by removing an element a from a set A is expressed as A\a. In other words, N(m)\n shows a set of column indices in which the nth column is removed from the set N(m), and M(n)\m shows a set of row indices in which the mth row is removed from the set M(n). $z_{m,n}^{(i)}$ is an LLR which is updated at the ith iteration, and $\varepsilon_{m,n}^{(i)}$ is an LLR at the ith iteration which is sent from a check node to a bit node.

Furthermore, in step 1, a column process of computing the following equations (4) and (5) under the condition shown by the above-mentioned equation (1) is carried out. Here, $z_{m,n}^{(i)}$ is an LLR at the ith iteration which is sent from the bit node to the check node. Furthermore, $z_n^{(i)}$ is a posterior value at the ith iteration.

[Equation 2]

$$z_{m,n}^{(i)} = F_n + \sum_{m' \in M(n) \setminus m} \varepsilon_{m',n}^{(i)} \quad (4)$$

$$z_n^{(i)} = F_n + \sum_{m \in M(n)} \varepsilon_{m,n}^{(i)} \quad (5)$$

Next, in step 2, a hard decision of the posterior value $z_n^{(i)}$ is carried out, and a decoded sequence shown by the following equation (6) is created. Then, if a condition shown by the following equation (7) is satisfied, the sequence shifts to a process of step 3 which will be mentioned later, and, if neither of the these two conditions is satisfied, the number of iterations i is incremented, and the sequence returns to the process of step 2. In step 3, the decoded sequence according to the following equation (6), which is acquired in step 2, is outputted as a decoded result. $w_n$ in the following equation (6) is an element at n=1 to N of the decoded sequence w.

[Equation 3]

$$w=[w_n] \quad (6)$$

[Equation 4]

Parity check: $OK(H \cdot w=0)$ or $$\text{Maximum number of iterations } i=I_{max} \quad (7)$$

In the above-mentioned Shuffled BP algorithm, focusing attention to the number of iterations i, it is understood that transmission of the probability information is carried out efficiently by carrying out the row processing using $z_{m,n}^{(i)}$ which is an LLR updated at the same ith iteration.

In accordance with nonpatent reference 2, a case in which a calculation and an update of the probability information with row processing and column processing are performed on the received signal in batches of 1 bit, assuming $N_g=1$, is defined as the Shuffled BP algorithm, and a case in which a calculation and an update of the probability information with row processing and column processing are performed on the received signal in batches of two or more predetermined bits, assuming $1<N_g<N$, is defined as the Group Shuffled BP algorithm. This specification follows these definitions. The case of $N_g=N$ is defined as the Sum-Product algorithm. For the sake of simplicity, $N_g$ is a divisor of N.

On the other hand, as decoding algorithms of decoding an LDPC code at much the same calculation cost as the Min-Sum algorithm, and of being able to reduce the degradation in the decoding performance, as compared with the Sum-Product algorithm, the Normalized BP algorithm and the Offset BP algorithm have been proposed (for example, refer to nonpatent reference 3).

To be brief, in accordance with the Normalized BP algorithm, because an LLR which is calculated with the Min-Sum algorithm is always larger than an LLR which is calculated with the Sum-Product algorithm, an LLR which is calculated through row processing according to the Min-Sum algorithm is divided by a factor $\alpha$ (>1) which is called a normalization factor, and is then delivered. Furthermore, in accordance with the Offset BP algorithm, an LLR calculated through row processing based on the Min-Sum algorithm is subtracted from a factor $\beta$ (>0) which is called an offset factor, and is then delivered.

Thus, although division and subtraction operations are performed when decoding an LDPC code, increase in the calculation cost due to the division and subtraction operations is not so big, and therefore the degradation in the decoding performance can be reduced as compared with the case of using the Sum-Product algorithm. Each of the factors $\alpha$ and $\beta$ only has to be calculated beforehand using a simulation or a density evolution method (for example, refer to nonpatent reference 4), and held by an LDPC decoding unit.

Furthermore, there has been provided an algorithm of correcting for an LLR calculated through the row processing based on the Min-Sum algorithm according to the magnitude of the received signal (for example, refer to nonpatent reference 5). In accordance with this decoding algorithm, a table of a correction function is prepared as a correction term of the Min-Sum algorithm, and a precise correction is made by changing the correction term according to the magnitude of the received signal so that the decoding performance is improved.

In addition, there has been provided a method of controlling the sequence of operations of the Shuffled BP algorithm according to the magnitude of a received LLR as communication path information. In accordance with this method, received LLRs calculated from received information are ranked in order of decreasing absolute value or increasing absolute value, and are decoded according to the Shuffled BP algorithm.

As fundamental algorithms of decoding a turbo encoded signal, the Log-MAP (Maximum A Posteriori Probability) algorithm and the Max-Log-Map algorithm have been proposed. According to these decoding algorithm, while a metric value is calculated as probable reliability information on the received signal, an iterative operation is performed on the received signal so that it is decoded (for example, refer to nonpatent reference 6).

According to the Log-MAP algorithm, arithmetic operations (e.g., an addition of a real number and an evaluation of a function) using, for example, a mathematical function, such as an exponential function, are required, and therefore the calculation cost is high. For this reason, it is necessary to lower the calculation cost by, for example, preparing a table holding values of the function in order to implement the Log-MAP algorithm. In contrast, because precise operations are performed according to the Log-MAP algorithm, an advantage of improving the decoding performance is provided.

On the other hand, because a simple equation which approximates the mathematical function of the Log-Map algorithm is used in the Max-Log-MAP algorithm, the Max-Log-MAP algorithm can be implemented via only four types of arithmetic operations including an addition, a judgment of a maximum, a judgment of whether a number is positive or negative, and a multiplication of the signs of positive and negative numbers. A logarithm computation for the sum of an exponential function which is carried out in the Log-MAP algorithm is approximated by a maximum of an exponent. For this reason, because the process containing the mathematical function can be eliminated, the calculation cost can be reduced. However, the decoding performance degrades under the influence of the approximation.

On the other hand, there has been provided a decoding algorithm of decoding a turbo code at much the same calculation cost as the Max-Log-MAP algorithm, and of being able to reduce the degradation in the decoding performance, as compared with the Map algorithm (for example, refer to nonpatent reference 7).

To be brief, a metric value calculated through a metric calculation based on the Max-Log-Map algorithm is defined as an LLR which is adjusted to a value which is much the same as that which is multiplied by a factor s and is calculated according to the MAP algorithm, and which is delivered.

Thus, although multiplications are performed when a turbo code is decoded, the increase in the calculation cost due to the multiplications is not so big, and the degradation in the decoding performance can be reduced as compared with the case of using the Log-MAP algorithm. Furthermore, the factor s only has to be calculated in advance using a simulation, and held by a turbo decoding unit.

[Nonpatent reference 1] Tadashi Wadayama, "Low-Density Parity-Check Code, and Decoding method LDPC (Low Density Parity Check) code/Sum-Product Decoding Method", Triceps, Jun. 5, 2002, pp. 76-99

[Nonpatent reference 2] Juntan Zhang et al., "Shuffled Belief Propagation Decoding", [online], [retrieved on Sep. 28, 2004], http://lester.univ-ubs.fr:8080/~boutillon/Journee_GDR_LDPC/Fossorier1_GDR_LDPC.pdf

[Nonpatent reference 3] Jinghu Chen et al., "Reduced-Complexity Decoding of LDPC Codes", [online], [retrieved on Sep. 28, 2004], http://www-ee.eng.hawaii.edu/~jinghu/FILES/tcom02v3p2.pdf

[Nonpatent reference 4] Jinghu Chen et al., "Density evolution of two improved BP-based algorithms for LDPC decoding", IEEE Communications Letters, March 2002

[Nonpatent reference 5] Xiao-Yu et al., "Efficient Implementation of the Sum-Product algorithm for Decoding LDPC Codes", Proc. 2001 IEEE GlobeCom Conf., pp. 1036-1036E, November 2001

[Nonpatent reference 6] Haruo Hagiwara, "Foundation of turbo Code", Triceps, Oct. 7, 1999, pp. 37-46

[Nonpatent reference 7] J Vogt et al., "Improving the max-log-MAP turbo decoder", ELECTRONICS LETTERS, Vol. 36, No. 23, p. 1937-1938

A problem with prior art decoding apparatus for decoding an LDPC encoded signal according to the Min-Sum algorithm is that the number of iterations must increase in order to maintain the decoding performance, and therefore a decoding delay also becomes large with this increase in the number of iterations. This tendency also appears in both the Normalized BP algorithm which uses an approximation update equation based on the Min-Sum algorithm as a fundamental update equation, and the Offset BP algorithm.

The decoding performance of the Normalized BP algorithm and that of the Offset BP algorithm are greatly dependent upon the values of the factor $\alpha$ (normalization factor) and factor $\beta$ (offset factor), respectively. For this reason, in the case of each of the Normalized BP algorithm and Offset BP algorithm, although it is necessary to calculate each of the factors $\alpha$ and $\beta$ in advance, sufficient decoding performance cannot be achieved if the value of each of the factors $\alpha$ and $\beta$ is not changed dependently upon the construction of codes and the communication path when actually implemented in a receiving apparatus or the like.

Furthermore, with the decoding algorithm of correcting for an LLR calculated through the row processing based on the Min-Sum algorithm according to the magnitude of the received signal, it is necessary to provide a correction term table for holding a correction constant according to the received information (i.e., the magnitude of the received signal), and therefore it is not easy to implement the decoding algorithm. Also in a case of an algorithm which needs a mathematical function, such as a tan h function, when decoding a code, such as the Sum-Product algorithm or the Shuffled BP algorithm, the calculation cost becomes high and the hardware structure becomes complicated and therefore it is difficult to implement the algorithm.

Furthermore, with the Shuffled BP algorithm and the Group Shuffled BP algorithm, a decoding operation is sequentially performed on a code in batches of one bit from the leading bit of the code, or a decoding operation is sequentially performed on the code in batches of two or more bits from the leading two or more bits of the code. A problem with the Shuffled BP algorithm and the Group Shuffled BP algorithm is therefore that it is impossible to provide an optimal sequence of operations for the code construction and the modulation method. Another problem with the technology for controlling the sequence of operations according to the magnitudes of received LLRs, as communication path information, calculated from the received information is that it is necessary to change the sequence of operations every time when LLRs are received.

Furthermore, the decoding performance of the Max-Log-MAP algorithm for multiplying the value by the above-mentioned factor s depends upon the value of the factor s. For this reason, although it is necessary to calculate the factor s in advance, sufficient decoding performance cannot be achieved if the value of the factor s is not changed dependently upon the construction of codes and the communication path when actually implemented in a receiving apparatus or the like.

The present invention is made in order to solve the above-mentioned problems, and it is therefore an object of the present invention to provide a decoding method of and a decoding apparatus for decoding an encoded signal by providing an efficient probability transmission algorithm for the Min-Sum algorithm, and the Normalized BP algorithm and the Group Shuffled BP algorithm which use a fundamental update equation based on the Min-Sum algorithm, thereby speeding up the convergence of operation results and reducing the number of times that iterative decoding is carried out, and a communications apparatus provided with the decoding apparatus.

It is another object of the present invention to provide a decoding apparatus which can have a high decoding capability at a calculation cost which is much the same as that of the Min-Sum algorithm without using a complicated mathematical function, unlike the Sum-Product algorithm, without being greatly dependent on factors, unlike the Normalized BP algorithm and the Offset BP algorithm, and without having to hold a correction term as a table, and a communications apparatus provided with the decoding apparatus.

It is a further object of the present invention to provide a decoding apparatus which even when a received code has been multi-level modulated and transmitted thereto, and even when the received code is an irregular LDPC code, can efficiently carry out control of the sequence of operations of a decoding algorithm of performing a calculation and an update of probability information with row processing and column processing on the received signal in batches of one 1 bit or two or more predetermined bits, and can also reduce the number of iterations, and a communications apparatus provided with the decoding apparatus.

It is a still further object of the present invention to provide a decoding apparatus which when a received code has been multi-level modulated and transmitted thereto, improves the decoding performance thereof by determining a factor $\alpha$ (normalization factor) or a factor $\beta$ (offset factor) dependently upon the modulation method and the code construction, and a communications apparatus provided with the decoding apparatus.

It is another object of the present invention to provide a decoding apparatus which can reduce an operation delay time by parallelizing a process of performing a calculation and an update of probability information with row processing and column processing on the received signal in batches of one 1 bit or two or more predetermined bits, like the Shuffled BP algorithm, and a communications apparatus provided with the decoding apparatus.

It is a further object of the present invention to provide a decoding apparatus which can have a high decoding capability at a calculation cost which is much the same as that of the Max-Log-MAP algorithm without using a complicated mathematical function, unlike the Log-MAP algorithm, and a communications apparatus provided with the decoding apparatus.

DISCLOSURE OF THE INVENTION

A decoding apparatus in accordance with the present invention includes a decoding means for performing a calculation and an update of probability information with row processing and column processing according to a "Min-Sum algorithm" on a received signal which is low-density parity-check (Low-density Parity-check: LDPC) coded in batches of 1 bit or a predetermined number of bits.

Therefore, the present invention offers an advantage of being able to decode the received signal with a smaller number of iterations, as compared with a decoding apparatus according to a prior art decoding algorithm for decoding an LDPC code, and also to reduce the calculation cost required for the decoding.

The present invention offers another advantage of being able to reduce the degradation in the decoding performance without using a complicated mathematical function for a turbo-coded received signal, unlike the Map algorithm, at substantially the same calculation cost as that of the Max-Log-MAP algorithm, and without the decoding performance being dependent upon any factor, unlike the Max-Log-MAP algorithm with multiplication of the above-mentioned factor s.

BRIEF DESCRIPTION OF THE FIGURES

FIG. 26 is a diagram showing the construction of an LDPC code which the communications apparatus in accordance with embodiment 16 uses;

FIG. 27 is a diagram showing an example of assignment of bits in a case of modulating an LDPC code with a modulation method of 4PAM type and transmitting or receiving it in the communications apparatus in accordance with embodiment 16;

PREFERRED EMBODIMENTS OF THE INVENTION

Hereafter, in order to explain this invention in greater detail, the preferred embodiments of the present invention will be described with reference to the accompanying drawings.

Embodiment 1

Figure 1:
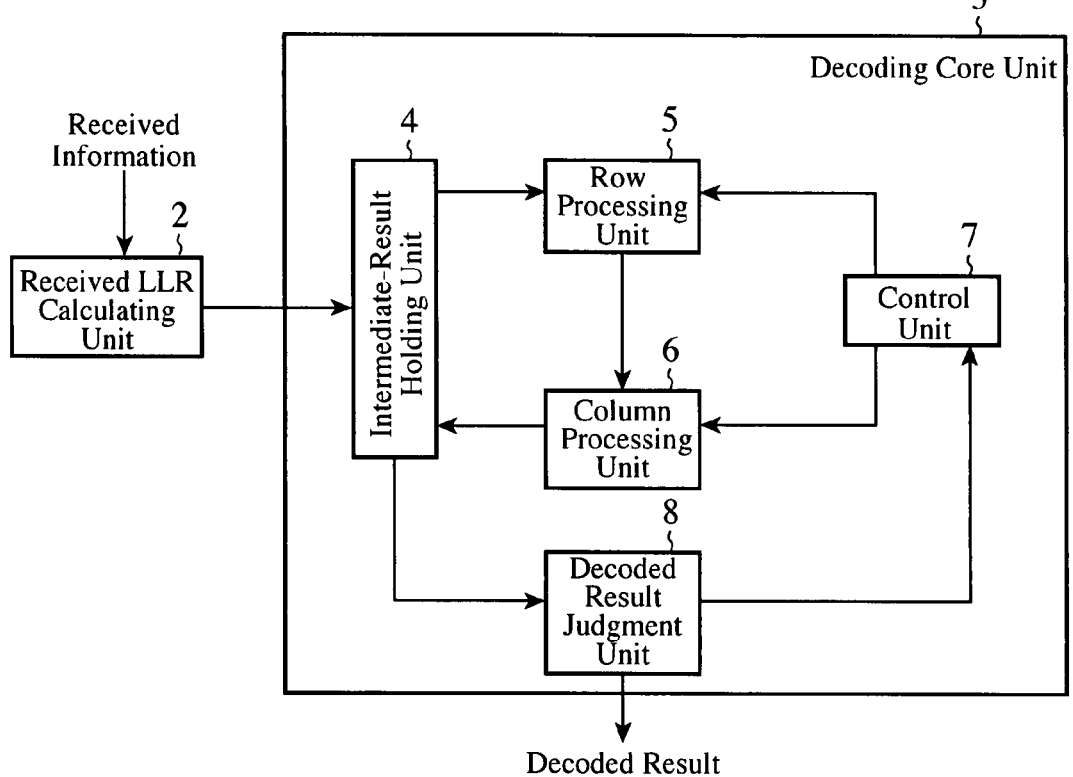
FIG. 1 is a block diagram showing the structure of an LDPC code decoding apparatus in accordance with embodiment 1 of the present invention.

FIG. 1 is a block diagram showing the structure of an LDPC code decoding apparatus in accordance with embodiment 1 of the present invention. The LDPC code decoding apparatus 1 in accordance with this embodiment 1 is provided with a received LLR calculating unit 2 and a decoding core unit (a decoding means) 3. The received LLR calculating unit 2 receives an LDPC (Low-Density Parity Check) encoded signal, calculates a log-likelihood ratio LLR (Log Likelihood Ratio) (referred to as a received LLR from here on), and outputs it to the decoding core unit 3. The decoding core unit 3 is provided with an intermediate-result holding unit 4, a row processing unit 5, a column processing unit 6, a control unit 7, and a decoded result judgment unit 8.

The intermediate-result holding unit 4 holds intermediate results of decoding processing carried out by the row processing unit 5 and column processing unit 6 on the basis of the received LLR inputted from the received LLR calculating unit 2. The row processing unit 5 carries out row processing. The column processing unit 6 carries out column processing. The control unit 7 controls the iteration of the decoding processing carried out by the row processing unit 5 and column processing unit 6. The decoded result judgment unit 8 determines the decoded result from a hard decision of a posterior value, and performs a parity check on the decoded result so as to judge whether or not the decoded result is correct.

The row processing unit 5 in accordance with this embodiment 1 performs an arithmetic operation according to the following equation (8), instead of arithmetic operations according to the above-mentioned equations (1) and (2), on the above-mentioned equation (1). That is, in the row processing of step 1 based on the above-mentioned Shuffled BP algorithm, the row processing unit 5 carries out an update operation according to an update equation for use in the Min-Sum algorithm. Symbols in the following equation are the same as those mentioned above.

[Equation 5]

$$\varepsilon_{m,n}^{(i)} = \prod_{\substack{n' \in N(m) \setminus n \\ n' \leq g \cdot N_g}} \text{sign}(z_{m,n'}^{(i)}) \qquad (8)$$

$$\prod_{\substack{n' \in N(m) \setminus n \\ n' \geq g \cdot N_g + 1}} \text{sign}(z_{m,n'}^{(i-1)}) \cdot \text{MIN}\left( \min_{\substack{n' \in N(m) \setminus n \\ n' \leq g \cdot N_g}} (|z_{m,n'}^{(i)}|),\ \min_{\substack{n' \in N(m) \setminus n \\ n' \geq g \cdot N_g + 1}} (|z_{m,n'}^{(i-1)}|) \right)$$

Figure 2:
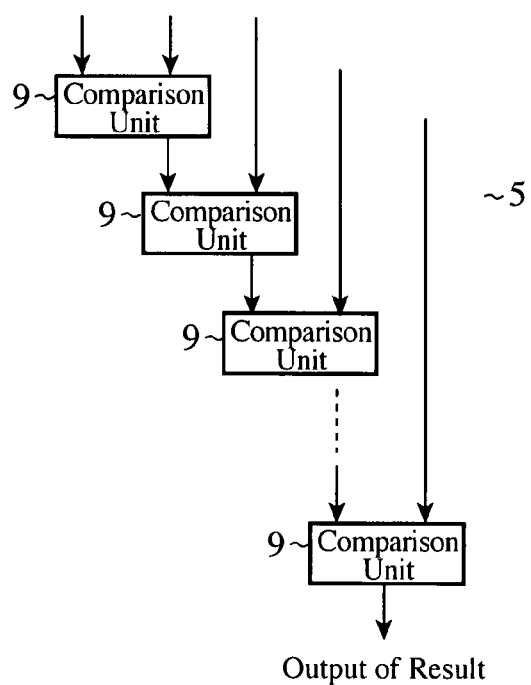
FIG. 2 is the block diagram showing the structure of a row processing unit shown in FIG. 1.

$\min_{n' \in A}(|z_{m,n'}^{(i)}|)$ is a minimum at $n'$ included in set $A$ of $|z_{m,n'}^{(i)}|$ MIN($a$, $b$) is an operation of selecting smaller one of $a$ and $b$ sign($z_{m,n'}^{i}$); the sign (±) of $z_{m,n'}^{(i)}$ FIG. 2 is a block diagram showing the structure of the row processing unit shown in FIG. 1. Each comparison unit 9 carries cut a comparison between the absolute values of two inputted values, and calculates a product of a small one of them and the signs (±) of the two values. The row processing unit 5 consists of a plurality of comparison units 9 which are cascaded. As shown in the figure, a comparison unit 9 located at a lower stage inputs, as one of two inputs thereof, a computed result of another comparison unit 9 which is located immediately above the former comparison unit. A process is carried out by each comparison unit 9 as follows.

When each comparison unit 9 inputs the absolute values of two values a and b, it outputs sign(a)×sign(b)×|a| if |a|<|b|. Unless |a|<|b|, each comparison unit 9 outputs sign(a)×sign(b)×|b|. sign(a) shows the sign (±) of a. The row processing unit 5 inputs the LLRs of bits on which it performs the row processing from the intermediate-result holding unit 4, each of the comparison units 9 carries out a comparison between the absolute values of two inputted values, and calculates a product of a smaller one of the two values and the signs (±) of them, and the plurality of comparison units 9 then deliver the resultant value to the column processing unit 6.

Thus, the LDPC code decoding apparatus 1 in accordance with this embodiment 1 is based on the Shuffled BP algorithm of performing a calculation and an update of probability information with row processing and column processing on the received signal in batches of one 1 bit or two or more predetermined bits, and uses the above-mentioned equation (8) which is an approximation update equation of the Min-Sum algorithm in each row processing without using the above-mentioned equations (2) and (3). Thereby, the Min-Sum algorithm of performing a calculation and an update of probability information with row processing and column processing on the received signal in batches of one 1 bit or two or more predetermined bits is implemented.

Next, the operation of the decoding apparatus in accordance with this embodiment of the present invention will be explained.

Figure 3:
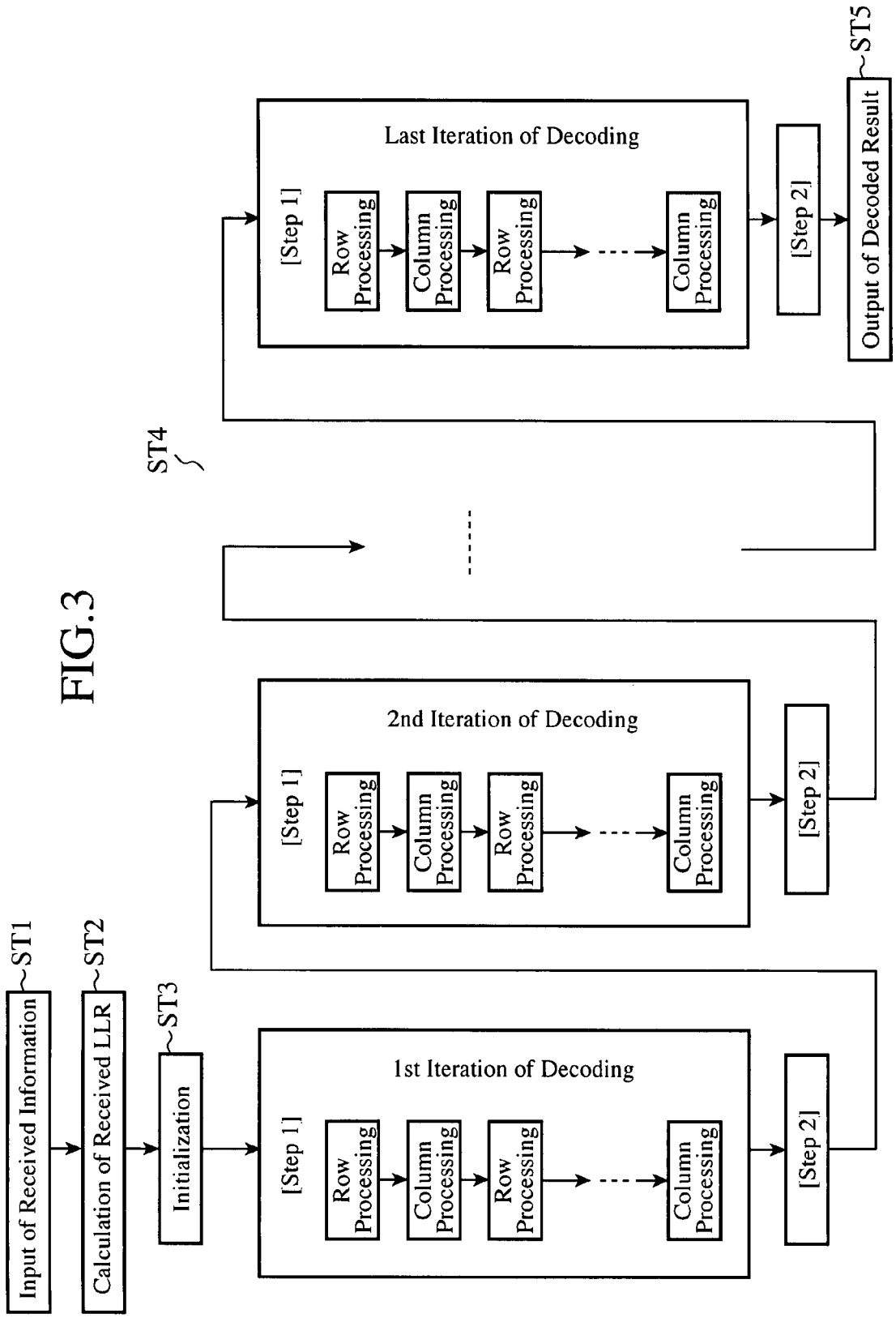
FIG. 3 is a flow chart showing the operation of the LDPC code decoding apparatus in accordance with the embodiment 1.

FIG. 3 is a flow chart showing the operation of the LDPC code decoding apparatus in accordance with embodiment 1, and the operation of the LDPC code decoding apparatus will be explained with reference to this figure.

First, the received LLR calculating unit 2 inputs received information (in step ST1), and then calculates a received LLR from the received information (in step ST2). Next, in an initialization step (in step ST3), the received LLR calculating unit 2 sets the calculated receive LLR to the intermediate-result holding unit 4 as an initial value $z_{m,n}^{(0)} (:=F_n)$. At this time, the control unit 7 initializes the number i of times that decoding is iterated to i=1.

Next, in step ST4, until the number of iterations changes from i=1 to i=the last decoding time (i.e., a maximum number of iterations $I_{max}$), the iterative decoding process of step 1 by means of the row processing unit 5 and column processing unit 6 and a decision process of step 2 according to the above-mentioned equation (7) by means of the decoded result judgment unit 8 are repeatedly carried out.

A decoding operation at the ith iteration will be explained as an example.

First, the row processing unit 5 performs the row processing on each row having an element of 1 which is included in the 1st to $N_g$th columns of the check matrix H (=[$H_{m,n}$]) of an LDPC code to be decoded at the time of g=1 in the above-mentioned equation (1), and delivers the processed result to the column processing unit 6. The column processing unit 6 similarly performs the column processing on each column having an element of 1 which is included in the 1st to $N_g$th columns of the check matrix H, and makes the intermediate-result holding unit 4 hold the processed result.

Next, the row processing unit 5 performs the row processing on each row having an element of 1 which is included in the ($N_g$+1)th to 2$N_g$th columns of the check matrix H at the time of $g=2$ in the above-mentioned equation (1), and delivers the processed result to the column processing unit 6. The column processing unit 6 similarly performs the column processing on each column having an element of 1 which is included in the $(N_g+1)$th to $2N_g$th columns of the check matrix H, and makes the intermediate-result holding unit 4 hold the processed result.

Next, every time when the row processing unit and column processing unit carry out the row processing and column processing one after another at the time of $g=3$ or larger, the row processing unit 5 delivers the processed result to the column processing unit 6, and the column processing unit 6 makes the intermediate-result holding unit 4 hold the processed result.

Finally, the row processing unit 5 performs the row processing on each row having an element of 1 which is included in the $(N-N_g)$th to Nth columns of the check matrix H at the time of $g=G$ in the above-mentioned equation (1), and delivers the processed result to the column processing unit 6. The column processing unit 6 similarly performs the column processing on each column having an element of 1 which is included in the $(N-N_g)$th to Nth columns of the check matrix H, and makes the intermediate-result holding unit 4 hold the processed result.

In the above-mentioned processing, the row processing unit 5 follows the above-mentioned equation (8), and, when performing the row processing after $g=1$, the row processing unit 5 therefore performs the row processing on a column having an already-updated LLR at the ith iteration, not using the received LLR but using the updated LLR.

In step 2, the decoded result judgment unit 8 carries out a hard decision of the posterior value $z_n^{(i)}$ which is calculated by the column processing unit 6 at the ith iteration, determines the decoded result, and performs a parity check on the decoded result. At this time, if the result of the parity check indicates NG, the control unit 7 increments the number of iterations i by one, and then makes the row processing unit 5 and column processing unit 6 carry out the process of step 1. In contrast, if the condition shown by the above-mentioned equation (7) is satisfied, the control unit makes them shift to a process of step 3 which will be mentioned later.

Thus, the control unit 7 controls the row processing unit 5 and column processing unit 6 to repeat the processes of steps 1 and 2 which are based on the above-mentioned equation (8) until the result of the parity check indicates O.K. or the number of iterations reaches its maximum $I_{max}$ which is set up, as shown in the above-mentioned equation (7).

When the result of the parity check by the decoded result judgment unit 8 indicates O.K. or the number of iterations i set up by the control unit 7 reaches its maximum $I_{max}$, the control unit 7, in step 3 (in step ST5), makes the row processing unit 5 and column processing unit 6 end their decoding processings, and the decoded result judgment unit 8 outputs a decoded sequence as shown by the above-mentioned equation (6) as a decoded result.

Figure 4:
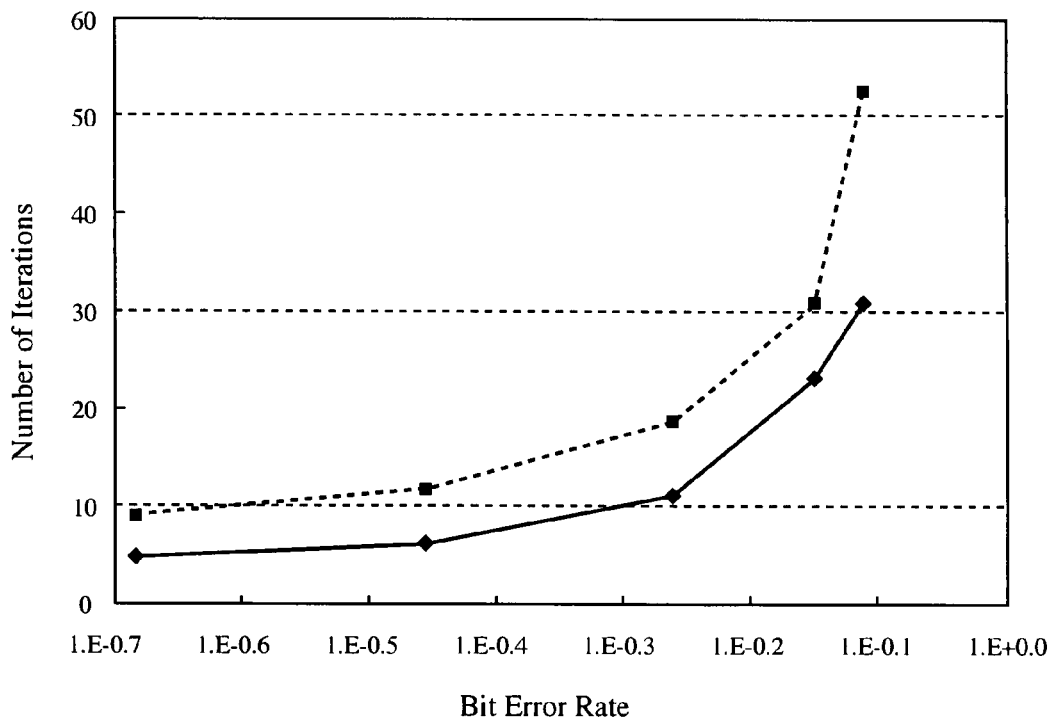
FIG. 4 is a graph in which a relation between a bit error rate and an average of the number of times that decoding is iterated is plotted.

FIG. 4 is a graph in which a relation between a bit error rate and an average of the number of iterations required for the parity check result to indicate O.K. at this bit error rate is plotted in each of an LDPC code decoding apparatus according to the prior art Min-Sum algorithm and the LDPC code decoding apparatus in accordance with the embodiment 1. In this figure, a dashed line which connects between points shows the relation in accordance with the prior art Min-Sum algorithm, and a solid line which connects between points shows the relation in accordance with the algorithm of this embodiment 1.

In FIG. 4, the LDPC code is a regular LDPC code, and has a code length of 8,000, a coding rate of ½, a column weight of 3, and a row weight of 6, the maximum number of iterations $I_{max}$ is 100 times. Assume that the communication path is an AWGN (Additive White Gaussian Noise) communication path, and the modulation method is a BPSK (Binary Phase Shift Keying) method.

In accordance with the prior art Min-Sum algorithm, after completing all the row processings on the encoded signal according to the above-mentioned equation (8) at an arbitrary iteration of the iterative decoding, the column processing is performed on all the bits of the encoded signal. In contrast, the LDPC code decoding apparatus 1 in accordance with this embodiment 1 performs a calculation and an update of probability information with row processing and column processing on the received signal in batches of one 1 bit or two or more predetermined bits. As a result, as shown in FIG. 4, the rate of the convergence of the average of the number of iterations required for the result of parity check to indicate O.K. is remarkably improved, as compared with the case of using the prior art Min-Sum algorithm.

As mentioned above, the LDPC code decoding apparatus in accordance with this embodiment 1 performs a calculation and an update of probability information with row processing and column processing on the received signal in batches of one 1 bit or two or more predetermined bits, and uses a simple update equation based on the Min-Sum algorithm for the row processing. Therefore, because the transmission of the probability information is carried out more efficiently as compared with the case of using the prior art Min-Sum algorithm, the rate of the convergence in the decoding operation can be improved and therefore the number of iterations can be reduced. Furthermore, although the LDPC code decoding apparatus in accordance with this embodiment uses the Min-Sum algorithm as a fundamental algorithm for the row processing, it does not need to use a mathematical function, unlike that using the prior art Shuffled BP algorithm. Therefore, the calculation cost can be reduced.

Embodiment 2

In above-mentioned embodiment 1, there is shown an LDPC code decoding apparatus which implements a Min-Sum algorithm of performing a calculation and an update of probability information with row processing and column processing on a received signal in batches of one 1 bit or two or more predetermined bits. In contrast, an LDPC code decoding apparatus in accordance with this embodiment 2 performs a calculation and an update of probability information with row processing and column processing on a received signal in batches of one 1 bit or two or more predetermined bits, and also executes the Normalized BP algorithm when performing the row processing.

Although the LDPC code decoding apparatus in accordance with this embodiment 2 has fundamentally the same structure as that of the LDPC code decoding apparatus in accordance with above-mentioned embodiment 1 shown in FIG. 1, the structure and operation of a row processing unit 5 differ from those of the row processing unit 5 of embodiment 1 because it executes the Normalized BP algorithm.

To be more specific, the row processing unit 5 in accordance with this embodiment 2 performs an arithmetic operation according to the following equation (9), instead of arithmetic operations according to the above-mentioned equations (2) and (3), on the above-mentioned equation (1). That is, in the Shuffled-BP-algorithm-based row process in step 1 of performing a calculation and an update of probability information with row processing and column processing on a received signal in batches of one 1 bit or two or more predetermined bits, the row processing unit carries out an update operation according to the following equation (9) which is an update equation for use in the Normalized BP algorithm. Symbols in the following equation (9) are the same as those mentioned above. The constant α is a normalization factor.

[Equation 6]

$$\varepsilon_{m,n}^{(i)} = \frac{1}{\alpha} \cdot \prod_{\substack{n' \in N(m)\backslash n \\ n' \leq g \cdot N_g}} \mathrm{sign}(z_{m,n'}^{(i)}) \quad (9)$$

$$\prod_{\substack{n' \in N(m)\backslash n \\ n' \geq g \cdot N_g+1}} \mathrm{sign}(z_{m,n'}^{(i-1)}) \cdot \mathrm{MIN}\left(\min_{\substack{n' \in N(m)\backslash n \\ n' \leq g \cdot N_g}}(|z_{m,n'}^{(i)}|), \min_{\substack{n' \in N(m)\backslash n \\ n' \geq g \cdot N_g+1}}(|z_{m,n'}^{(i-1)}|)\right)$$

As mentioned above, the fundamental structure of the LDPC code decoding apparatus in accordance with this embodiment 2 is the same as that of above-mentioned embodiment 1 shown in FIG. 1. That is, the LDPC code decoding apparatus is provided with a received LLR calculating unit 2 which calculates a received LLR from received information and a decoding core unit 3, and carries out a decoding process of performing a calculation and an update of probability information with row processing and column processing on a received signal in batches of one 1 bit or two or more predetermined bits according to the Normalized BP algorithm by means of the decoding core unit 3.

The decoding core unit 3 is provided with an intermediate-result holding unit 4, a row processing unit 5, a column processing unit 6, a control unit 7, and a decoded result judgment unit 8. The intermediate-result holding unit 4 holds intermediate results of the decoding processing carried out by the row processing unit 5 and column processing unit 6, as previously explained in above-mentioned embodiment 1. The row processing unit 5 carries out row processing using the above-mentioned equation (9), and the column processing unit 6 carries out column processing using the above-mentioned equations (4) and (5), as in the case of performing step 1 of the above-mentioned Shuffled BP algorithm.

The control unit 7 performs control of decoding iterations, such as a setup of a maximum number of iterations. The decoded result judgment unit 8 calculates a decoded sequence which is a decoded result from a hard decision of a posterior value calculated by the column processing unit 6 using the above-mentioned equation (6), as in the case of step 1 of the above-mentioned Shuffled BP algorithm, and performs a parity check on the decoded result so as to judge whether or not the decoded result is correct from the condition shown by the above-mentioned equation (7).

Figure 5:
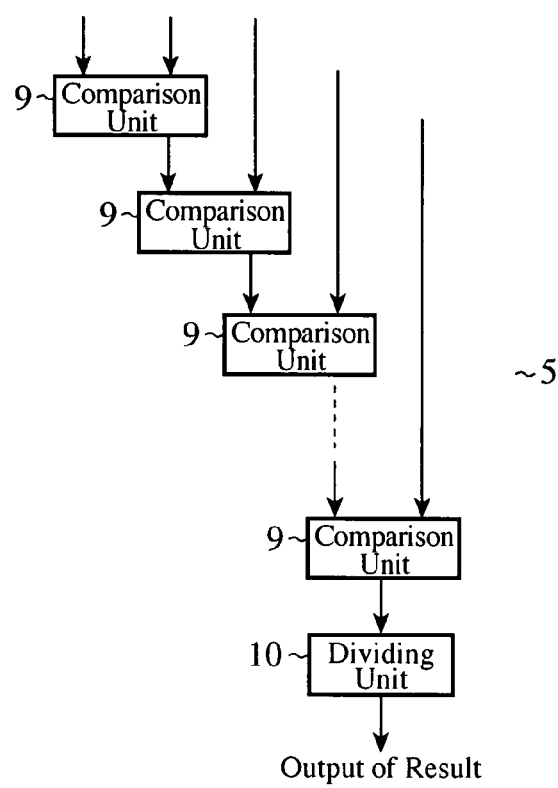
FIG. 5 is a block diagram showing the structure of a row processing unit of an LDPC code decoding apparatus in accordance with embodiment 2 of the present invention.

FIG. 5 is a block diagram showing the structure of the row processing unit of the LDPC code decoding apparatus in accordance with embodiment 2. The row processing unit 5 in accordance with this embodiment consists of a plurality of comparison units 9 and a dividing unit 10. Each comparison unit 9 carries out a comparison between the absolute values of two inputted values, and calculates a product of a small one of them and the signs (±) of the two values, like that shown in FIG. 2. The row processing unit 5 consists of a plurality of comparison units 9 which are cascaded. As shown in the figure, a comparison unit 9 located at a lower stage inputs, as one of two inputs thereof, a computed result of another comparison unit 9 which is located immediately above the former comparison unit. A process is carried out by each comparison unit 9 as follows.

When each comparison unit 9 inputs the absolute values of two values a and b, it outputs sign(a)×sign(b)×|a| if |a|<|b|. Unless |a|<|b|, each comparison unit 9 outputs sign(a)×sign(b)×|b|. sign(a) shows the sign (±) of a.

The dividing unit 10 divides an input value c by a factor α (i.e., a normalization factor) to obtain c/α, and outputs it to the column processing unit 6. That is, the row processing unit 5 in accordance with this embodiment 2 inputs the LLRs of bits on which it performs the row processing from the intermediate-result holding unit 4, each of the comparison units 9 carries out a comparison between the absolute values of two inputted values, and calculates a product of a smaller one of the two values and the signs (±) of them, and the dividing unit 10 carries out a process of delivering the resultant value acquired by the plurality of comparison units 9 to the column processing unit 6 after dividing it by the factor α.

Thus, the LDPC code decoding apparatus 1 in accordance with this embodiment 1 is based on the Shuffled BP algorithm of performing a calculation and an update of probability information with row processing and column processing on the received signal in batches of one 1 bit or two or more predetermined bits, and uses the above-mentioned equation (9) which is an approximation update equation based on the Normalized BP algorithm in each row processing without using the above-mentioned equations (2) and (3). As a result, while the LDPC code decoding apparatus decodes an LDPC code at a calculation cost which is much the same as that of the Min-Sum algorithm, it implements a calculation and an update of probability information with row processing and column processing on the received signal in batches of one 1 bit or two or more predetermined bits according to the Normalized BP algorithm which suppresses the degradation in the decoding performance.

Next, the operation of the decoding apparatus in accordance with this embodiment of the present invention will be explained.

A flow of the fundamental operation of the LDPC code decoding apparatus in accordance with this embodiment 2 is the same as that shown in the flow chart of FIG. 3 in above-mentioned embodiment 1. Therefore, the operation of the LDPC code decoding apparatus will be explained with reference to FIG. 3, and an operation different from that of above-mentioned embodiment 1 will also be explained.

First, the received LLR calculating unit 2 inputs received information (in step ST1), and calculates a received LLR from this received information (in step ST2). Next, in an initialization step (in step ST3), the received LLR calculating unit 2 sets the calculated received LLR to the intermediate-result holding unit 4 as an initial value $z_{m,n}^{(0)}(:=F_n)$. At this time, the control unit 7 initializes the number of iterations i of decoding to i=1.

Next, in step ST4, until the number of iterations changes from i=1 to i=the last decoding time (i.e., a maximum number of iterations $I_{max}$), an iterative decoding process of step 1 by means of the row processing unit 5 and column processing unit 6 and a decision process of step 2 according to the above-mentioned equation (7) by means of the decoded result judgment unit 8 are repeatedly carried out.

A decoding operation at the ith iteration will be explained as an example.

First, the row processing unit 5 performs the row processing according to the above-mentioned equation (9) on each row having an element of 1 which is included in the 1st to $N_g$th columns of the check matrix H (=$[H_{m,n}]$) of an LDPC code to be decoded at the time of g=1 in the above-mentioned equation (1), and delivers the processed result to the column processing unit 6. The column processing unit 6 similarly performs the column processing on each column having an element of 1 which is included in the 1st to $N_g$th columns of the check matrix H according to the above-mentioned equations (3) and (4), and makes the intermediate-result holding unit 4 hold the processed result.

Next, the row processing unit 5 performs the row processing on each row having an element of 1 which is included in the $(N_g+1)$th to $2N_g$th columns of the check matrix H at the time of g=2 in the above-mentioned equation (1), and delivers the processed result to the column processing unit 6. The column processing unit 6 similarly performs the column processing on each column having an element of 1 which is included in the $(N_g+1)$th to $2N_g$th columns of the check matrix H, and makes the intermediate-result holding unit 4 hold the processed result.

After that, every time when the row processing unit and column processing unit carries out the row processing and column processing one after another at the time of g=3 or larger, the row processing unit 5 delivers the processed result to the column processing unit 6, and the column processing unit 6 makes the intermediate-result holding unit 4 hold the processed result.

Finally, the row processing unit 5 performs the row processing on each row having an element of 1 which is included in the $(N-N_g)$th to Nth columns of the check matrix H at the time of g=G in the above-mentioned equation (1), and delivers the processed result to the column processing unit 6. The column processing unit 6 similarly performs the column processing on each column having an element of 1 which is included in the $(N-N_g)$th to Nth columns of the check matrix H, and makes the intermediate-result holding unit 4 hold the processed result.

In the above-mentioned processing, the row processing unit 5 follows the above-mentioned equation (9), and, when performing the processing after g=1, the row processing unit 5 therefore performs the row processing on a column having an already-updated LLR at the ith iteration, not using the received LLR but using the updated LLR.

In step 2, the decoded result judgment unit 8 carries out a hard decision of the posterior value $z_n^{(i)}$ which is calculated by the column processing unit 6 at the ith iteration, determines the decoded result, and performs a parity check on the decoded result. At this time, if the result of the parity check indicates NG, the control unit 7 increments the number of iterations i by one, and then makes the row processing unit 5 and column processing unit 6 carry out the process of step 1. In contrast, if the condition shown by the above-mentioned equation (7) is satisfied, the control unit makes them shift to a process of step 3 which will be mentioned later.

Thus, the control unit 7 controls the row processing unit 5 and column processing unit 6 to repeat the processes of steps 1 and 2 which are based on the above-mentioned equation (9) until the result of the parity check indicates O.K. or the number of iterations reaches its maximum $I_{max}$ which is set up, as shown in the above-mentioned equation (7).

When the result of the parity check by the decoded result judgment unit 8 indicates O.K. or the number of iterations i set up by the control unit 7 reaches its maximum $I_{max}$, the control unit 7, in step 3 (in step ST5), makes the row processing unit 5 and column processing unit 6 end their decoding processings, and the decoded result judgment unit 8 outputs a decoded sequence as shown by the above-mentioned equation (6) as a decoded result.

Figure 6:
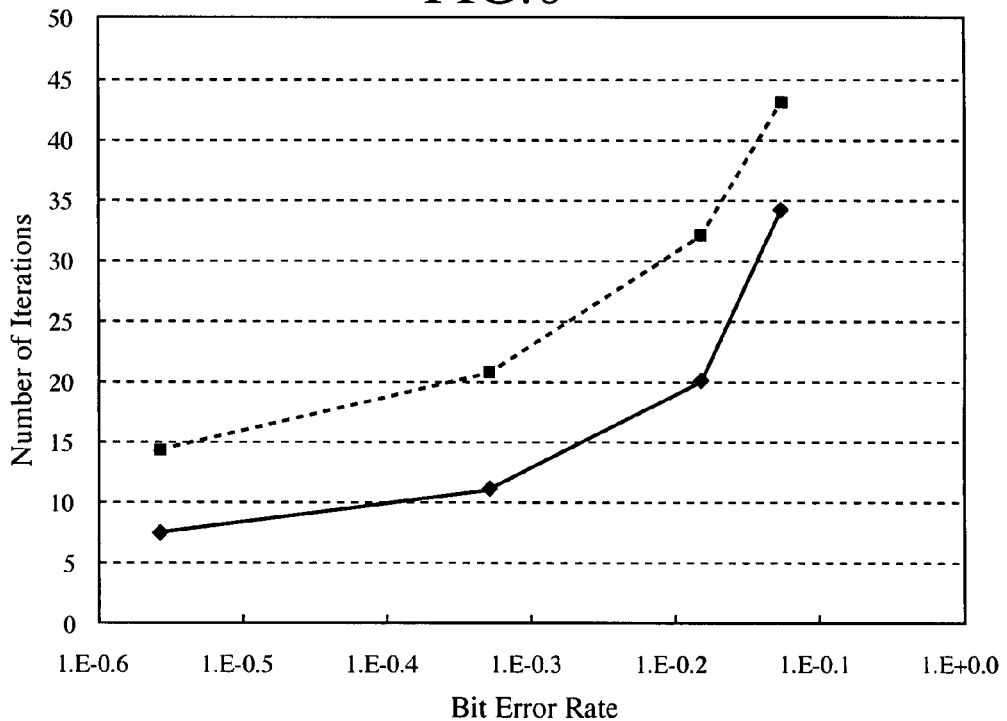
FIG. 6 is a graph in which a relation between a bit error rate and an average of the number of times that decoding is iterated is plotted.

FIG. 6 is a graph in which a relation between a bit error rate and an average of the number of iterations required for the parity check result to indicate O.K. at this bit error rate is plotted in each of an LDPC code decoding apparatus according to the prior art Normalized BP algorithm and the LDPC code decoding apparatus in accordance with the embodiment 2. In the figure, a dashed line which connects between points shows the relation in accordance with the prior art Normalized BP algorithm, and a solid line which connects between points shows the relation in accordance with the algorithm of this embodiment 2.

In FIG. 6, the LDPC code is a regular LDPC code, and has a code length of 8,000, a coding rate of ½, a column weight of 3, and a row weight of 6, the maximum number of iterations $I_{max}$ is 100 times. Furthermore, assume that the communication path is an AWGN (Additive White Gaussian Noise) communication path, and the modulation method is a BPSK (Binary Phase Shift Keying) method. In each of the prior art Normalized BP algorithm and the Normalized BP algorithm in accordance with this embodiment 2, the factor α (i.e., the normalization factor) is set to α=1.25.

In accordance with the prior art Normalized BP algorithm, after completing all the row processings on the encoded signal according to the above-mentioned equation (9) at an arbitrary iteration of iterative decoding, the column processing is performed on all the bits of the encoded signal. In contrast, the LDPC code decoding apparatus in accordance with this embodiment 2 performs a calculation and an update of probability information with row processing and column processing on the received signal in batches of one 1 bit or two or more predetermined bits. As a result, as shown in FIG. 6, the rate of the convergence of the average of the number of iterations required for the result of parity check to indicate O.K. is remarkably improved, as compared with the case of using the prior art Normalized BP algorithm.

As mentioned above, the LDPC code decoding apparatus in accordance with this embodiment 2 performs a calculation and an update of probability information with row processing and column processing on the received signal in batches of one 1 bit or two or more predetermined bits, and uses a simple update equation based on the Normalized BP algorithm for the row processing. Therefore, because the transmission of the probability information is carried out more efficiently as compared with the case of using the prior art Normalized BP algorithm, the rate of the convergence in the decoding operation can be improved and therefore the number of iterations can be reduced. Furthermore, because the LDPC code decoding apparatus in accordance with this embodiment uses the Normalized BP algorithm as the fundamental algorithm, it does not need to use a mathematical function, unlike that using the prior art Shuffled BP algorithm. Therefore, the calculation cost can be reduced.

Embodiment 3

An LDPC code decoding apparatus in accordance with this embodiment 3 performs a calculation and an update of probability information with row processing and column processing on a received signal in batches of one 1 bit or two or more predetermined bits, and also executes the Offset BP in the row processing.

Although the LDPC code decoding apparatus in accordance with this embodiment 3 has fundamentally the same structure as that of the LDPC code decoding apparatus in accordance with above-mentioned embodiment 1 shown in FIG. 1, the structure and operation of a row processing unit 5 differ from those of the row processing unit 5 of embodiment 1 because it executes the Offset BP algorithm. To be more specific, the row processing unit 5 in accordance with this embodiment 2 performs an arithmetic operation according to the following equation (10) on the above-mentioned equation (1).

That is, in the Shuffled-BP-algorithm-based row process in step 1 of performing a calculation and an update of probability information with row processing and column processing on a received signal in batches of one 1 bit or two or more predetermined bits, the row processing unit carries out an update operation according to the following equation (10) which is an update equation for use in the Offset BP algorithm. Symbols in the following equation (10) are the same as those mentioned above. The constant β is an offset factor and MAX shows an arithmetic operation of selecting a larger one of the two input values.

[Equation 7]

$$p = \prod_{\substack{n' \in N(m) \setminus n \\ n' \leq g \cdot N_g}} \text{sign}(z_{m,n'}^{(i)})$$

$$\prod_{\substack{n' \in N(m) \setminus n \\ n' \geq g \cdot N_g + 1}} \text{sign}(z_{m,n'}^{(i-1)}) \cdot \text{MIN}\left( \min_{\substack{n' \in N(m) \setminus n \\ n' \leq g \cdot N_g}} (|z_{m,n'}^{(i)}|), \min_{\substack{n' \in N(m) \setminus n \\ n' \geq g \cdot N_g + 1}} (|z_{m,n'}^{(i-1)}|) \right)$$

$$\varepsilon_{m,n}^{(i)} = \text{sign}(p) \cdot \text{MAX}(|p| - \beta, 0)$$

(10)

As mentioned above, the fundamental structure of the LDPC code decoding apparatus in accordance with this embodiment 3 is the same as that of above-mentioned embodiment 1 shown in FIG. 1. That is, the LDPC code decoding apparatus is provided with a received LLR calculating unit 2 which calculates a received LLR from received information and a decoding core unit 3, and carries out a decoding process of performing a calculation and an update of probability information with row processing and column processing on a received signal in batches of one 1 bit or two or more predetermined bits according to the Offset BP algorithm by means of the decoding core unit 3.

The decoding core unit 3 is provided with an intermediate-result holding unit 4, a row processing unit 5, a column processing unit 6, a control unit 7, and a decoded result judgment unit 8. The intermediate-result holding unit 4 holds intermediate results of the decoding processing carried out by the row processing unit 5 and column processing unit 6, as previously explained in above-mentioned embodiment 1. The row processing unit 5 carries out row processing using the above-mentioned equation (10), and the column processing unit 6 carries out column processing using the above-mentioned equations (4) and (5), as in the case of performing step 1 of the above-mentioned Shuffled BP algorithm.

The control unit 7 performs control of decoding iterations, such as a setup of a maximum number of iterations. The decoded result judgment unit 8 calculates a decoded sequence which is a decoded result from a hard decision of a posterior value calculated by the column processing unit 6 using the above-mentioned equation (6), as in the case of step 1 of the above-mentioned Shuffled BP algorithm, and performs a parity check on the decoded result so as to judge whether or not the decoded result is correct from the condition shown by the above-mentioned equation (7).

Figure 7:
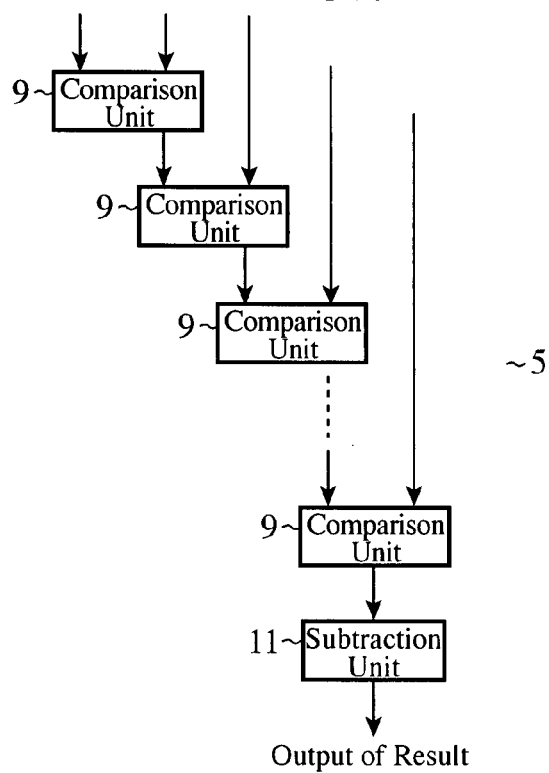
FIG. 7 is a block diagram showing the structure of a row processing unit of an LDPC code decoding apparatus in accordance with embodiment 3 of the present invention.

FIG. 7 is a block diagram showing the structure of the row processing unit of the LDPC code decoding apparatus in accordance with embodiment 3. The row processing unit 5 in accordance with this embodiment consists of a plurality of comparison units 9 and a subtraction unit 11. Each comparison unit 9 carries out a comparison between the absolute values of two inputted values, and calculates a product of a small one of them and the signs (±) of the two values, like that shown in FIG. 2. The row processing unit 5 consists of a plurality of comparison units 9 which are cascaded. As shown in the figure, a comparison unit 9 located at a lower stage inputs, as one of two inputs thereof, a computed result of another comparison unit 9 which is located immediately above the former comparison unit. A process is carried out by each comparison unit 9 as follows.

When each comparison unit 9 inputs the absolute values of two values a and b, it outputs sign(a)×sign(b)×|a| if |a|<|b|. Unless |a|<|b|, each comparison unit 9 outputs sign(a)×sign(b)×|b|. sign(a) shows the sign (±) of a.

The subtraction unit 11 calculates c−β by subtracting a factor β (i.e., an offset factor) from an input value c, and outputs it to the column processing unit 6. That is, the row processing unit 5 in accordance with this embodiment 3 inputs the LLRs of bits on which it performs the row processing from the intermediate-result holding unit 4, each of the comparison units 9 carries out a comparison between the absolute values of two inputted values, and calculates a product of a smaller one of the two values and the signs (±) of them, and the subtraction unit 11 carries out a process of delivering the resultant value acquired by the plurality of comparison units 9 to the column processing unit 6 after subtracting the factor β from the value.

Thus, the LDPC code decoding apparatus in accordance with this embodiment 3 is based on the Shuffled BP algorithm of performing a calculation and an update of probability information with row processing and column processing on the received signal in batches of one 1 bit or two or more predetermined bits, and uses the above-mentioned equation (10) which is an approximation update equation based on the Offset BP algorithm in each row processing without using the above-mentioned equations (2) and (3). As a result, while the LDPC code decoding apparatus decodes an LDPC code at a calculation cost which is much the same as that of the Min-Sum algorithm, it implements a calculation and an update of probability information with row processing and column processing on the received signal in batches of one 1 bit or two or more predetermined bits according to the Offset BP algorithm which suppresses the degradation in the decoding performance.

Next, the operation of the decoding apparatus in accordance with this embodiment of the present invention will be explained.

A flow of the fundamental operation of the LDPC code decoding apparatus in accordance with this embodiment 3 is the same as that shown in the flow chart of FIG. 3 in above-mentioned embodiment 1. Therefore, the operation of the LDPC code decoding apparatus will be explained with reference to FIG. 3, and an operation different from that of above-mentioned embodiment 1 will also be explained.

First, the received LLR calculating unit 2 inputs received information (in step ST1), and calculates a received LLR from this received information (in step ST2). Next, in an initialization step (in step ST3), the received LLR calculating unit 2 sets the calculated received LLR to the intermediate-result holding unit 4 as an initial value $z_{m,n}^{(0)}(:=F_n)$. At this time, the control unit 7 initializes the number of iterations i of decoding to i=1.

Next, in step ST4, until the number of iterations changes from i=1 to i=the last decoding time (i.e., a maximum number of iterations $I_{max}$), an iterative decoding process of step 1 by means of the row processing unit 5 and column processing unit 6 and a decision process of step 2 according to the above-mentioned equation (7) by means of the decoded result judgment unit 8 are repeatedly carried out.

A decoding operation at the ith iteration will be explained as an example.

First, the row processing unit 5 performs the row processing according to the above-mentioned equation (10) on each row having an element of 1 which is included in the 1st to $N_g$th columns of the check matrix H ($=[H_{m,n}]$) of an LDPC code to be decoded at the time of g=1 in the above-mentioned equation (1), and delivers the processed result to the column processing unit 6. The column processing unit 6 similarly performs the column processing on each column having an element of 1 which is included in the 1st to $N_g$th columns of the check matrix H according to the above-mentioned equations (3) and (4), and makes the intermediate-result holding unit 4 hold the processed result.

Next, the row processing unit 5 performs the row processing on each row having an element of 1 which is included in the $(N_g+1)$th to $2N_g$th columns of the check matrix H at the time of g=2 in the above-mentioned equation (1), and delivers the processed result to the column processing unit 6. The column processing unit 6 similarly performs the column processing on each column having an element of 1 which is included in the $(N_g+1)$th to $2N_g$th columns of the check matrix H, and makes the intermediate-result holding unit 4 hold the processed result.

After that, every time when the row processing unit and column processing unit carry out the row processing and column processing one after another at the time of g=3 or larger, the row processing unit 5 delivers the processed result to the column processing unit 6, and the column processing unit 6 makes the intermediate-result holding unit 4 hold the processed result.

Finally, the row processing unit 5 performs the row processing on each row having an element of 1 which is included in the $(N-N_g)$th to Nth columns of the check matrix H at the time of g=G in the above-mentioned equation (1), and delivers the processed result to the column processing unit 6. The column processing unit 6 similarly performs the column processing on each column having an element of 1 which is included in the $(N-N_g)$th to Nth columns of the check matrix H, and makes the intermediate-result holding unit 4 hold the processed result.

In the above-mentioned processing, the row processing unit 5 follows the above-mentioned equation (10), and, when performing the processing after g=1, the row processing unit 5 therefore performs the row processing on a column having an already-updated LLR at the ith iteration, not using the received LLR but using the updated LLR.

In step 2, the decoded result judgment unit 8 carries out a hard decision of the posterior value $z_n^{(i)}$ which is calculated by the column processing unit 6 at the ith iteration, determines the decoded result, and performs a parity check on the decoded result. At this time, if the result of the parity check indicates NG, the control unit 7 increments the number of iterations i by one, and then makes the row processing unit 5 and column processing unit 6 carry out the process of step 1. In contrast, if the condition shown by the above-mentioned equation (7) is satisfied, the control unit makes them shift to a process of step 3 which will be mentioned later.

Thus, the control unit 7 controls the row processing unit 5 and column processing unit 6 to repeat the processes of steps 1 and 2 which are based on the above-mentioned equation (10) until the result of the parity check indicates O.K. or the number of iterations reaches its maximum $I_{max}$ which is set up, as shown in the above-mentioned equation (7).

When the result of the parity check by the decoded result judgment unit 8 indicates O.K. or the number of iterations i set up by the control unit 7 reaches its maximum $I_{max}$, the control unit 7, in step 3 (in step ST5), makes the row processing unit 5 and column processing unit 6 end their decoding processings, and the decoded result judgment unit 8 outputs a decoded sequence as shown by the above-mentioned equation (6) as a decoded result.

Figure 8:
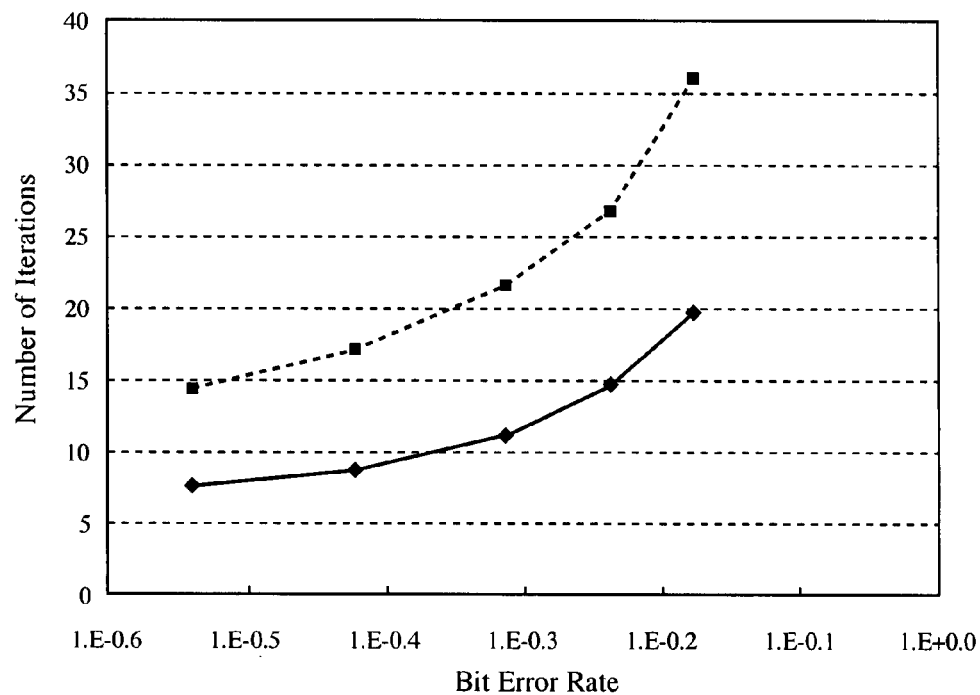
FIG. 8 is a graph in which a relation between a bit error rate and an average of the number of times that decoding is iterated is plotted.

FIG. 8 is a graph in which a relation between a bit error rate and an average of the number of iterations required for the parity check result to indicate O.K. at this bit error rate is plotted in each of an LDPC code decoding apparatus according to the prior art Offset BP algorithm and the LDPC code decoding apparatus in accordance with the embodiment 3. In the figure, a dashed line which connects between points shows the relation in accordance with the prior art Offset BP algorithm, and a solid line which connects between points shows the relation in accordance with the algorithm of this embodiment 3.

In FIG. 8, the LDPC code is a regular LDPC code, and has a code length of 8,000, a coding rate of ½, a column weight of 3, and a row weight of 6, the maximum number of iterations $I_{max}$ is 100 times. Assume that the communication path is an AWGN (Additive White Gaussian Noise) communication path, and the modulation method is a BPSK (Binary Phase Shift Keying) method. In each of the prior art Offset BP algorithm and the Offset BP algorithm in accordance with this embodiment 3, the factor $\beta$ (i.e., the offset factor) is set to $\beta=0.15$.

In accordance with the prior art Offset BP algorithm, after completing all the row processings on the encoded signal according to the above-mentioned equation (10) at an arbitrary iteration of iterative decoding, the column processing is performed on all the bits of the encoded signal. In contrast, the LDPC code decoding apparatus in accordance with this embodiment 3 performs a calculation and an update of probability information with row processing and column processing on the received signal in batches of one 1 bit or two or more predetermined bits. As a result, as shown in FIG. 8, the rate of the convergence of the average of the number of iterations required for the result of parity check to indicate O.K. is remarkably improved, as compared with the case of using the prior art Offset BP algorithm.

As mentioned above, the LDPC code decoding apparatus in accordance with this embodiment 3 performs a calculation and an update of probability information with row processing and column processing on the received signal in batches of one 1 bit or two or more predetermined bits, and uses a simple update equation based on the Offset BP algorithm for the row processing. Therefore, because the transmission of the probability information is carried out more efficiently as compared with the case of using the prior art Offset BP algorithm, the rate of the convergence in the decoding operation can be improved and therefore the number of iterations can be reduced. Furthermore, because the LDPC code decoding apparatus in accordance with this embodiment uses the Offset BP algorithm as the fundamental algorithm, and does not need to use a mathematical function, unlike that using the prior art Shuffled BP algorithm. Therefore, the calculation cost can be reduced.

Embodiment 4

An LDPC code decoding apparatus according to this embodiment 4 has, as a decoding algorithm, a correction-type Min-Sum algorithm of making a correction to the Min-Sum algorithm using a correction term which can be computed only with a subtraction operation and a bit-shift operation on received information.

Figure 9:
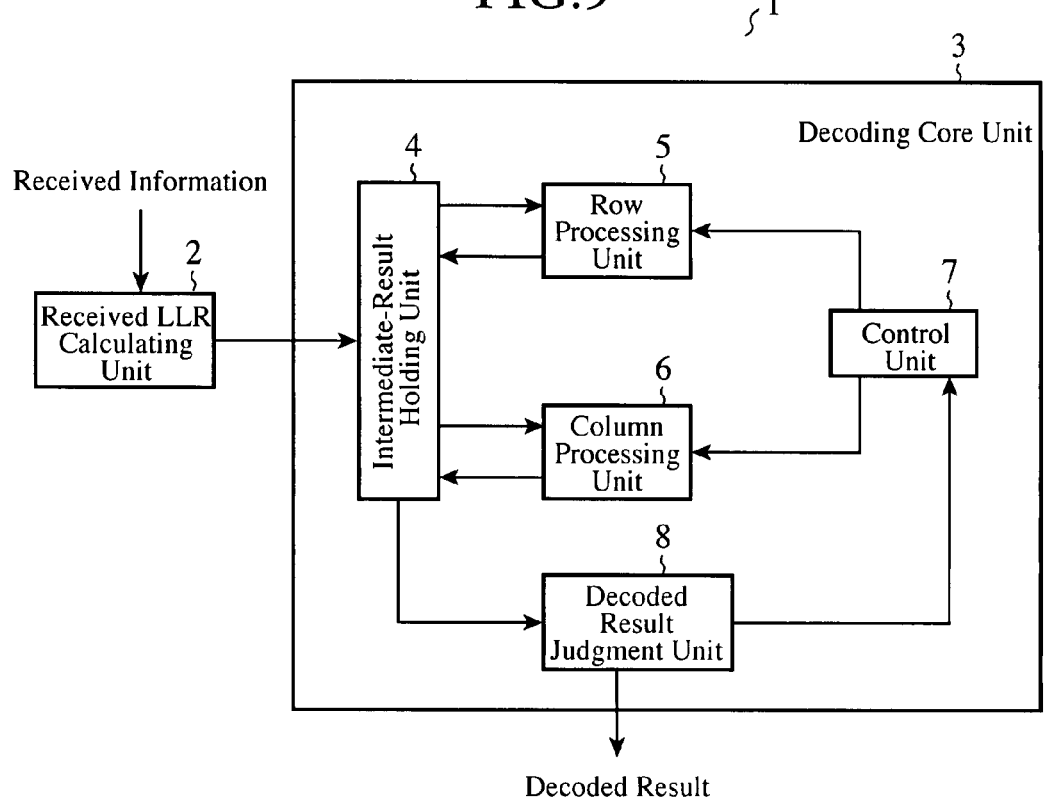
FIG. 9 is a block diagram showing the structure of an LDPC code decoding apparatus in accordance with embodiment 4 of the present invention.

FIG. 9 is a block diagram showing the structure of the LDPC code decoding apparatus in accordance with embodiment 4 of the present invention. The LDPC code decoding apparatus 1 in accordance with this embodiment 4 is provided with a received LLR calculating unit 2 and a decoding core unit (a decoding means) 3. The received LLR calculating unit 2 receives an LDPC (Low-Density Parity Check) encoded signal, calculates a log-likelihood ratio LLR of the encoded signal, and outputs it to the decoding core unit 3. The decoding core unit 3 is provided with an intermediate-result holding unit 4, a row processing unit 5, a column processing unit 6, a control unit 7, and a decoded result judgment unit 8.

The intermediate-result holding unit 4 holds intermediate results of decoding processing carried out by the row processing unit 5 and column processing unit 6 on the basis of the received LLR inputted from the received LLR calculating unit 2. The row processing unit 5 carries out row processing in accordance with the correction-type Min-Sum algorithm for making a correction to the Min-Sum algorithm using the above-mentioned correction term. The column processing unit 6 performs column processing on the processed result obtained by the row processing unit 5. The control unit 7 controls the iteration of the decoding processing carried out by the row processing unit 5 and column processing unit 6. The decoded result judgment unit 8 determines a decoded result from a hard decision of a posterior value, and performs a parity check on the decoded result so as to judge whether or not the decoded result is correct.

In this embodiment 4, as in the case of using the prior art Min-Sum algorithm, after all the row processings on the encoded signal are completed at an arbitrary iteration of the iterative decoding, the column processing is performed on all the bits of the encoded signal. That is, assuming that the check matrix of an LDPC code to be decoded is a binary m×n matrix H=[$H_{m,n}$] (n is an integer equal to or larger than 0 and smaller than N, and m is an integer equal to or larger than 0 and smaller than M), the row processing is performed on all members (m,n) which satisfy $H_{m,n}=1$ in order of m=1, 2, 3, . . . , and M, and, after that, the column processing is performed on all the members (m,n) which satisfy $H_{m,n}=1$ in order of n=1, 2, 3, . . . , and N.

In step 1 which is a row processing executed at one iteration, the row processing unit 5 in accordance with this embodiment 4 performs an arithmetic operation according to the following equation (12) on the following equation (11). Parameters in the following equation (12) are shown by the following equations (13) to (15), and symbols in these equations are the same as those as mentioned above.

[Equation 8]

$$1 \leq n \leq N, n \in M(m) \tag{11}$$

$$\varepsilon_{m,n}^{(i)} = \prod_{n' \in N(m)\backslash n} \text{sign}(z_{m,n'}^{(i-1)}) \cdot q \tag{12}$$

-continued $$q = func(z_{m,n'_0}^{(i-1)}, q), \tag{13}$$

$$q = func(z_{m,n'_1}^{(i-1)}, q),$$

$$q = func(z_{m,n'_2}^{(i-1)}, q), \ldots ,$$

$$q = func(z_{m,n'_{max-1}}^{(i-1)}, z_{m,n'_{max}}^{(i-1)})$$

$$n'(\in N(m)\backslash n) = n'_0, n'_1, n'_2, \ldots , n'_{max-1}, n'_{max} \tag{14}$$

$$func(a, b) = \text{MIN}(|a|, |b|) - \delta \tag{15}$$

$$\delta = \begin{cases} C - \frac{1}{2}||a|-|b|| & \text{if } C > \frac{1}{2}||a|-|b||, \ C: const \\ 0 & \text{else} \end{cases}$$

In the above-mentioned equation (15), the correction term δ for use in the Min-Sum algorithm is an approximation term which can be acquired from a series expansion of an update equation based on the Sum-Product algorithm, and can be computed only with the difference between the absolute values of two inputs, a division by 2, and a subtraction from a constant C.

An example of the constant C is ln(2) which is acquired with a rough calculation using the update equation based on the Sum-Product algorithm, and it is also possible to improve the decoding performance by setting an appropriate value, such as 0.9, to the constant C. Furthermore, the division by 2 can be implemented with a 1-bit bit shift operation in a system, such as hardware, in which numbers are expressed as binary numbers.

Furthermore, when the row processing unit 5, in step 1, completes all the row processings, the column processing unit 6 in accordance with this embodiment 4 performs arithmetic operations according to the above-mentioned equations (4) and (5) on the following equation (16).

[Equation 9]

$$1 \leq n \leq N, m \in M(n) \tag{16}$$

Next, in step 2, the decoded result judgment unit 8 carries out a hard decision of the posterior value $z_n^{(i)}$, and creates a decoded sequence shown by the above-mentioned equation (6). Then, if the conditions shown by the above-mentioned equation (7) are satisfied, the decoded result judgment unit shifts to a process of step 3 which will be mentioned later, whereas when neither of these two conditions is satisfied, the decoded result judgment unit increments the number of iterations i and returns to the process of step 2. In step 3, the decoded result judgment unit 8 outputs the decoded sequence according to the above-mentioned equation (6) acquired in step 2 as a decoded result.

Figure 10:
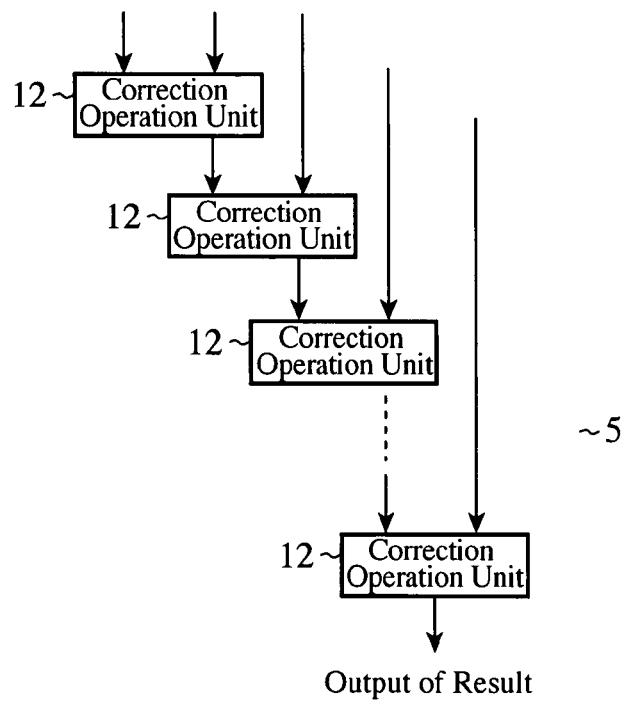
FIG. 10 is a block diagram showing the structure of an example of a row processing unit shown in FIG. 9.

FIG. 10 is a block diagram showing the structure of the row processing unit shown in FIG. 9. Each correction operation unit 12 carries out a comparison between the absolute values of two inputted values, a calculation of the correction term, makes a correction on the basis of this correction term, and calculates a product of the corrected value and the signs (±) of the two values. The row processing unit 5 consists of a plurality of correction operation units 12 which are cascaded. As shown in the figure, a correction operation unit 12 located at a lower stage inputs, as one of the two inputs thereof, a computed result of a correction operation unit 12 which is located immediately above the former correction operation unit. Each correction operation unit 12 carries out a process as follows.

When each correction operation unit 12 inputs the absolute values of two values a and b, it calculates δ=0.69−(||a|−|b||)>>2 first (ln(2)≈0.69). If then |a|<|b|, each correction operation unit outputs sign(a)×sign(b)×(|a|−δ). Unless |a|<|b|, each correction operation unit outputs sign(a)×sign(b)×(|b|−δ). sign(a) shows the sign (±) of a. The row processing unit 5 inputs the LLRs of bits on which it performs the row processing from the intermediate-result holding unit 4, each of the plurality of correction operation units 12 carries out a comparison between the absolute values of two inputted values, makes a correction, and calculates a product of the corrected value and the signs (±) of the two values, and the plurality of correction operation units delivers the resultant value to the column processing unit 6.

Thus, after the LDPC code decoding apparatus 1 in accordance with this embodiment 4 completes all the row processings on the encoded signal at an arbitrary iteration of the iterative decoding according to the correction-type Min-Sum algorithm of making a correction to the Min-Sum algorithm using the correction term which can be computed only with a subtraction operation and a bit shift operation on the received information, the LDPC code decoding apparatus 1 carries out the column processing to all the bits of the encoded signal.

Figure 10A:
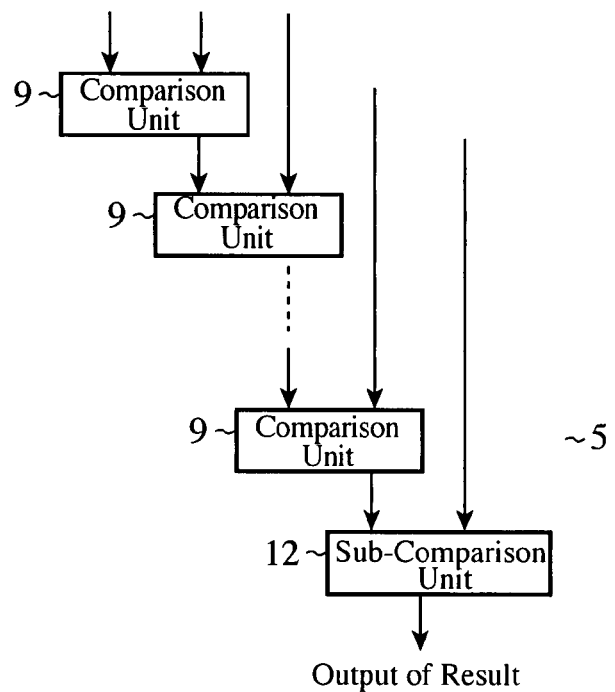
FIG. 10A is a block diagram showing the structure of another example of the row processing unit shown in FIG. 9.

In the above-mentioned equation (12) and the structure of FIG. 10, the correction is made during any of all the comparisons, though the amount of arithmetic operations can be reduced by reducing the number of times that the correction is carried out rather than the number of times that the comparison is carried out by making the correction only when a comparison between two minimum values is carried out by each comparison unit 9, as shown in FIG. 10A.

Next, the operation of the decoding apparatus in accordance with this embodiment of the present invention will be explained.

Figure 11:
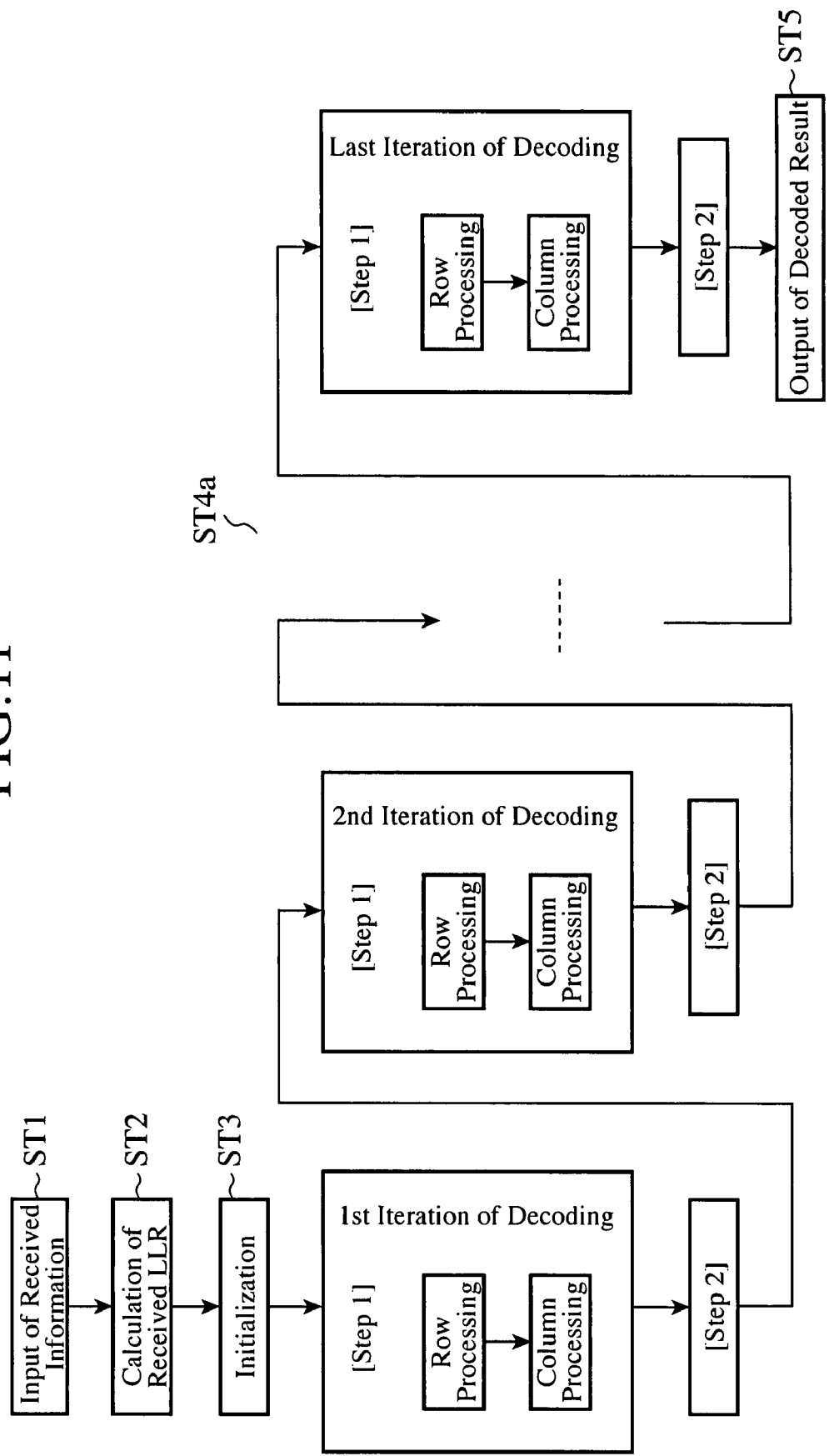
FIG. 11 is a flow chart showing the operation of the LDPC code decoding apparatus in accordance with embodiment 4.

FIG. 11 is a flow chart showing the operation of the LDPC code decoding apparatus in accordance with embodiment 4, and the operation of the LDPC code decoding apparatus will be explained with reference to this figure.

First, the received LLR calculating unit 2 inputs received information (in step ST1), and calculates a received LLR from this received information (in step ST2). Next, in an initialization step (in step ST3), the received LLR calculating unit 2 sets the calculated receive LLR to the intermediate-result holding unit 4 as an initial value $z_{m,n}^{(0)}(:=F_n)$. At this time, the control unit 7 initializes the number of iterations i of decoding to i=1.

Next, in step ST4a, until the number of iterations changes from i=1 to i=the last decoding time (i.e., a maximum number of iterations $I_{max}$), an iterative decoding process of step 1 by means of the row processing unit 5 and column processing unit 6 and a decision process of step 2 according to the above-mentioned equation (7) by means of the decoded result judgment unit 8 is repeatedly carried out.

A decoding operation at the ith iteration will be explained as an example.

First, in step 1, the row processing unit 5 performs the row processing in the decoding operation at the ith iteration on the check matrix H (=[$H_{m,n}$]) of an LDP code to be decoded. To be more specific, the row processing unit performs the row processing on each row having an element of 1 which is included in the 1st to $N_g$th columns of the check matrix H according to the relation shown by the above-mentioned equation (11) and using the above-mentioned equation (12), and makes the intermediate-result holding unit 4 hold the processed result.

When the row processing unit 5, in step 1, completes the row processing, the column processing unit 6 performs the column processing on the check matrix H of the LDPC code to be decoded in the decoding operation at the ith iteration. To be more specific, the column processing unit 6 performs the column processing on each column which is included in the first to Nth columns of the check matrix H according to the relation shown by the above-mentioned equation (16), and makes the intermediate-result holding unit 4 hold the processed result.

In step 2, the decoded result judgment unit 8 carries out a hard decision of the posterior value $z_n^{(i)}$ which is calculated by the column processing unit 6 at the ith iteration, determines a decoded result, and performs a parity check on the decoded result. At this time, if the result of the parity check indicates NG, the control unit 7 increments the number of iterations i by one, and then makes the row processing unit 5 and column processing unit 6 carry out the process of step 1. In contrast, if the condition shown by the above-mentioned equation (7) is satisfied, the control unit makes them shift to a process of step 3 which will be mentioned later.

Thus, the control unit 7 controls the row processing unit 5 and column processing unit 6 to repeat the process of step 1 until the result of the parity check indicates O.K. or the number of iterations reaches its maximum $I_{max}$ which is set up, as shown in the above-mentioned equation (7).

When the result of the parity check by the decoded result judgment unit 8 indicates O.K. or the number of iterations i set up by the control unit 7 reaches its maximum $I_{max}$, the control unit 7, in step 3 (in step ST5), makes the row processing unit 5 and column processing unit 6 end their decoding processings, and the decoded result judgment unit 8 outputs a decoded sequence as shown by the above-mentioned equation (6) as a decoded result.

Figure 12:
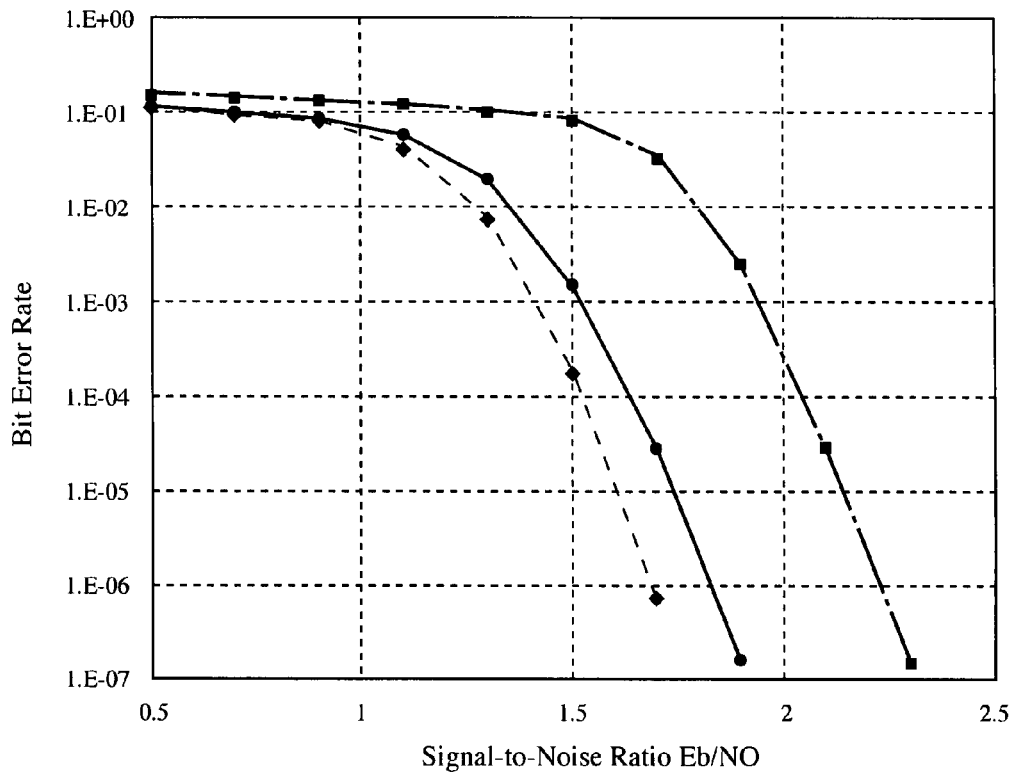
FIG. 12 is a graph in which a relation between a bit error rate and a signal-to-noise ratio (Eb/No) is plotted.

FIG. 12 is a graph in which a relation between a bit error rate and a signal-to-noise ratio (Eb/No) at this bit error rate is plotted in each of an LDPC code decoding apparatus according to the prior art Sum-Product algorithm, an LDPC code decoding apparatus according to the prior art Min-Sum algorithm, and the LDPC code decoding apparatus in accordance with the embodiment 4. In the figure, an alternate long and short dash line which connects between points shows the relation in accordance with the prior art Sum-Product algorithm, a dashed line which connects between points shows the relation in accordance with the prior art Min-Sum algorithm, and a solid line which connects between points shows the relation in accordance with the algorithm of this embodiment 4.

In FIG. 12, the LDPC code is a regular LDPC code, and has a code length of 8,000, a coding rate of ½, a column weight of 3, and a row weight of 6, the maximum number of iterations $I_{max}$ is 100 times. Assume that the communication path is an AWGN (Additive White Gaussian Noise) communication path, and the modulation method is a BPSK (Binary Phase Shift Keying) method.

In accordance with the prior art Sum-Product algorithm and the prior art Min-Sum algorithm, after all the row processings on the encoded signal are completed at an arbitrary iteration of the iterative decoding according to the above-mentioned equations (2) and (8), the column processing is performed on all the bits of the encoded signal.

In contrast, after the LDPC code decoding apparatus 1 in accordance with this embodiment 4 completes all the row processings on the encoded signal according to the correction-type Min-Sum algorithm for making a correction using the correction term which can be computed only with a subtraction operation and a bit shift operation on the received information, the LDPC code decoding apparatus 1 performs the column processing on all the bits of the encoded signal. As can be seen from FIG. 12, the LDPC code decoding apparatus 1 in accordance with this embodiment 4 can remarkably improve its decoding performance with this correction, as compared with the case of using the prior art Min-Sum algorithm, and can achieve the same decoding performance as that using the prior art Sum-Product algorithm.

As mentioned above, because the LDPC code decoding apparatus according to this embodiment 4 carries out the decoding processing according to the correction-type Min-Sum algorithm for making a correction using the correction term which can be computed only with a subtraction operation and a bit shift operation on the received information, the LDPC code decoding apparatus can further suppress the degradation in the decoding performance, as compared with the case of using the prior art Sum-Product algorithm, and can remarkably improve the decoding performance, as compared with the case of using the prior art Min-Sum algorithm.

Furthermore, because the LDPC code decoding apparatus calculates the correction term for making a correction to the Min-Sum algorithm from the received information, the LDPC code decoding apparatus does not need to prepare a table for holding the correction term, unlike that using the prior art correction-type Min-Sum algorithm, and does not need to prepare beforehand a factor which is optimized dependently upon the code construction, unlike that using the prior art Normalized BP algorithm or the Offset BP algorithm.

In addition, the calculation of the correction term on the basis of the received information can be implemented only with a subtraction operation and a 1-bit-shift operation, and the LDPC code decoding apparatus 1 in accordance with embodiment 4 can be implemented via simple hardware.

Embodiment 5

In above-mentioned embodiment 4, a decoding apparatus which implements a correction-type Min-Sum algorithm of making a correction using a correction term which can be computed only with a subtraction operation and a bit shift operation on received information is shown. In contrast, a decoding apparatus in accordance with this embodiment 5 implements, as a decoding algorithm, a correction-type Min-Sum algorithm with division of carrying out column processing using a value which is obtained by dividing a row-processed result of the correction-type Min-Sum algorithm explained in above-mentioned embodiment 4 by a constant.

Although the decoding apparatus in accordance with this embodiment 5 has fundamentally the same structure as that of the decoding apparatus in accordance with above-mentioned embodiment 4 shown in FIG. 9, the structure and operation of a row processing unit 5 differ from those of the row processing unit 5 of above-mentioned embodiment 4 because it executes the correction-type Min-Sum algorithm with division. To be more specific, the row processing unit 5 in accordance with this embodiment 5 performs an arithmetic operation according to the following equation (17), instead of the arithmetic operation according to the above-mentioned equation (12) which is used in the row processing of above-mentioned embodiment 4, on the above-mentioned equation (1). Assume that parameters in the following equation (17) follow the above-mentioned equations (13) to (15). Furthermore, other processes are the same as those shown in above-mentioned embodiment 4, and symbols in the equation are the same as those as mentioned above.

[Equation 10]

$$\varepsilon_{m,n}^{(i)} = \frac{1}{\alpha} \cdot \prod_{n' \in N(m) \setminus n} \text{sign}(z_{m,n'}^{(i-1)}) \cdot q \quad (17)$$

In this equation, a correction term δ for use in the Min-Sum algorithm is an approximation term which can be acquired from a series expansion of an update equation based on the Sum-Product algorithm, and can be computed only with the difference between the absolute values of two inputs, a division by 2, and a subtraction from a constant C.

An example of the constant C is ln(2) which is acquired with a rough calculation using the update equation based on the Sum-Product algorithm, and it is also possible to improve the decoding performance by setting an appropriate value to the constant C. Furthermore, the division by 2 can be implemented with a 1-bit bit shift operation in a system, such as hardware, in which numbers are expressed as binary numbers.

The division constant α has the same advantage as the normalization factor in the Normalized BP algorithm, and has an advantage of improving the decoding performance by adjusting the magnitude of an LLR calculated through the row processing according to the correction-type Min-Sum algorithm in above-mentioned embodiment 4 to substantially the same value as the magnitude of an LLR calculated according to the Sum-Product algorithm. The division constant α in the correction-type Min-Sum algorithm with division of this embodiment is referred to as the normalization factor, as in the case of using the Normalized BP algorithm.

As mentioned above, the fundamental structure of the LDPC code decoding apparatus in accordance with this embodiment 5 is the same as that of above-mentioned embodiment 4 shown in FIG. 9. That is, the LDPC code decoding apparatus is provided with a received LLR calculating unit 2 which calculates a received LLR from received information and a decoding core unit 3, and performs decoding with row processing and column processing according to the correction-type Min-Sum algorithm with division on a received signal by means of the decoding core unit 3.

The decoding core unit 3 is provided with an intermediate-result holding unit 4, a row processing unit 5, a column processing unit 6, a control unit 7, and a decoded result judgment unit 8. The intermediate-result holding unit 4 holds intermediate results of the decoding processing carried out by the row processing unit 5 and column processing unit 6, as previously explained in above-mentioned embodiment 1. The row processing unit 5 carries out row processing using the above-mentioned equation (17), and the column processing unit 6 carries out column processing using the above-mentioned equations (4) and (5) for the relation shown by the above-mentioned equation (16).

The control unit 7 controls the iteration of the decoding processing carried out by the row processing unit 5 and column processing unit 6. The decoded result judgment unit 8 calculates a decoded sequence which is a decoded result from a hard decision of a posterior value calculated by the column processing unit 6 using the above-mentioned equation (6), and performs a parity check on the decoded result so as to judge whether or not the decoded result is correct from the condition shown by the above-mentioned equation (7).

Figure 13:
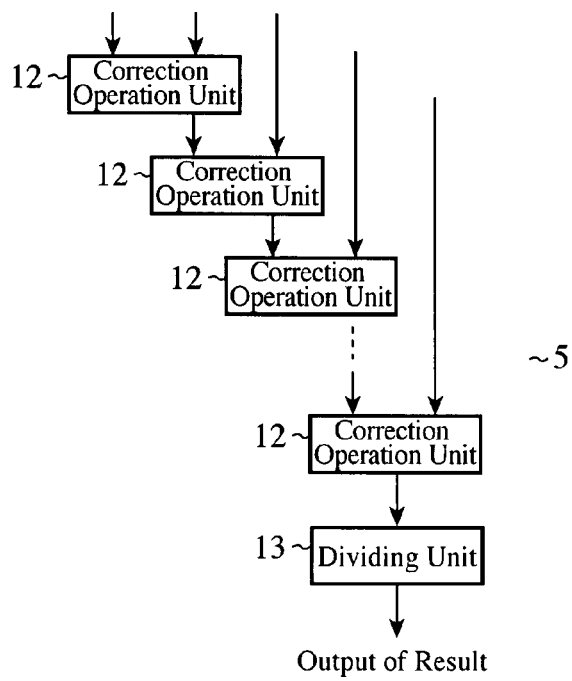
FIG. 13 is a block diagram showing the structure of a row processing unit of an LDPC code decoding apparatus in accordance with embodiment 5 of the present invention.

FIG. 13 is a block diagram showing the structure of the row processing unit of the LDPC code decoding apparatus in accordance with embodiment 5. The row processing unit 5 in accordance with this embodiment consists of a plurality of correction operation units 12 and a dividing unit 13. Each correction operation unit 12 carries out a comparison between the absolute values of two inputted values, a calculation of the correction term, makes a correction, and calculates a product of the corrected value and the signs (±) of the two values, like that as shown in FIG. 10. The row processing unit 5 consists of a plurality of correction operation units 12 which are cascaded. As shown in the figure, a correction operation unit 12 located at a lower stage inputs, as one of the two inputs thereof, a computed result of another correction operation unit 12 which is located immediately above the former correction operation unit. Each correction operation unit 12 carries out a process as follows.

When each correction operation unit 12 inputs the absolute values of two values a and b, it calculates δ=0.69−(||a|−|b||)>>2 (ln(2)≈0.69). If then |a|<|b|, each correction operation unit outputs sign(a)×sign(b)×(|a|−δ). Unless |a|<|b|, each correction operation unit outputs sign(a)×sign(b)×(|b|−δ). sign(a) shows the sign (±) of a.

The dividing unit 13 divides the operation result of the above-mentioned plurality of correction operation units 12 by the constant α (i.e., the normalization factor). That is, the dividing unit 13 calculates c/α from the input value c, and outputs it. Thus, in the row processing unit 5, the plurality of correction operation units 12 input the LLRs of bits on which the row processing unit performs the row processing from the intermediate-result holding unit 4, and each of them carries out a comparison between the absolute values of two inputted values, calculates a product of the corrected value and the signs (±) of the two values, and makes a correction with the correction term, and the dividing unit 13 divides the resultant value calculated by the plurality of correction operation units 12 by the constant α and then delivers the division result to the column processing unit 6.

Next, the operation of the decoding apparatus in accordance with this embodiment of the present invention will be explained.

A flow of the fundamental operation of the LDPC code decoding apparatus in accordance with this embodiment 5 is the same as that shown in the flow chart of FIG. 11 in above-mentioned embodiment 4. Therefore, the operation of the LDPC code decoding apparatus will be explained with reference to FIG. 11, and an operation different from that of above-mentioned embodiment 4 will also be explained.

First, the received LLR calculating unit 2 inputs received information (in step ST1), and calculates a received LLR from this received information (in step ST2). Next, in an initialization step (in step ST3), the received LLR calculating unit 2 sets the calculated received LLR to the intermediate-result holding unit 4 as an initial value $z_{m,n}^{(0)}(:=F_n)$. At this time, the control unit 7 initializes the number of iterations i of decoding to i=1.

Next, in step ST4a, until the number of iterations changes from i=1 to i=the last decoding time (i.e., a maximum number of iterations $I_{max}$), an iterative decoding process of step 1 by means of the row processing unit 5 and column processing unit 6 and a decision process of step 2 according to the above-mentioned equation (7) by means of the decoded result judgment unit 8 are repeatedly carried out.

A decoding operation at the ith iteration will be explained as an example.

First, in step 1, the row processing unit 5 performs the row processing in the decoding operation at the ith iteration on the check matrix H (=$[H_{m,n}]$) of an LDP code to be decoded. To be more specific, the row processing unit performs the row processing on each row having an element of 1 which is included in the 1st to Nth columns of the check matrix H according to the relation shown by the above-mentioned equation (11) and using the above-mentioned equation (17), and makes the intermediate-result holding unit 4 hold the processed result.

When the row processing unit 5, in step 1, completes the row processing, the column processing unit 6 performs the column processing on the check matrix H of the LDPC code to be decoded in the decoding operation at the ith iteration. To be more specific, the column processing unit 6 performs the column processing on each column which is included in the 1st to Nth columns of the check matrix H according to the relation shown by the above-mentioned equation (16), and makes the intermediate-result holding unit 4 hold the processed result.

In step 2, the decoded result judgment unit 8 carries out a hard decision of a posterior value $z_n^{(i)}$ which is calculated by the column processing unit 6 at the ith iteration, determines a decoded result, and performs a parity check on the decoded result. At this time, if the result of the parity check indicates NG, the control unit 7 increments the number of iterations i by one, and then makes the row processing unit 5 and column processing unit 6 carry out the process of step 1. In contrast, if the condition shown by the above-mentioned equation (7) is satisfied, the control unit makes them shift to a process of step 3 which will be mentioned later.

Thus, the control unit 7 controls the row processing unit 5 and column processing unit 6 to repeat the process of step 1 until the result of the parity check indicates O.K. or the number of iterations reaches its maximum $I_{max}$ which is set up, as shown in the above-mentioned equation (7).

When the result of the parity check by the decoded result judgment unit 8 indicates O.K. or the number of iterations i set up by the control unit 7 reaches its maximum $I_{max}$, the control unit 7, in step 3 (in step ST5), makes the row processing unit 5 and column processing unit 6 end their decoding processings, and the decoded result judgment unit 8 outputs a decoded sequence as shown by the above-mentioned equation (6) as a decoded result.

Figure 14:
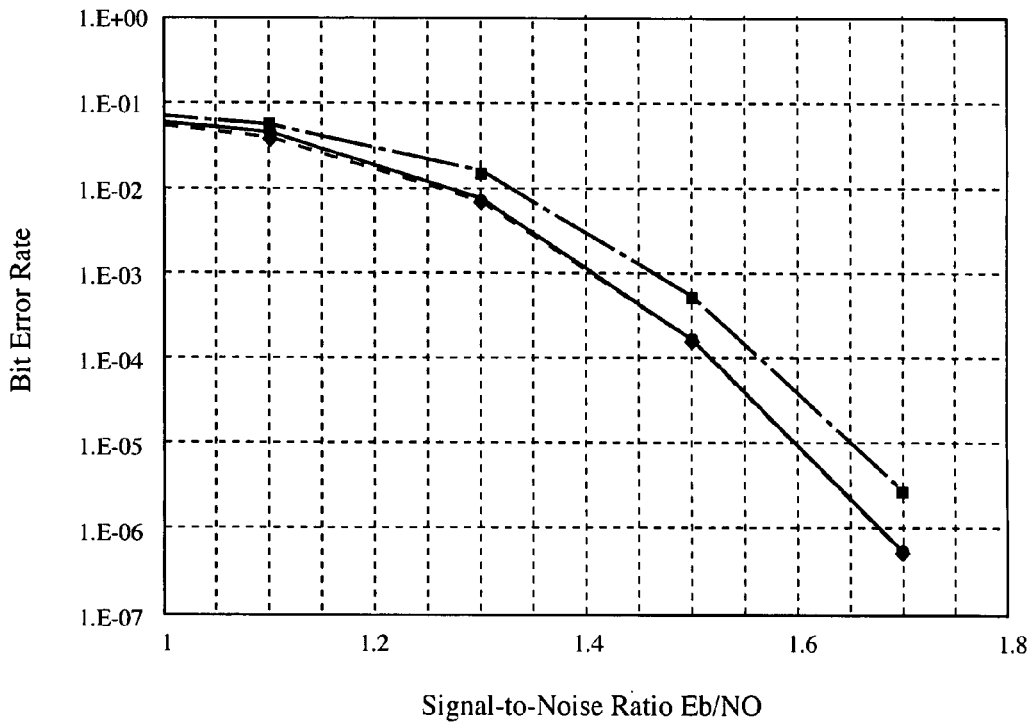
FIG. 14 is a graph in which a relation between a bit error rate and a signal-to-noise ratio (Eb/No) is plotted.

FIG. 14 is a graph in which a relation between a bit error rate and a signal-to-noise ratio (Eb/No) at this bit error rate is plotted in each of an LDPC code decoding apparatus according to the prior art Sum-Product algorithm, an LDPC code decoding apparatus according to the prior art Normalized BP algorithm, and the LDPC code decoding apparatus in accordance with this embodiment 5. In the figure, a dashed line which connects between points shows the relation in accordance with the prior art Sum-Product algorithm, an alternate long and short dash line which connects between points shows the relation in accordance with the prior art Normalized BP algorithm, and a solid line which connects between points shows the relation in accordance with the algorithm of this embodiment 5.

In FIG. 14, the LDPC code is a regular LDPC code, and has a code length of 8,000, a coding rate of ½, a column weight of 3, and a row weight of 6, the maximum number of iterations $I_{max}$ is 100 times. Furthermore, assume that the communication path is an AWGN (Additive White Gaussian Noise) communication path, and the modulation method is a BPSK (Binary Phase Shift Keying) method. The figure shows the decoding performance at the time of setting the factor α (i.e., the normalization factor) to α=1.25 in the Normalized BP algorithm.

In accordance with the prior art Sum-Product algorithm and the prior art Normalized BP algorithm, after all the row processings on the encoded signal according to the above-mentioned equations (2) and (9) are completed at an arbitrary iteration of the iterative decoding, the column processing is performed on all the bits of the encoded signal.

In contrast, the LDPC code decoding apparatus 1 in accordance with this embodiment 5 completes all the row processings on the encoded signal according to the correction-type Min-Sum algorithm with division of carrying out the column processing using the value which is obtained by dividing the row-processed result obtained according to the correction-type Min-Sum algorithm shown in above-mentioned embodiment 4 by the constant α, the LDPC code decoding apparatus 1 performs the column processing on all the bits of the encoded signal. As can be seen from FIG. 14, the LDPC code decoding apparatus in accordance with this embodiment 5 can remarkably improve its decoding performance with this correction, as compared with the case of using the prior art Normalized BP algorithm, and can achieve much the same decoding performance as that using the prior art Sum-Product algorithm.

As previously explained, because the LDPC code decoding apparatus according to this embodiment 5 carries out the decoding processing according to the correction-type Min-Sum algorithm with division of carrying out the column processing using the value which is obtained by dividing the row-processed result obtained according to the correction-type Min-Sum algorithm of making a correction using the correction term which can be computed only with a subtraction operation and a bit shift operation on the received information, the LDPC code decoding apparatus can remarkably improve the decoding performance as compared with the case of using the prior art Normalized BP algorithm, by not only adjusting the difference between the magnitudes of LLRs calculated according to the prior art Sum-Product algorithm using the factor α (i.e., the normalization factor), as in the case of using the prior art Normalized BP algorithm, and by also making a further correction to the correction-type Min-Sum algorithm shown in above-mentioned embodiment 4.

Furthermore, because the LDPC code decoding apparatus calculates the correction term for the Min-Sum algorithm according to this embodiment 5 from the received information, the LDPC code decoding apparatus does not need to prepare a table for holding the correction term, unlike that using a prior art correction-type algorithm. In addition, the calculation of the correction term on the basis of the received information can be implemented only with a subtraction operation and a 1-bit-shift operation, and the LDPC code decoding apparatus 1 in accordance with this embodiment 5 can be implemented via simple hardware.

Embodiment 6

A decoding apparatus according to this embodiment 6 executes, as a decoding algorithm, a correction-type Min-Sum algorithm with subtraction of carrying out column processing using a value which is obtained by subtracting a constant from a result of row processing based on the correction-type Min-Sum algorithm explained in above-mentioned embodiment 4.

Although the decoding apparatus in accordance with this embodiment 6 has fundamentally the same structure as that of the decoding apparatus in accordance with above-mentioned embodiment 4 shown in FIG. 9, the structure and operation of a row processing unit 5 differ from those of the row processing unit 5 of above-mentioned embodiment 4 because it executes the correction-type Min-Sum algorithm with subtraction.

To be more specific, the row processing unit 5 in accordance with this embodiment 6 performs an arithmetic operation according to the following equation (18), instead of the operation according to the above-mentioned equation (12) which is used in the row processing of above-mentioned embodiment 4, on the above-mentioned equation (11). Assume that parameters in the following equation (18) follow the above-mentioned equations (13) to (15). Furthermore, other processes are the same as those shown in above-mentioned embodiment 4, and symbols in the equation are the same as those as mentioned above.

[Equation 11]

$$p = \prod_{n' \in N(m)\backslash n} \text{sign}(z_{m,n'}^{(i-1)}) \cdot q \quad (18)$$

$$\varepsilon_{m,n}^{(i)} = \text{sign}(p) \cdot \text{MAX}(|p| - \beta, 0)$$

In this equation, a correction term δ for use in the Min-Sum algorithm is an approximation term which can be acquired from a series expansion of an update equation based on the Sum-Product algorithm, and can be computed only with the difference between the absolute values of two inputs, a division by 2, and a subtraction from a constant C.

An example of the constant C is ln(2) which is acquired with a rough calculation using the update equation based on the Sum-Product algorithm, and it is also possible to improve the decoding performance by setting an appropriate value to the constant C. Furthermore, the division by 2 can be implemented with a 1-bit bit shift operation in a system, such as hardware, in which numbers are expressed as binary numbers.

The subtraction constant β has the same advantage as the offset factor in the Offset BP algorithm, and has an advantage of improving the decoding performance by adjusting the magnitude of an LLR calculated through the row processing based on the correction-type Min-Sum algorithm in above-mentioned embodiment 4 to substantially the same value as the magnitude of an LLR calculated according to the Sum-Product algorithm. The subtraction constant β in the correction-type Min-Sum algorithm with subtraction of this embodiment 6 is referred to as the offset factor, as in the case of the Offset BP algorithm.

As mentioned above, the fundamental structure of the LDPC code decoding apparatus in accordance with this embodiment 6 is the same as that of above-mentioned embodiment 4 shown in FIG. 9. That is, the LDPC code decoding apparatus is provided with a received LLR calculating unit 2 which calculates a received LLR from received information and a decoding core unit 3, and performs decoding with row processing and column processing according to the correction-type Min-Sum algorithm with subtraction on a received signal by means of the decoding core unit 3.

The decoding core unit 3 is provided with an intermediate-result holding unit 4, a row processing unit 5, a column processing unit 6, a control unit 7, and a decoded result judgment unit 8. The intermediate-result holding unit 4 holds intermediate results of the decoding processing carried out by the row processing unit 5 and column processing unit 6, as previously explained in above-mentioned embodiment 1. The row processing unit 5 carries out row processing using the above-mentioned equation (18), and the column processing unit 6 carries out column processing using the above-mentioned equations (4) and (5) for the relation shown by the above-mentioned equation (16).

The control unit 7 performs control of decoding iterations, such as a setup of a maximum number of iterations. The decoded result judgment unit 8 calculates a decoded sequence which is a decoded result from a hard decision of a posterior value calculated by the column processing unit 6 using the above-mentioned equation (6), and performs a parity check on the decoded result so as to judge whether or not the decoded result is correct from the condition shown by the above-mentioned equation (7).

Figure 15:
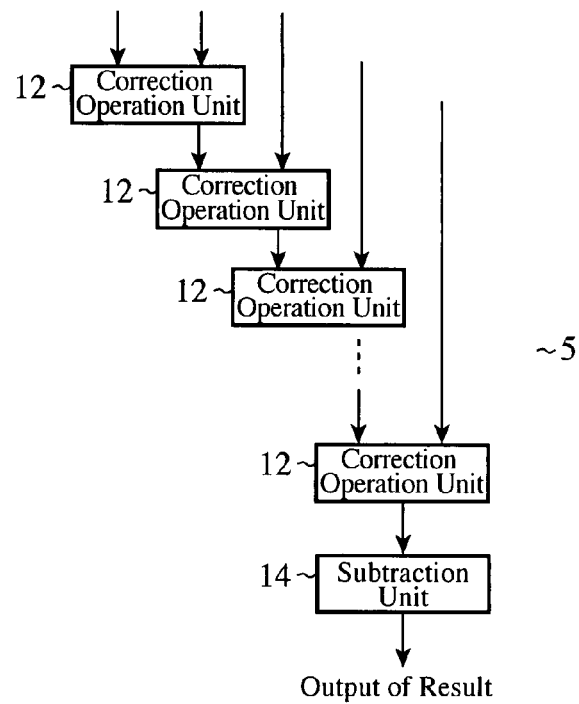
FIG. 15 is a block diagram showing the structure of a row processing unit of an LDPC code decoding apparatus in accordance with embodiment 6 of the present invention.

FIG. 15 is a block diagram showing the structure of the row processing unit of the LDPC code decoding apparatus in accordance with embodiment 6. The row processing unit 5 in accordance with this embodiment consists of a plurality of correction operation units 12 and a subtraction unit 14. Each correction operation unit 12 carries out a comparison between the absolute values of two inputted values, a calculation of the correction term, makes a correction, and calculates a product of the corrected value and the signs (±) of the two values, like that as shown in FIG. 10. The row processing unit 5 consists of a plurality of correction operation units 12 which are cascaded. As shown in the figure, a correction operation unit 12 located at a lower stage inputs, as one of the two inputs thereof, a computed result of another correction operation unit 12 which is located immediately above the former correction operation unit. Each correction operation unit 12 carries out a process as follows.

When each correction operation unit 12 inputs the absolute values of two values a and b, it calculates δ=0.69−(||a|−|b||)>>2 (ln(2)≈0.69). If then |a|<|b|, each correction operation unit outputs sign(a)×sign(b)×(|a|−δ). Unless |a|<|b|, each correction operation unit outputs sign(a)×sign(b)×(|b|−δ). sign(a) shows the sign (±) of a.

The subtraction unit 14 subtracts the constant β (i.e., the offset factor) from the operation result of the above-mentioned plurality of correction operation units 12. That is, the subtraction unit 14 calculates (c−β) from the input value c, and outputs (c−β) if the calculation result is not negative and otherwise outputs 0. Thus, in the row processing unit 5, the plurality of correction operation units 12 input the LLRs of bits on which the row processing unit performs the row processing from the intermediate-result holding unit 4, and each of the plurality of correction operation units carries out a comparison between the absolute values of two inputted values, calculates a product of the corrected value and the signs (±) of the two values, and makes a correction with the correction term, and the subtraction unit 14 subtracts the constant β from the resultant value calculated by the plurality of correction operation units 12, and delivers (c−β) or 0 to the column processing unit 6 according to the subtraction result.

Next, the operation of the decoding apparatus in accordance with this embodiment of the present invention will be explained.

A flow of the fundamental operation of the LDPC code decoding apparatus in accordance with this embodiment 6 is the same as that shown in the flow chart of FIG. 11 in abovementioned embodiment 4. Therefore, the operation of the LDPC code decoding apparatus will be explained with reference to FIG. 11, and an operation different from that of above-mentioned embodiment 4 will also be explained.

First, the received LLR calculating unit 2 inputs received information (in step ST1), and calculates a received LLR from this received information (in step ST2). Next, in an initialization step (in step ST3), the received LLR calculating unit 2 sets the calculated receive LLR to the intermediate-result holding unit 4 as an initial value $z_{m,n}^{(0)}(:=F_n)$. At this time, the control unit 7 initializes the number of iterations i of decoding to i=1.

Next, in step ST4a, until the number of iterations changes from i=1 to i=the last decoding time (i.e., a maximum number of iterations $I_{max}$), an iterative decoding process of step 1 by means of the row processing unit 5 and column processing unit 6 and a decision process of step 2 according to the above-mentioned equation (7) by means of the decoded result judgment unit 8 are repeatedly carried out.

A decoding operation at the ith iteration will be explained as an example.

First, in step 1, the row processing unit 5 performs the row processing in the decoding operation at the ith iteration on the check matrix H ($=[H_{m,n}]$) of an LDP code to be decoded. To be more specific, the row processing unit performs the row processing on each row having an element of 1 which is included in the 1st to Nth columns of the check matrix H according to the relation shown by the above-mentioned equation (11) and using the above-mentioned equation (18), and makes the intermediate-result holding unit 4 hold the processed result.

When the row processing unit 5, in step 1, completes the row processing, the column processing unit 6 performs the column processing on the check matrix H of the LDPC code to be decoded in the decoding operation at the ith iteration. To be more specific, the column processing unit 6 performs the column processing on each column which is included in the 1st to Nth columns of the check matrix H according to the relation shown by the above-mentioned equation (16), and makes the intermediate-result holding unit 4 hold the processed result.

In step 2, the decoded result judgment unit 8 carries out a hard decision of a posterior value $z_n^{(i)}$ which is calculated by the column processing unit 6 at the ith iteration, determines a decoded result, and performs a parity check on the decoded result. At this time, if the result of the parity check indicates NG, the control unit 7 increments the number of iterations i by one, and then makes the row processing unit 5 and column processing unit 6 carry out the process of step 1. In contrast, if the condition shown by the above-mentioned equation (7) is satisfied, the control unit makes them shift to a process of step 3 which will be mentioned later.

Thus, the control unit 7 controls the row processing unit 5 and column processing unit 6 to repeat the process of step 1 until the result of the parity check indicates O.K. or the number of iterations reaches its maximum $I_{max}$ which is set up, as shown in the above-mentioned equation (7).

When the result of the parity check by the decoded result judgment unit 8 indicates O.K. or the number of iterations i set up by the control unit 7 reaches its maximum $I_{max}$, the control unit 7, in step 3 (in step ST5), makes the row processing unit and column processing unit 6 end their decoding processings, and the decoded result judgment unit 8 outputs a decoded sequence as shown by the above-mentioned equation (6) as a decoded result.

Figure 16:
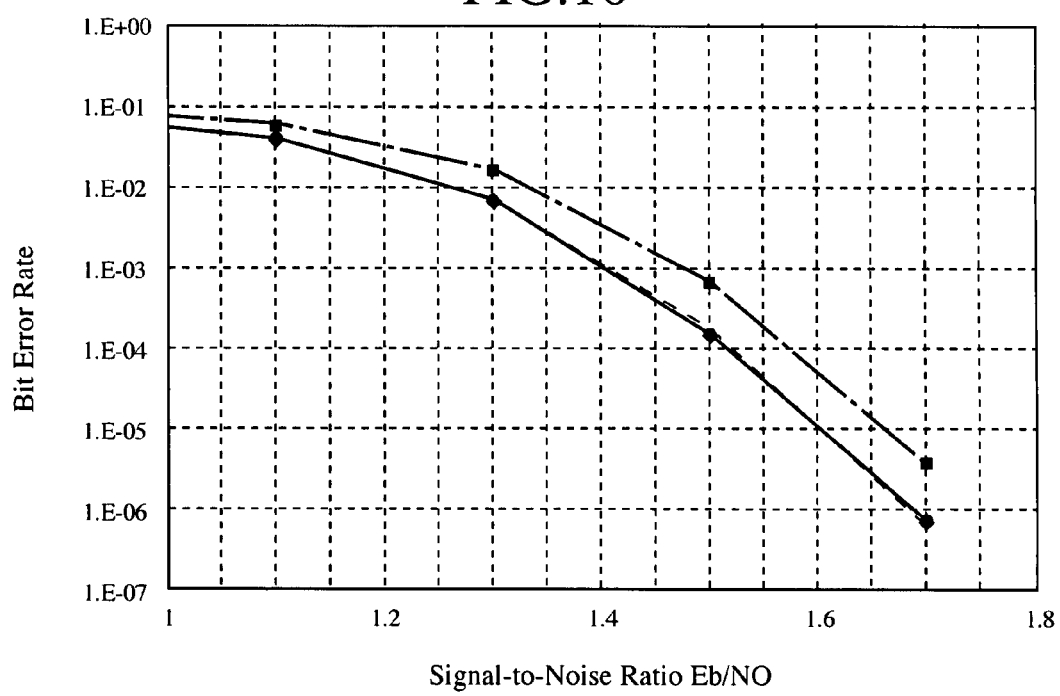
FIG. 16 is a graph in which a relation between a bit error rate and a signal-to-noise ratio (Eb/No) is plotted.

FIG. 16 is a graph in which a relation between a bit error rate and a signal-to-noise ratio (Eb/No) at this bit error rate is plotted in each of an LDPC code decoding apparatus according to the prior art Sum-Product algorithm, an LDPC code decoding apparatus according to the prior art Offset BP algorithm, and the LDPC code decoding apparatus in accordance with the embodiment 6. In the figure, a dashed line which connects between points shows the relation in accordance with the prior art Sum-Product algorithm, an alternate long and short dash line which connects between points shows the relation in accordance with the prior art Offset BP algorithm, and a solid line which connects between points shows the relation in accordance with the algorithm of this embodiment 6.

In FIG. 16, the LDPC code is a regular LDPC code, and has a code length of 8,000, a coding rate of ½, a column weight of 3, and a row weight of 6, the maximum number of iterations $I_{max}$ is 100 times. Assume that the communication path is an AWGN (Additive White Gaussian Noise) communication path, and the modulation method is a BPSK (Binary Phase Shift Keying) method. The figure shows the decoding performance at the time of setting the factor β (i.e., the offset factor) to β=0.15 in the Offset BP algorithm.

In accordance with the prior art Sum-Product algorithm and the prior art Offset BP algorithm, after all the row processings on the encoded signal according to the above-mentioned equations (2) and (10) are completed at an arbitrary iteration of the iterative decoding, the column processing is performed on all the bits of the encoded signal.

In contrast, the LDPC code decoding apparatus 1 in accordance with this embodiment 6 completes all the row processings on the encoded signal according to the correction-type Min-Sum algorithm with subtraction of carrying out the column processing using the value which is obtained by subtracting the constant β from the row-processed result obtained according to the correction-type Min-Sum algorithm shown in above-mentioned embodiment 4, the LDPC code decoding apparatus 1 performs the column processing on all the bits of the encoded signal. As can be seen from FIG. 16, the LDPC code decoding apparatus in accordance with this embodiment 6 can remarkably improve its decoding performance with this correction, as compared with the case of using the prior art Offset BP algorithm, and can achieve much the same decoding performance as that using the prior art Sum-Product algorithm.

As previously explained, because the LDPC code decoding apparatus according to this embodiment 6 carries out the decoding processing according to the correction-type Min-Sum algorithm with subtraction of carrying out the column processing using the value which is obtained by subtracting the constant from the row-processed result obtained according to the correction-type Min-Sum algorithm for making a correction using the correction term which can be computed only with a subtraction operation and a bit shift operation on the received information, the LDPC code decoding apparatus can remarkably improve the decoding performance as compared with the case of using the prior art Offset BP algorithm by not only adjusting the difference between the magnitudes of LLRs calculated according to the prior art Sum-Product algorithm using the factor β (i.e., the offset factor), as in the case of using the prior art Normalized BP algorithm, and by also making a further correction to the correction-type Min-Sum algorithm shown in above-mentioned embodiment 4.

Furthermore, because the LDPC code decoding apparatus calculates the correction term for the Min-Sum algorithm according to this embodiment 6 from the received information, the LDPC code decoding apparatus does not need to prepare a table for holding the correction term, unlike that using a prior art correction-type algorithm. In addition, the calculation of the correction term on the basis of the received information can be implemented only with a subtraction and a 1-bit-shift operation, and the LDPC code decoding apparatus 1 in accordance with embodiment 6 can be implemented via simple hardware.

Embodiment 7

A decoding apparatus in accordance with this embodiment 7 performs a calculation and an update of probability information with row processing and column processing on a received signal in batches of one 1 bit or two or more predetermined bits, and executes the correction-type Min-Sum algorithm explained in above-mentioned embodiment 4 in the row processing.

Although the LDPC code decoding apparatus in accordance with this embodiment 7 has fundamentally the same structure as that of the LDPC code decoding apparatus in accordance with above-mentioned embodiment 4 shown in FIG. 9, the LDPC code decoding apparatus in accordance with this embodiment 7 differs from that in accordance with above-mentioned embodiment 4 in that it performs a calculation and an update of probability information with row processing and column processing according to the correction-type Min-Sum algorithm on a received signal in batches of one 1 bit or two or more predetermined bits.

To be more specific, a row processing unit 5 in accordance with this embodiment 7 performs an arithmetic operation according to the following equation (19), instead of the arithmetic operation according to the above-mentioned equation (12) which is used in the row processing of above-mentioned embodiment 4, on the above-mentioned equation (1). Assume that parameters in the following equation (19) follow the following equation (20) and the above-mentioned equations (13) to (15). Furthermore, other processes are the same as those shown in above-mentioned embodiment 4, and symbols in the equation are the same as those as mentioned above.

[Equation 12]

$$\varepsilon_{m,n}^{(i)} = \prod_{\substack{n' \in N(m)\setminus n \\ n' \leq g \cdot N_g}} \text{sign}(z_{m,n'}^{(i)}) \cdot \prod_{\substack{n' \in N(m)\setminus n \\ n' \geq g \cdot N_g+1}} \text{sign}(z_{m,n'}^{(i-1)}) \cdot q \quad (19)$$

$$q = func(z_{m,n'_0}^{(i)}, q), \quad (20)$$

$$q = func(z_{m,n'_{g \cdot N_g}}^{(i)}, q),$$

$$q = func(z_{m,n'_{g \cdot N_g+1}}^{(i-1)}, q), \ldots,$$

$$q = func(z_{m,n'_{max-1}}^{(i-1)}, z_{m,n'_{max}}^{(i-1)})$$

In the above-mentioned equation (15), a correction term δ for use in the Min-Sum algorithm is an approximation term which can be acquired from a series expansion of an update equation based on the Sum-Product algorithm, and can be computed only with the difference between the absolute values of two inputs, a division by 2, and a subtraction from a constant C.

An example of the constant C is ln(2) which is acquired with a rough calculation using the update equation based on the Sum-Product algorithm, and it is also possible to improve the decoding performance by setting an appropriate value to the constant C. Furthermore, the division by 2 can be implemented with a 1-bit bit shift operation in a system, such as hardware, in which numbers are expressed as binary numbers.

As mentioned above, the fundamental structure of the LDPC code decoding apparatus in accordance with this embodiment 7 is the same as that of above-mentioned embodiment 4 shown in FIG. 9. That is, the LDPC code decoding apparatus is provided with a received LLR calculating unit 2 which calculates a received LLR from received information and a decoding core unit 3, and performs decoding with row processing and column processing according to the correction-type Min-Sum algorithm on a received signal by means of the decoding core unit 3.

The decoding core unit 3 is provided with an intermediate-result holding unit 4, a row processing unit 5, a column processing unit 6, a control unit 7, and a decoded result judgment unit 8. The intermediate-result holding unit 4 holds intermediate results of the decoding processing carried out by the row processing unit 5 and column processing unit 6, as previously explained in above-mentioned embodiment 1. The row processing unit 5 carries out row processing using the above-mentioned equation (19) for the relation shown by the above-mentioned equation (1), and the column processing unit 6 carries out column processing using the above-mentioned equations (4) and (5) for the relation shown by the above-mentioned equation (1).

The control unit 7 performs control of decoding iterations, such as a setup of a maximum number of iterations. The decoded result judgment unit 8 calculates a decoded sequence which is a decoded result from a hard decision of a posterior value calculated by the column processing unit 6 using the above-mentioned equation (6), and performs a parity check on the decoded result so as to judge whether or not the decoded result is correct from the condition shown by the above-mentioned equation (7).

The row processing unit 5 in accordance with this embodiment 7 has the same fundamental structure as that of that according to above-mentioned embodiment 4 as shown in FIG. 10. That is, each correction operation unit 12 carries out a comparison between the absolute values of two inputted values, a calculation of the correction term, makes a correction on the basis of this correction term, and calculates a product of the corrected value and the signs (±) of the two values. The row processing unit 5 consists of a plurality of correction operation units 12 which are cascaded, and a correction operation unit 12 located at a lower stage inputs, as one of the two inputs thereof, a computed result of another correction operation unit 12 which is located immediately above the former correction operation unit. Each correction operation unit 12 carries out a process as follows.

When each correction operation unit 12 inputs the absolute values of two values a and b, it calculates $\delta=0.69-(||a|-|b||)>>2$ first ($\ln(2)\approx0.69$). If then $|a|<|b|$, each correction operation unit outputs $sign(a)\times sign(b)\times(|a|-\delta)$. Unless $|a|<|b|$, each correction operation unit outputs $sign(a)\times sign(b)\times(|b|-\delta)$. $sign(a)$ shows the sign (±) of a. The row processing unit 5 inputs the LLRs of bits on which it performs the row processing from the intermediate-result holding unit 4, each of the plurality of correction operation units 12 carries out a comparison between the absolute values of two inputted values, makes a correction, and calculates a product of the corrected value and the signs (±) of the two values, and the plurality of correction operation units the resultant value to the column processing unit 6.

Thus, the LDPC code decoding apparatus in accordance with this embodiment 7 is based on the Shuffled BP algorithm of performing a calculation and an update of probability information with row processing and column processing on the received signal in batches of one 1 bit or two or more predetermined bits, and uses the above-mentioned equation (19) in each row processing without using the above-mentioned equations (2) and (3).

Next, the operation of the LDPC code decoding apparatus in accordance with this embodiment of the present invention will be explained.

A flow of the fundamental operation of the LDPC code decoding apparatus in accordance with this embodiment 7 is the same as that shown in the flow chart of FIG. 3 in above-mentioned embodiment 1. Therefore, the operation of the LDPC code decoding apparatus will be explained with reference to FIG. 3.

First, the received LLR calculating unit 2 inputs received information (in step ST1), and calculates a received LLR from this received information (in step ST2). Next, in an initialization step (in step ST3), the received LLR calculating unit 2 sets the calculated receive LLR to the intermediate-result holding unit 4 as an initial value $z_{m,n}^{(0)}(:=F_n)$. At this time, the control unit 7 initializes the number of iterations i of decoding to i=1.

Next, in step ST4, until the number of iterations changes from i=1 to i=the last decoding time (i.e., a maximum number of iterations $I_{max}$), an iterative decoding process of step 1 by means of the row processing unit 5 and column processing unit 6 and a decision process of step 2 according to the above-mentioned equation (7) by means of the decoded result judgment unit 8 are repeatedly carried out.

A decoding operation at the ith iteration will be explained as an example.

First, the row processing unit 5 performs the row processing on each row having an element of 1 which is included in the 1st to $N_g$th columns of the check matrix H ($=[H_{m,n}]$) of an LDPC code to be decoded according to the above-mentioned equation (19) at the time of g=1 in the above-mentioned equation (1), and delivers the processed result to the column processing unit 6. The column processing unit 6 similarly performs the column processing on each column having an element of 1 which is included in the 1st to $N_g$th columns of the check matrix H, and makes the intermediate-result holding unit 4 hold the processed result.

Next, the row processing unit 5 performs the row processing on each row having an element of 1 which is included in the $(N_g+1)$th to $2N_g$th columns of the check matrix H according to the above-mentioned equation (19) at the time of g=2 in the above-mentioned equation (1), and delivers the processed result to the column processing unit 6. The column processing unit 6 similarly performs the column processing on each column having an element of 1 which is included in the $(N_g+1)$th to $2N_g$th columns of the check matrix H, and makes the intermediate-result holding unit 4 hold the processed result.

After that, every time when the row processing unit and column processing unit carry out the row processing and column processing one after another at the time of g=3 or larger, the row processing unit 5 delivers the processed result to the column processing unit 6, and the column processing unit 6 makes the intermediate-result holding unit 4 hold the processed result.

Finally, the row processing unit 5 performs the row processing on each row having an element of 1 which is included in the $(N-N_g)$th to Nth columns of the check matrix H according to the above-mentioned equation (19) at the time of g=G in the above-mentioned equation (1), and delivers the processed result to the column processing unit 6. The column processing unit 6 similarly performs the column processing on each column having an element of 1 which is included in the $(N-N_g)$th to Nth columns of the check matrix H, and makes the intermediate-result holding unit 4 hold the processed result.

In the above-mentioned processing, the row processing unit 5 follows the above-mentioned equation (19), and, when performing the processing after g=1, the row processing unit 5 therefore performs the row processing on a column having an already-updated LLR at the ith iteration, not using the received LLR but using the updated LLR.

In step 2, the decoded result judgment unit 8 carries out a hard decision of a posterior value $z_n^{(i)}$ which is calculated by the column processing unit 6 at the ith iteration, determines a decoded result, and performs a parity check on the decoded result. At this time, if the result of the parity check indicates NG, the control unit 7 increments the number of iterations i by one, and then makes the row processing unit 5 and column processing unit 6 carry out the process of step 1. In contrast, if the condition shown by the above-mentioned equation (7) is satisfied, the control unit makes them shift to a process of step 3 which will be mentioned later.

Thus, the control unit 7 controls the row processing unit 5 and column processing unit 6 to repeat the processes of steps 1 and 2 which are based on the above-mentioned equation (8) until the result of the parity check indicates O.K. or the number of iterations reaches its maximum $I_{max}$ which is set up, as shown in the above-mentioned equation (7).

When the result of the parity check by the decoded result judgment unit 8 indicates O.K. or the number of iterations i set up by the control unit 7 reaches its maximum $I_{max}$, the control unit 7, in step 3 (in step ST5), makes the row processing unit 5 and column processing unit 6 end their decoding processings, and the decoded result judgment unit 8 outputs a decoded sequence as shown by the above-mentioned equation (6) as a decoded result.

As mentioned above, the LDPC code decoding apparatus in accordance with this embodiment 7 performs a calculation and an update of probability information with row processing and column processing on a received signal in batches of one 1 bit or two or more predetermined bits, and carries out the row processing according to the correction-type Min-Sum algorithm shown in above-mentioned embodiment 4. Therefore, the transmission of the probability information can be carried out more efficiently, and the rate of the convergence in the decoding operation can be improved and therefore the number of iterations can be reduced.

Furthermore, because this embodiment uses, as the fundamental algorithm, the correction-type Min-Sum algorithm of making a correction from the received information on the basis of an approximation of the Sum-Product algorithm, the calculation cost can be further reduced and high decoding performance can be achieved as compared with the case of using the prior art Shuffled BP algorithm.

Embodiment 8

An LDPC code decoding apparatus in accordance with this embodiment 8 performs a calculation and an update of probability information with row processing and column processing on a received signal in batches of one 1 bit or two or more predetermined bits, and executes the correction-type Min-Sum algorithm with division as explained in above-mentioned embodiment 5 in the row processing.

Although the LDPC code decoding apparatus in accordance with this embodiment 8 has fundamentally the same structure as that of the LDPC code decoding apparatus in accordance with above-mentioned embodiment 4 shown in FIG. 9, the structure and operation of a row processing unit 5 differ from those of the row processing unit 5 of embodiment 4 because it executes the correction-type Min-Sum algorithm with division.

To be more specific, the row processing unit 5 in accordance with this embodiment 8 performs an arithmetic operation according to the following equation (21) on the above-mentioned equation (1). That is, in the Shuffled-BP-algorithm-based row process in step 1 of performing a calculation and an update of probability information with row processing and column processing on a received signal in batches of one 1 bit or two or more predetermined bits, the row processing unit carries out an update operation according to the following equation (21) which is an update equation for use in the correction-type Min-Sum algorithm with division as shown in above-mentioned embodiment 5. Assume that parameters in the following equation (21) follow the following equation (20) and the above-mentioned equations (14) and (15). Furthermore, other processes are the same as those shown in above-mentioned embodiment 4, and symbols in the equation are the same as those as mentioned above.

[Equation 13]

$$\varepsilon_{m,n}^{(i)} = \frac{1}{\alpha} \cdot \prod_{\substack{n' \in N(m) \setminus n \\ n' \leq g \cdot N_g}} \text{sign}(z_{m,n'}^{(i)}) \cdot \prod_{\substack{n' \in N(m) \setminus n \\ n' \geq g \cdot N_g + 1}} \text{sign}(z_{m,n'}^{(i-1)}) \cdot q \quad (21)$$

A correction term δ for use in the Min-Sum algorithm in the above-mentioned equation (15) is an approximation term which can be acquired from a series expansion of an update equation based on the Sum-Product algorithm, and can be computed only with the difference between the absolute values of two inputs, a division by 2, and a subtraction from a constant C.

An example of the constant C is ln(2) which is acquired with a rough calculation using the update equation based on the Sum-Product algorithm, and it is also possible to improve the decoding performance by setting an appropriate value to the constant C. Furthermore, the division by 2 can be implemented with a 1-bit bit shift operation in a system, such as hardware, in which numbers are expressed as binary numbers.

The division constant α offers the same advantage as provided by the normalization factor in the Normalized BP algorithm, and has an advantage of improving the decoding performance by adjusting the magnitude of an LLR calculated through the row processing based on the correction-type Min-Sum algorithm with division of performing a calculation and an update of probability information with row processing and column processing on a received signal in batches of one 1 bit or two or more predetermined bits to substantially the same value as the magnitude of an LLR calculated according to the Sum-Product algorithm.

As mentioned above, the fundamental structure of the LDPC code decoding apparatus in accordance with this embodiment 8 is the same as that of above-mentioned embodiment 4 shown in FIG. 9. That is, the LDPC code decoding apparatus is provided with a received LLR calculating unit 2 which calculates a received LLR from received information and a decoding core unit 3, and carries out a decoding process of performing a calculation and an update of probability information with row processing and column processing on a received signal in batches of one 1 bit or two or more predetermined bits according to the correction-type Min-Sum algorithm with division by means of the decoding core unit 3.

The decoding core unit 3 is provided with an intermediate-result holding unit 4, a row processing unit 5, a column processing unit 6, a control unit 7, and a decoded result judgment unit 8. The intermediate-result holding unit 4 holds intermediate results of the decoding processing carried out by the row processing unit 5 and column processing unit 6, as previously explained in above-mentioned embodiment 1. The row processing unit 5 carries out row processing according to the relation shown by the above-mentioned equation (1) and using the above-mentioned equation (21), and the column processing unit 6 carries out column processing using the above-mentioned equations (4) and (5), as in the case of step 1 of the above-mentioned Shuffled BP algorithm.

The control unit 7 performs control of decoding iterations, such as a setup of a maximum number of iterations. The decoded result judgment unit 8 calculates a decoded sequence which is a decoded result from a hard decision of a posterior value calculated by the column processing unit 6 using the above-mentioned equation (6), as in the case of step 1 of the above-mentioned Shuffled BP algorithm, and performs a parity check on the decoded result so as to judge whether or not the decoded result is correct from the condition shown by the above-mentioned equation (7).

The fundamental structure of the row processing unit 5 in accordance with this embodiment 8 is the same as that according to above-mentioned embodiment 5 shown in FIG. 13. That is, the row processing unit consists of a plurality of correction operation units 12 and a dividing unit 13. Each correction operation unit 12 carries out a comparison between the absolute values of two inputted values, a calculation of the correction term, makes a correction on the basis of this correction term, and calculates a product of the corrected value and the signs (±) of the two values. The row processing unit 5 consists of a plurality of correction operation units 12 which are cascaded, and a correction operation unit 12 located at a lower stage inputs, as one of the two inputs thereof, a computed result of another correction operation unit 12 which is located immediately above the former correction operation unit. Each correction operation unit 12 carries out a process as follows.

When each correction operation unit 12 inputs the absolute values of two values a and b, it calculates $\delta=0.69-(||a|-|b||)>>2$ first ($\ln(2)\approx 0.69$). If then $|a|<|b|$, each correction operation unit outputs $\text{sign}(a)\times\text{sign}(b)\times(|a|-\delta)$. Unless $|a|<|b|$, each correction operation unit outputs $\text{sign}(a)\times\text{sign}(b)\times(|b|-\delta)$. $\text{sign}(a)$ shows the sign (±) of a.

The dividing unit 13 divides the operation result of the above-mentioned plurality of correction operation units 12 by the constant $\alpha$ (i.e., the normalization factor). That is, the dividing unit 13 calculates $c/\alpha$ from the input value c, and outputs it. Thus, in the row processing unit 5, the plurality of correction operation units 12 input the LLRS of bits on which the row processing unit performs the row processing from the intermediate-result holding unit 4, each of them carries out a comparison between the absolute values of two inputted values, calculates a product of the corrected value and the signs (±) of the two values, and makes a correction on the basis of the correction term, and the dividing unit 13 divides the resultant value calculated by the plurality of correction operation units 12 by the constant $\alpha$ and delivers the division result to the column processing unit 6.

Thus, the LDPC code decoding apparatus in accordance with this embodiment 8 is based on the Shuffled BP algorithm of performing a calculation and an update of probability information with row processing and column processing on the received signal in batches of one 1 bit or two or more predetermined bits, and uses the above-mentioned equation (21) in each row processing.

Next, the operation of the decoding apparatus in accordance with this embodiment of the present invention will be explained.

A flow of the fundamental operation of the LDPC code decoding apparatus in accordance with this embodiment 8 is the same as that shown in the flow chart of FIG. 3 in above-mentioned embodiment 1. Therefore, the operation of the LDPC code decoding apparatus will be explained with reference to FIG. 3.

First, the received LLR calculating unit 2 inputs received information (in step ST1), and calculates a received LLR from this received information (in step ST2). Next, in an initialization step (in step ST3), the received LLR calculating unit 2 sets the calculated received LLR to the intermediate-result holding unit 4 as an initial value $z_{m,n}^{(0)}(:=F_n)$. At this time, the control unit 7 initializes the number of iterations i of decoding to i=1.

Next, in step ST4, until the number of iterations changes from i=1 to i=the last decoding time (i.e., a maximum number of iterations $I_{max}$), an iterative decoding process of step 1 by means of the row processing unit 5 and column processing unit 6 and a decision process of step 2 according to the above-mentioned equation (7) by means of the decoded result judgment unit 8 are repeatedly carried out.

A decoding operation at the ith iteration will be explained as an example.

First, the row processing unit 5 performs the row processing on each row having an element of 1 which is included in the 1st to $N_g$th columns of the check matrix H ($=[H_{m,n}]$) of an LDPC code to be decoded according to the above-mentioned equation (21) at the time of g=1 in the above-mentioned equation (1), and delivers the processed result to the column processing unit 6. The column processing unit 6 similarly performs the column processing on each column having an element of 1 which is included in the 1st to $N_g$th columns of the check matrix H, and makes the intermediate-result holding unit 4 hold the processed result.

Next, the row processing unit 5 performs the row processing on each row having an element of 1 which is included in the $(N_g+1)$th to $2N_g$th columns of the check matrix H according to the above-mentioned equation (21) at the time of g=2 in the above-mentioned equation (1), and delivers the processed result to the column processing unit 6. The column processing unit 6 similarly performs the column processing on each column having an element of 1 which is included in the $(N_g+1)$th to $2N_g$th columns of the check matrix H, and makes the intermediate-result holding unit 4 hold the processed result.

After that, every time when the row processing unit and column processing unit carry out the row processing and column processing one after another at the time of g=3 or larger, the row processing unit 5 delivers the processed result to the column processing unit 6, and the column processing unit 6 makes the intermediate-result holding unit 4 hold the processed result.

Finally, the row processing unit 5 performs the row processing on each row having an element of 1 which is included in the $(N-N_g)$th to Nth columns of the check matrix H according to the above-mentioned equation (21) at the time of g=G in the above-mentioned equation (1), and delivers the processed result to the column processing unit 6. The column processing unit 6 similarly performs the column processing on each column having an element of 1 which is included in the $(N-N_g)$th to Nth columns of the check matrix H, and makes the intermediate-result holding unit 4 hold the processed result.

In the above-mentioned processing, the row processing unit 5 follows the above-mentioned equation (21), and, when performing the processing after g=1, the row processing unit 5 therefore performs the row processing on a column having an already-updated LLR at the ith iteration, not using the received LLR but using the updated LLR.

In step 2, the decoded result judgment unit 8 carries out a hard decision of the posterior value $z_n^{(i)}$ which is calculated by the column processing unit 6 at the ith iteration, determines a decoded result, and performs a parity check on the decoded result. At this time, if the result of the parity check indicates NG, the control unit 7 increments the number of iterations i by one, and then makes the row processing unit 5 and column processing unit 6 carry out the process of step 1. In contrast, if the condition shown by the above-mentioned equation (7) is satisfied, the control unit makes them shift to a process of step 3 which will be mentioned later.

Thus, the control unit 7 controls the row processing unit 5 and column processing unit 6 to repeat the processes of steps 1 and 2 which are based on the above-mentioned equation (8) until the result of the parity check indicates O.K. or the number of iterations reaches its maximum $I_{max}$ which is set up, as shown in the above-mentioned equation (7).

When the result of the parity check by the decoded result judgment unit 8 indicates O.K. or the number of iterations i set up by the control unit 7 reaches its maximum $I_{max}$, the control unit 7, in step 3 (in step ST5), makes the row processing unit 5 and column processing unit 6 end their decoding processings, and the decoded result judgment unit 8 outputs a decoded sequence as shown by the above-mentioned equation (6) as a decoded result.

As mentioned above, the LDPC code decoding apparatus in accordance with this embodiment 8 performs a calculation and an update of probability information with row processing and column processing on a received signal in batches of one 1 bit or two or more predetermined bits, and carries out the row processing according to the correction-type Min-Sum algorithm with division shown in above-mentioned embodiment 5. Therefore, the transmission of the probability information can be carried out more efficiently, and the rate of the convergence in the decoding operation can be improved and therefore the number of iterations can be reduced.

Furthermore, because this embodiment uses, as the fundamental algorithm, the correction-type Min-Sum algorithm with division of making a correction to the received information according to an approximation of the Sum-Product algorithm, the calculation cost can be further reduced as compared with the case of using the prior art Shuffled BP algorithm and high decoding performance can be achieved.

Embodiment 9

An LDPC code decoding apparatus in accordance with this embodiment 9 performs a calculation and an update of probability information with row processing and column processing on a received signal in batches of one 1 bit or two or more predetermined bits, and executes the correction-type Min-Sum algorithm with subtraction as explained in above-mentioned embodiment 6 in the row processing.

Although the LDPC code decoding apparatus in accordance with this embodiment 9 has fundamentally the same structure as that of the LDPC code decoding apparatus in accordance with above-mentioned embodiment 4 shown in FIG. 9, the structure and operation of a row processing unit 5 differ from those of the row processing unit 5 of embodiment 4 because it executes the correction-type Min-Sum algorithm with subtraction.

To be more specific, the row processing unit 5 in accordance with this embodiment 9 performs an arithmetic operation according to the following equation (22) on the above-mentioned equation (1). That is, in the Shuffled-BP-algorithm-based row process in step 1 of performing a calculation and an update of probability information with row processing and column processing on a received signal in batches of one 1 bit or two or more predetermined bits, the row processing unit carries out an update operation according to the following equation (22) which is an update equation for use in the correction-type Min-Sum algorithm with subtraction as shown in above-mentioned embodiment 6. Assume that parameters in the following equation (22) follow the following equation (20) and the above-mentioned equations (14) and (15). Furthermore, other processes are the same as those shown in above-mentioned embodiment 4, and symbols in the equation are the same as those as mentioned above.

[Equation 14]

$$p = \prod_{\substack{n' \in N(m) \setminus n \\ n' \leq g \cdot N_g}} \text{sign}(z_{m,n'}^{(i)}) \prod_{\substack{n' \in N(m) \setminus n \\ n' \ag \cdot N_q+1}} \text{sign}(z_{m,n'}^{(i-1)} \cdot q) \quad (22)$$

$$\varepsilon_{m,n}^{(i)} = \text{sign}(p) \cdot \text{MAX}(|p| - \beta, 0)$$

A correction term δ for use in the Min-Sum algorithm in the above-mentioned equation (15) is an approximation term which can be acquired from a series expansion of an update equation based on the Sum-Product algorithm, and can be computed only with the difference between the absolute values of two inputs, a division by 2, and a subtraction from a constant C.

An example of the constant C is ln(2) which is acquired with a rough calculation using the update equation based on the Sum-Product algorithm, and it is also possible to improve the decoding performance by setting an appropriate value to the constant C. Furthermore, the division by 2 can be implemented with a 1-bit bit shift operation in a system, such as hardware, in which numbers are expressed as binary numbers.

The subtraction constant β offers the same advantage as provided by the offset factor β in the Offset BP algorithm, and has an advantage of improving the decoding performance by adjusting the magnitude of an LLR calculated through the row processing based on the correction-type Min-Sum algorithm with subtraction of performing a calculation and an update of probability information with row processing and column processing on a received signal in batches of one 1 bit or two or more predetermined bits to substantially the same value as the magnitude of an LLR calculated according to the Sum-Product algorithm.

As mentioned above, the fundamental structure of the LDPC code decoding apparatus in accordance with this embodiment 9 is the same as that of above-mentioned embodiment 4 shown in FIG. 9. That is, the LDPC code decoding apparatus is provided with a received LLR calculating unit 2 which calculates a received LLR from received information and a decoding core unit 3, and carries out a decoding process of performing a calculation and an update of probability information with row processing and column processing on a received signal in batches of one 1 bit or two or more predetermined bits according to the correction-type Min-Sum algorithm with subtraction by means of the decoding core unit 3.

The decoding core unit 3 is provided with an intermediate-result holding unit 4, a row processing unit 5, a column processing unit 6, a control unit 7, and a decoded result judgment unit 8. The intermediate-result holding unit 4 holds intermediate results of the decoding processing carried out by the row processing unit 5 and column processing unit 6, as previously explained in above-mentioned embodiment 1. The row processing unit 5 carries out row processing according to the relation shown by the above-mentioned equation (1) and using the above-mentioned equation (22), and the column processing unit 6 carries out column processing using the above-mentioned equations (4) and (5), as in the case of step 1 of the above-mentioned Shuffled BP algorithm.

The control unit 7 performs control of decoding iterations, such as a setup of a maximum number of iterations. The decoded result judgment unit 8 calculates a decoded sequence which is a decoded result from a hard decision of a posterior value calculated by the column processing unit 6 using the above-mentioned equation (6), as in the case of step 1 of the above-mentioned Shuffled BP algorithm, and performs a parity check on the decoded result so as to judge whether or not the decoded result is correct from the condition shown by the above-mentioned equation (7).

The fundamental structure of the row processing unit 5 in accordance with this embodiment 9 is the same as that according to above-mentioned embodiment 6 shown in FIG. 15. That is, the row processing unit consists of a plurality of correction operation units 12 and a subtraction unit 14. Each correction operation unit 12 carries out a comparison between the absolute values of two inputted values, a calculation of the correction term, makes a correction on the basis of this correction term, and calculates a product of the corrected value and the signs (±) of the two values. The row processing unit 5 consists of a plurality of correction operation units 12 which are cascaded, and a correction operation unit 12 located at a lower stage inputs, as one of the two inputs thereof, a computed result of another correction operation unit 12 which is located immediately above the former correction operation unit. Each correction operation unit 12 carries out a process as follows.

When each correction operation unit 12 inputs the absolute values of two values a and b, it calculates $\delta=0.69-(||a|-|b||)>>2$ first ($\ln(2)\approx 0.69$). If then $|a|<|b|$, each correction operation unit outputs $\text{sign}(a)\times\text{sign}(b)\times(|a|-\delta)$. Unless $|a|<|b|$, each correction operation unit outputs $\text{sign}(a)\times\text{sign}(b)\times(|b|-\delta)$. $\text{sign}(a)$ shows the sign (±) of a. The row processing unit 5 inputs the LLRs of bits on which it performs the row processing from the intermediate-result holding unit 4, each of the plurality of correction operation units 12 carries out a comparison between the absolute values of two inputted values, makes a correction, and calculates a product of the corrected value and the signs (±) of the two values, and the plurality of correction operation units deliver the resultant value to the column processing unit 6.

The subtraction unit 14 divides the operation result of the above-mentioned plurality of correction operation units 12 by the constant β (i.e., the offset factor). That is, the subtraction unit 14 calculates (c−β) from the input value c, and outputs it. Thus, in the row processing unit 5, the plurality of correction operation units 12 input the LLRs of bits on which the row processing unit performs the row processing from the intermediate-result holding unit 4, each of them carries out a comparison between the absolute values of two inputted values, calculates a product of the corrected value and the signs (±) of the two values, and makes a correction using the correction term, and the subtraction unit 14 subtracts the constant β from the resultant value calculated by the plurality of correction operation units 12 and delivers the subtraction result to the column processing unit 6.

Thus, the LDPC code decoding apparatus in accordance with this embodiment 9 is based on the Shuffled BP algorithm of performing a calculation and an update of probability information with row processing and column processing on the received signal in batches of one 1 bit or two or more predetermined bits, and uses the above-mentioned equation (22) in each row processing.

Next, the operation of the LDPC code decoding apparatus in accordance with this embodiment of the present invention will be explained.

A flow of the fundamental operation of the LDPC code decoding apparatus in accordance with this embodiment 9 is the same as that shown in the flow chart of FIG. 3 in above-mentioned embodiment 1. Therefore, the operation of the LDPC code decoding apparatus will be explained with reference to FIG. 3.

First, the received LLR calculating unit 2 inputs received information (in step ST1), and calculates a received LLR from this received information (in step ST2). Next, in an initialization step (in step ST3), the received LLR calculating unit 2 sets the calculated received LLR to the intermediate-result holding unit 4 as an initial value $z_{m,n}^{(0)}(:=F_n)$. At this time, the control unit 7 initializes the number of iterations i of decoding to i=1.

Next, in step ST4, until the number of iterations changes from i=1 to i=the last decoding time (i.e., a maximum number of iterations $I_{max}$), an iterative decoding process of step 1 by means of the row processing unit 5 and column processing unit 6, and a decision process of step 2 according to the above-mentioned equation (7) by means of the decoded result judgment unit 8 are repeatedly carried out.

A decoding operation at the ith iteration will be explained as an example.

First, the row processing unit 5 performs the row processing on each row having an element of 1 which is included in the 1st to $N_g$th columns of the check matrix H ($=[H_{m,n}]$) of an LDPC code to be decoded according to the above-mentioned equation (22) at the time of g=1 in the above-mentioned equation (1), and delivers the processed result to the column processing unit 6. The column processing unit 6 similarly performs the column processing on each column having an element of 1 which is included in the 1st to $N_g$th columns of the check matrix H, and makes the intermediate-result holding unit 4 hold the processed result.

Next, the row processing unit 5 performs the row processing on each row having an element of 1 which is included in the $(N_g+1)$th to $2N_g$th columns of the check matrix H according to the above-mentioned equation (22) at the time of g=2 in the above-mentioned equation (1), and delivers the processed result to the column processing unit 6. The column processing unit 6 similarly performs the column processing on each column having an element of 1 which is included in the $(N_g+1)$th to $2N_g$th columns of the check matrix H, and makes the intermediate-result holding unit 4 hold the processed result.

Next, every time when the row processing unit and column processing unit carry out the row processing and column processing one after another at the time of g=3 or larger, the row processing unit 5 delivers the processed result to the column processing unit 6, and the column processing unit 6 makes the intermediate-result holding unit 4 hold the processed result.

Finally, the row processing unit 5 performs the row processing on each row having an element of 1 which is included in the $(N-N_g)$th to Nth columns of the check matrix H according to the above-mentioned equation (22) at the time of g=G in the above-mentioned equation (1), and delivers the processed result to the column processing unit 6. The column processing unit 6 similarly performs the column processing on each column having an element of 1 which is included in the (N−N$_g$)th to Nth columns of the check matrix H, and makes the intermediate-result holding unit 4 hold the processed result.

In the above-mentioned processing, the row processing unit 5 follows the above-mentioned equation (22), and, when performing the processing after g=1, the row processing unit 5 therefore performs the row processing on a column having an already-updated LLR at the ith iteration, not using the received LLR but using the updated LLR.

In step 2, the decoded result judgment unit 8 carries out a hard decision of a posterior value $z_n^{(i)}$ which is calculated by the column processing unit 6 at the ith iteration, determines a decoded result, and performs a parity check on the decoded result. At this time, if the result of the parity check indicates NG, the control unit 7 increments the number of iterations i by one, and then makes the row processing unit 5 and column processing unit 6 carry out the process of step 1. In contrast, if the condition shown by the above-mentioned equation (7) is satisfied, the control unit makes them shift to a process of step 3 which will be mentioned later.

Thus, the control unit 7 controls the row processing unit 5 and column processing unit 6 to repeat the processes of steps 1 and 2 which are based on the above-mentioned equation (8) until the result of the parity check indicates O.K. or the number of iterations reaches its maximum $I_{max}$ which is set up, as shown in the above-mentioned equation (7).

When the result of the parity check by the decoded result judgment unit 8 indicates O.K. or the number of iterations i set up by the control unit 7 reaches its maximum $I_{max}$, the control unit 7, in step 3 (in step ST5), makes the row processing unit 5 and column processing unit 6 end their decoding processings, and the decoded result judgment unit 8 outputs a decoded sequence as shown by the above-mentioned equation (6) as a decoded result.

As mentioned above, the LDPC code decoding apparatus in accordance with this embodiment 9 performs a calculation and an update of probability information with row processing and column processing on a received signal in batches of one 1 bit or two or more predetermined bits, and carries out the row processing according to the correction-type Min-Sum algorithm with subtraction shown in above-mentioned embodiment 6. Therefore, the transmission of the probability information can be carried out more efficiently, and the rate of the convergence in the decoding operation can be improved and therefore the number of iterations can be reduced.

Furthermore, because this embodiment uses, as the fundamental algorithm, the correction-type Min-Sum algorithm with subtraction of making a correction on the received information according to an approximation of the Sum-Product algorithm, the calculation cost can be further reduced as compared with the case of using the prior art Shuffled BP algorithm and high decoding performance can be achieved.

Embodiment 10

A decoding apparatus according to this embodiment 10 decodes a received signal according to a decoding algorithm which does not have a fixed factor α (i.e., a normalization factor) for all rows of a check matrix, but has a factor $α_m$ (i.e., a normalization factor) which is determined for each row.

This embodiment 10 can be applied to all decoding algorithms each of which has a factor α (i.e., a normalization factor), including a general Normalized BP algorithm, the correction-type Min-Sum algorithm with division as shown in above-mentioned embodiment 5, and another decoding algorithm of performing a calculation and an update of probability information with row processing and column processing on a received signal in batches of one 1 bit or two or more predetermined bits according to either of those algorithms.

Hereafter, an LDPC code decoding apparatus which performs column processing on all the bits of an encoded signal after completing all row processings on the encoded signal at an arbitrary iteration of the iterative decoding, as in the case of using the prior art Min-Sum algorithm, and which applies a factor $α_m$ (i.e., a normalization factor) determined for each row to the Normalized BP algorithm will be mentioned as an example.

Although the LDPC code decoding apparatus in accordance with this embodiment 10 has fundamentally the same structure as that of the LDPC code decoding apparatus in accordance with above-mentioned embodiment 4 shown in FIG. 9, the structure and operation of a row processing unit 5 differ from those of the row processing unit 5 of embodiment 4 because it executes the Normalized BP algorithm using a factor $α_m$ (i.e., a normalization factor) for each row. To be more specific, the row processing unit 5 in accordance with this embodiment 10 performs an arithmetic operation according to the following equation (23), instead of the arithmetic operation according to the above-mentioned equation (12) which is used in the row processing of above-mentioned embodiment 4, on the above-mentioned equation (11). Parameters in the following equation (23) are the same as those shown in the above-mentioned embodiment 4, and symbols in the equation are the same as those as mentioned above. The factor $α_m$ shows the normalization factor in the mth row of the matrix.

[Equation 15]

$$\varepsilon_{m,n}^{(i)} = \frac{1}{α_m} \cdot \prod_{n' \in N(m)\backslash n} \mathrm{sign}(z_{m,n'}^{(i-1)}) \cdot \min_{n' \in N(m)\backslash n}(|z_{m,n'}^{(i-1)}|) \quad (23)$$

Figure 17:
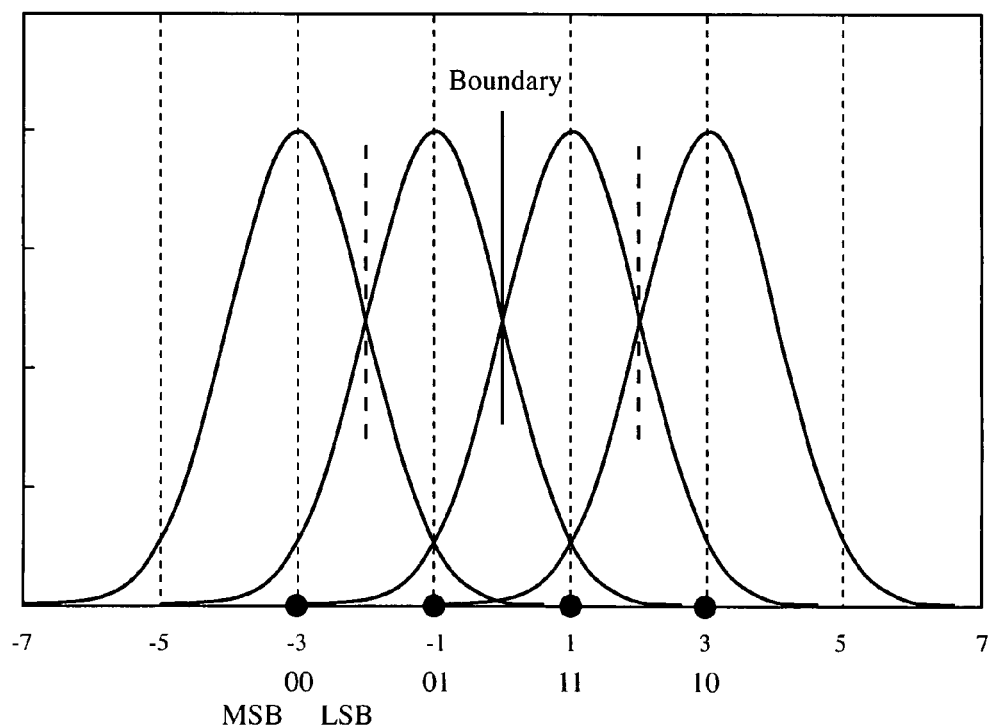
FIG. 17 is a graph showing a distribution of received values in 4PAM Gray Mapping.

FIG. 17 is a graph showing a distribution of received values in a case in which the modulation method is of 4PAM Gray Mapping type. In the figure, among 2-bit digital codes 00, 01, 11, and 10 which correspond to modulation signal points shown by symbols filled with in black, boundaries between 0 and 1 of their MSB (Most Significant Bit) values 0, 0, 1, and 1 are only one point: 0 (i.e., a portion shown by a solid line in the figure), while boundaries between 0 and 1 of their LSB (Least Significant Bit) values 0, 1, 1, and 0 are two points: −2 and 2 (i.e., two portions shown by dashed lines in the figure). Therefore, it can be seen from the figure that a bit reverse occurs more easily in LSB.

Thus, there is a difference is in the bit error rate between MSB and LSB. $α_m$ shown by a ratio between an average of results of the row processing according to the Sum-Product algorithm and an average of results of the row processing according to the Min-Sum algorithm is dependent upon the error rate of bits having 1 in each row. As a result, in the case of the modulation method of 4PAM type, the factor $α_m$ is dependent upon the number of bits having 1 in each row which are MSBs, and the number of bits having 1 in each row which are LSBs.

Therefore, in accordance this embodiment, a value which corresponds to each row is prepared beforehand as $α_m$. Although the modulation method of 4PAM type is mentioned as an example, the same goes for a multi-level modulation method which causes a difference in the bit error rate among the bits of the received signal.

In a case in which the received signal is an irregular LDPC code, the row weight is not constant. For this reason, $\alpha_m$ which is the ratio between an average of results of the row processing according to the Sum-Product algorithm and an average of results of the row processing according to the Min-Sum algorithm is dependent upon the row weight. Therefore, in accordance with this embodiment, a value which corresponds to the row weight of each row is prepared as $\alpha_m$. $\alpha_m$ is calculated in advance using either a simulation or a density evolution method.

As mentioned above, the fundamental structure of the LDPC code decoding apparatus in accordance with this embodiment 10 is the same as that of above-mentioned embodiment 4 shown in FIG. 9. That is, the LDPC code decoding apparatus is provided with a received LLR calculating unit 2 which calculates a received LLR from received information and a decoding core unit 3, and carries out a decoding process of performing row processing and column processing on a received signal according to the Normalized BP algorithm using a factor $\alpha_m$ (i.e., a normalization factor) determined for each row by means of the decoding core unit 3.

The decoding core unit 3 is provided with an intermediate-result holding unit 4, a row processing unit 5, a column processing unit 6, a control unit 7, and a decoded result judgment unit 8. The intermediate-result holding unit 4 holds intermediate results of the decoding processing carried out by the row processing unit 5 and column processing unit 6, as previously explained in above-mentioned embodiment 1. The row processing unit 5 carries out row processing using the above-mentioned equation (23), and the column processing unit 6 carries out column processing using the above-mentioned equations (4) and (5) for the relation shown by the above-mentioned equation (16).

The control unit 7 performs control of decoding iterations, such as a setup of a maximum number of iterations. The decoded result judgment unit 8 calculates a decoded sequence which is a decoded result from a hard decision of a posterior value calculated by the column processing unit 6 using the above-mentioned equation (6), and performs a parity check on the decoded result so as to judge whether or not the decoded result is correct from the condition shown by the above-mentioned equation (7).

Figure 18:
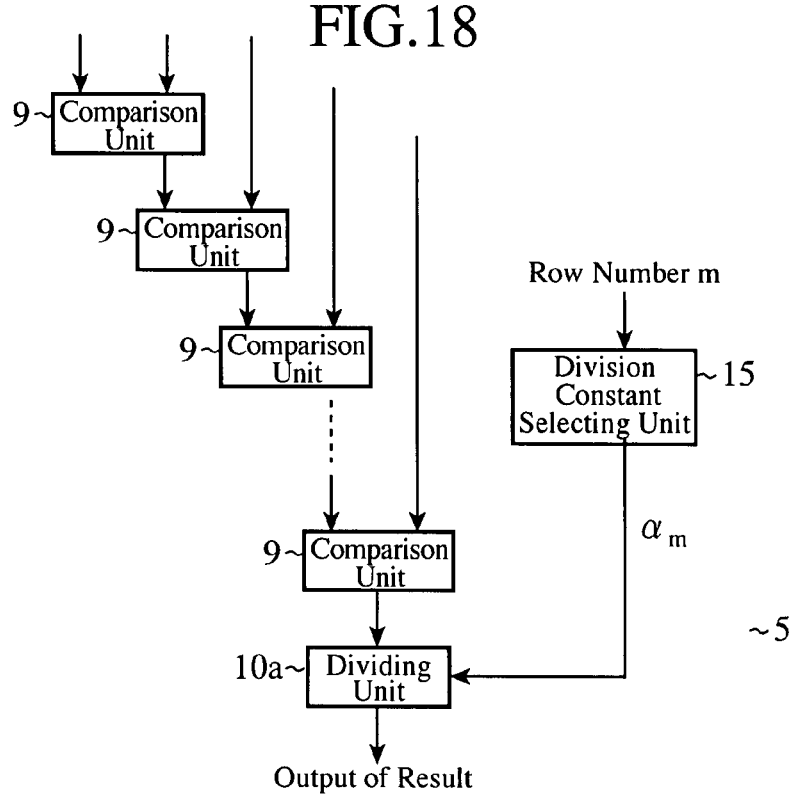
FIG. 18 is a block diagram showing the structure of a row processing unit of an LDPC code decoding apparatus in accordance with embodiment 10 of the present invention.

FIG. 18 is a block diagram showing the structure of the row processing unit of the LDPC code decoding apparatus in accordance with embodiment 10. The row processing unit 5 in accordance with this embodiment consists of a plurality of comparison units 9, a dividing unit 10a, and a division constant selecting unit 15. Each comparison unit 9 carries out a comparison between the absolute values of two inputted values, and calculates a product of a small one of them and the signs (±) of the two values, like that as shown in FIG. 2. The row processing unit 5 consists of a plurality of comparison units 9 which are cascaded. As shown in the figure, a comparison unit 9 located at a lower stage inputs, as one of two inputs thereof, a computed result of another comparison unit 9 which is located immediately above the former comparison unit. A process is carried out by each comparison unit 9 as follows.

When each comparison unit 9 inputs the absolute values of two values a and b, it outputs sign(a)×sign(b)×|a| if |a|<|b|. Unless |a|<|b|, each comparison unit 9 outputs sign(a)×sign(b)×|b|. sign(a) shows the sign (±) of a.

The dividing unit 10a divides the result of the operations of the above-mentioned plurality of comparison units 9 by the constant $\alpha_m$ (i.e., the normalization factor) from the division constant selecting unit 15. That is, the dividing unit 10a calculates $c/\alpha_m$ from the input value c and outputs it. Thus, in the row processing unit 5, the plurality of comparison units 9 input the LLRs of bits on which the row processing unit performs the row processing from the intermediate-result holding unit 4, each of the plurality of comparison units carries out a comparison between the absolute values of two inputted values, and calculates a product of a smaller one of the two values and the signs (±) of them, and the dividing unit 10a divides the resultant value calculated by the plurality of comparison units 9 by the constant $\alpha_m$, and then delivers the division result to the column processing unit 6.

The division constant selecting unit 15 stores values of $\alpha_m$ for each row beforehand, receives information on the communication path and the code construction from a control unit 7, inputs the number m of a row to be processed which is included in this information, determines $\alpha_m$ for each row, and delivers it to the dividing unit 10a.

Thus, the row processing unit 5 according to this embodiment 10 input the LLRs of bits on which the row processing unit performs the row processing from the intermediate-result holding unit 4, each of the comparison units 9 carries out a comparison between the absolute values of two inputted values, and calculates a product of a smaller one of the two values and the signs (±) of them, and the dividing unit 10a divides the value calculated by the plurality of comparison units 9 by the constant $\alpha_m$ selected by the division constant selecting unit 15, and then delivers the division result to the column processing unit 6.

Next, the operation of the decoding apparatus in accordance with this embodiment of the present invention will be explained.

A flow of the fundamental operation of the LDPC code decoding apparatus in accordance with this embodiment 10 is the same as that shown in the flow chart of FIG. 11 in above-mentioned embodiment 4. Therefore, the operation of the LDPC code decoding apparatus will be explained with reference to FIG. 11.

First, the received LLR calculating unit 2 inputs received information (in step ST1), and calculates a received LLR from this received information (in step ST2). Next, in an initialization step (in step ST3), the received LLR calculating unit 2 sets the calculated received LLR to the intermediate-result holding unit 4 as an initial value $z_{m,n}^{(0)}(:=F_n)$. At this time, the control unit 7 initializes the number of iterations i of decoding to i=1, and delivers information about the modulation method and the row weight to the division constant selecting unit 15. The division constant selecting unit 15 determines $\alpha_m$ for each row on the basis of this information, and delivers it to the dividing unit 10a.

Next, in step ST4a, until the number of iterations changes from i=1 to i=the last decoding time (i.e., a maximum number of iterations $I_{max}$), an iterative decoding process of step 1 by means of the row processing unit 5 and column processing unit 6, and a decision process of step 2 according to the above-mentioned equation (7) by means of the decoded result judgment unit 8 are repeatedly carried out.

A decoding operation at the ith iteration will be explained as an example.

First, in step 1, the row processing unit 5 performs the row processing on the check matrix H $(=[H_{m,n}])$ of an LDP code to be decoded in the decoding operation at the ith iteration. To be more specific, the row processing unit performs the row processing on each row having an element of 1 which is included in the 1st to Nth columns of the check matrix H according to the relation shown by the above-mentioned equation (11) and using the above-mentioned equation (23), and makes the intermediate-result holding unit 4 hold the processed result.

When the row processing unit 5, in step 1, completes the row processing, the column processing unit 6 performs the column processing on the check matrix H of the LDPC code to be decoded in the decoding operation at the ith iteration. To be more specific, the column processing unit 6 performs the column processing on each column which is included in the first to Nth columns of the check matrix H according to the relation shown by the above-mentioned equation (16), and makes the intermediate-result holding unit 4 hold the processed result.

In step 2, the decoded result judgment unit 8 carries out a hard decision of a posterior value $z_n^{(i)}$ which is calculated by the column processing unit 6 at the ith iteration, determines a decoded result, and performs a parity check on the decoded result.

At this time, if the result of the parity check indicates NG, the control unit 7 increments the number of iterations i by one, and then makes the row processing unit 5 and column processing unit 6 carry out the process of step 1. In contrast, if the condition shown by the above-mentioned equation (7) is satisfied, the control unit make them shift to a process of step 3 which will be mentioned later.

Thus, the control unit 7 controls the row processing unit 5 and column processing unit 6 to repeat the processes of step 1 until the result of the parity check indicates O.K. or the number of iterations reaches its maximum $I_{max}$ which is set up, as shown in the above-mentioned equation (7).

When the result of the parity check by the decoded result judgment unit 8 indicates O.K. or the number of iterations i set up by the control unit 7 reaches its maximum $I_{max}$, the control unit 7, in step 3 (in step ST5), makes the row processing unit 5 and column processing unit 6 end their decoding processings, and the decoded result judgment unit 8 outputs a decoded sequence as shown by the above-mentioned equation (6) as a decoded result.

As mentioned above, because the decoding apparatus according to this embodiment 10 sets up a normalization factor based on the Normalized BP algorithm for each row according to the modulation method and the code construction, in a case in which, for example, the input code is multi-level modulated or is an irregular LDPC code, the decoding apparatus can make the probability information propagated approach that acquired according to the Sum-Product algorithm, and can further improve the decoding performance, as compared with the case of using the prior art Normalized BP algorithm.

In above-mentioned embodiment 10, the LDPC code decoding apparatus which performs column processing on all the bits of the encoded signal after completing all row processings on the encoded signal at an arbitrary iteration of the iterative decoding, and which applies a factor $\alpha_m$ (i.e., a normalization factor) determined for each row to the Normalized BP algorithm is mentioned above as an example. As an alternative, the LDPC code decoding apparatus can be so constructed as to apply a factor $\alpha_m$ which is determined for each row to another decoding algorithm, like the correction-type Min-Sum algorithm with division as shown in above-mentioned embodiment 5, or another decoding algorithm of performing a calculation and an update of probability information with row processing and column processing on a received signal in batches of one 1 bit or two or more predetermined bits according to either of those algorithms.

Embodiment 11

A decoding apparatus according to this embodiment 11 decodes a received signal according to a decoding algorithm which does not have a fixed factor β (i.e., an offset factor) for any of all rows of a check matrix, but has a factor $\beta_m$ (i.e., an offset factor) which is determined for each row.

This embodiment 11 can be applied to all decoding algorithms each of which has a factor β (i.e., an offset factor), including a general Offset BP algorithm, the correction-type Min-Sum algorithm with subtraction as shown in above-mentioned embodiment 6, and another decoding algorithm of performing a calculation and an update of probability information with row processing and column processing on a received signal in batches of one 1 bit or two or more predetermined bits according to either of those algorithms.

Hereafter, an LDPC code decoding apparatus which performs column processing on all the bits of an encoded signal after completing all row processings on the encoded signal at an arbitrary iteration of the iterative decoding, as in the case of using the prior art Min-Sum algorithm, and which applies a factor $\beta_m$ (i.e., an offset factor) determined for each row to the Offset BP algorithm will be mentioned as an example.

Although the LDPC code decoding apparatus in accordance with this embodiment 11 has fundamentally the same structure as that of the LDPC code decoding apparatus in accordance with above-mentioned embodiment 4 shown in FIG. 9, the structure and operation of a row processing unit 5 differ from those of the row processing unit 5 of embodiment 4 because it executes the Offset BP algorithm using a factor $\beta_m$ (i.e., an offset factor) for each row. To be more specific, the row processing unit 5 in accordance with this embodiment 11 performs an arithmetic operation according to the following equation (24), instead of the arithmetic operation according to the above-mentioned equation (12) which is used in the row processing of above-mentioned embodiment 4, on the above-mentioned equation (11). Parameters in the following equation (24) are the same as those shown in the above-mentioned embodiment 4, and symbols in the equation are the same as those as mentioned above. The factor $\beta_m$ shows the offset factor in the mth row of the matrix.

[Equation 16]

$$\varepsilon_{m,n}^{(i)} = \text{sign}(p) \cdot \text{MAX}(|p| - \beta_m, 0) \quad (24)$$

$$p = \prod_{n' \in N(m) \backslash n} \text{sign}(z_{m,n'}^{(i-1)}) \cdot \min_{n' \in N(m) \backslash n} (|z_{m,n'}^{(i-1)}|)$$

For example, in a case in which the modulation method is of 4PAM Gray Mapping type, the received values have a distribution as shown in FIG. 17, as mentioned above, and there is a difference is in the bit error rate between MSB and LSB. $\beta_m$ shown by a ratio between an average of results of the row processing according to the Sum-Product algorithm and an average of results of the row processing according to the Min-Sum algorithm is dependent upon the error rate of bits having 1 in each row. As a result, in the case of the modulation method of 4PAM type, the factor $\beta_m$ is dependent upon the number of bits having 1 in each row which are MSBs, and the number of bits having 1 in each row which are LSBs.

Therefore, in accordance this embodiment, a value which corresponds to each row is prepared beforehand as $\beta_m$. Although the modulation method of 4PAM type is mentioned as an example, the same goes for a multi-level modulation method which causes a difference in the bit error rate among the bits of the received signal.

In a case in which the received signal is an irregular LDPC code, the row weight is not constant. For this reason, $\beta_m$ which is the ratio between an average of results of the row processing according to the Sum-Product algorithm and an average of results of the row processing according to the Min-Sum algorithm is dependent upon the row weight. Therefore, in accordance with this embodiment, a value which corresponds to the row weight of each row is prepared as $\beta_m$. $\beta_m$ is calculated in advance using either a simulation or a density evolution method.

As mentioned above, the fundamental structure of the LDPC code decoding apparatus in accordance with this embodiment 11 is the same as that of above-mentioned embodiment 4 shown in FIG. 9. That is, the LDPC code decoding apparatus is provided with a received LLR calculating unit 2 which calculates a received LLR from received information and a decoding core unit 3, and carries out a decoding process of performing row processing and column processing on a received signal according to the Offset BP algorithm using a factor $\beta_m$ (i.e., an offset factor) determined for each row by means of the decoding core unit 3.

The decoding core unit 3 is provided with an intermediate-result holding unit 4, a row processing unit 5, a column processing unit 6, a control unit 7, and a decoded result judgment unit 8. The intermediate-result holding unit 4 holds intermediate results of the decoding processing carried out by the row processing unit 5 and column processing unit 6, as previously explained in above-mentioned embodiment 1. The row processing unit 5 carries out row processing using the above-mentioned equation (24), and the column processing unit 6 carries out column processing using the above-mentioned equations (4) and (5) for the relation shown by the above-mentioned equation (16).

The control unit 7 performs control of decoding iterations, such as a setup of a maximum number of iterations. The decoded result judgment unit 8 calculates a decoded sequence which is a decoded result from a hard decision of a posterior value calculated by the column processing unit 6 using the above-mentioned equation (6), and performs a parity check on the decoded result so as to judge whether or not the decoded result is correct from the condition shown by the above-mentioned equation (7).

Figure 19:
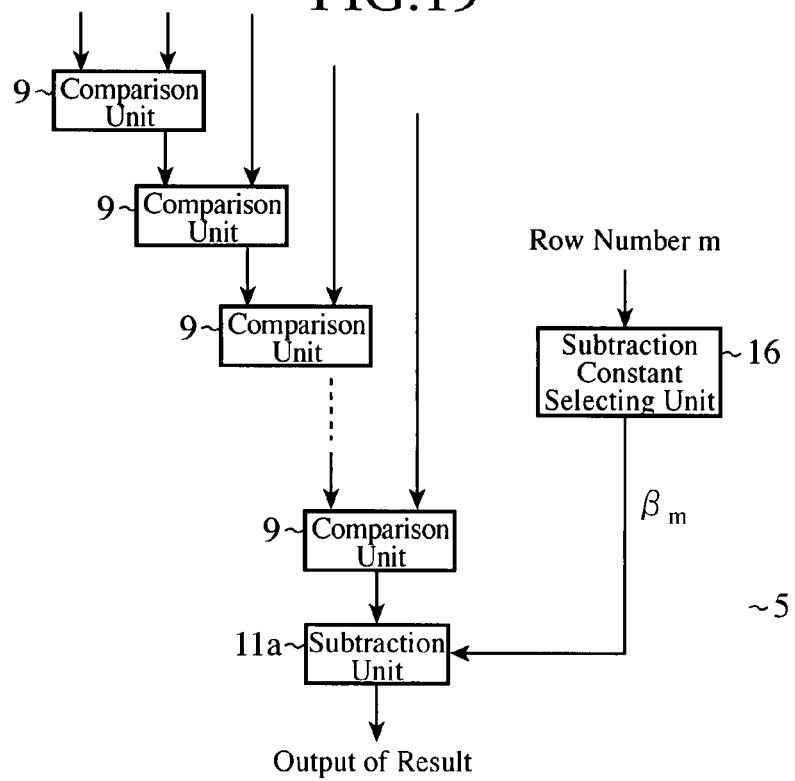
FIG. 19 is a block diagram showing the structure of a row processing unit of an LDPC code decoding apparatus in accordance with embodiment 11 of the present invention.

FIG. 19 is a block diagram showing the structure of the row processing unit of the LDPC code decoding apparatus in accordance with embodiment 11. The row processing unit 5 in accordance with this embodiment consists of a plurality of comparison units 9, a subtraction unit 11a, and a subtraction constant selecting unit 16. Each comparison unit 9 carries out a comparison between the absolute values of two inputted values, and calculates a product of a small one of them and the signs (±) of the two values, like that as shown in FIG. 2.

The row processing unit 5 consists of a plurality of comparison units 9 which are cascaded. As shown in the figure, a comparison unit 9 located at a lower stage inputs, as one of two inputs thereof, a computed result of another comparison unit 9 which is located immediately above the former comparison unit. A process is carried out by each comparison unit 9 as follows.

When each comparison unit 9 inputs the absolute values of two values a and b, it outputs sign(a)×sign(b)×|a| if |a|<|b|. Unless |a|<|b|, each comparison unit 9 outputs sign(a)×sign(b)×|b|. sign(a) shows the sign (±) of a.

The subtraction unit 11a subtracts the constant $\beta_m$ (i.e., the offset factor) from the subtraction constant selecting unit 16 from the result of the operations by the above-mentioned plurality of comparison units 9. That is, the subtraction unit 11a calculates $c-\beta_m$ from the input value c, and outputs it. Thus, in the row processing unit 5, the plurality of comparison units 9 input the LLRs of bits on which the row processing unit performs the row processing from the intermediate-result holding unit 4, each of the comparison units carries out a comparison between the absolute values of two inputted values, and calculates a product of a smaller one of the two values and the signs (±) of them, and the subtraction unit 11a subtracts the constant $\beta_m$ from the resultant value calculated by the plurality of comparison units 9, and then delivers the subtraction result to the column processing unit 6.

The subtraction constant selecting unit 16 stores values of $\beta_m$ for each row beforehand, receives information on the communication path and the code construction from the control unit 7, inputs the number m of a row to be processed which is included in this information, determines $\beta_m$ for the row, and delivers it to the subtraction unit 11a.

Thus, the row processing unit 5 according to this embodiment 11 input the LLRs of bits on which the row processing unit performs the row processing from the intermediate-result holding unit 4, each of the plurality of comparison units 9 carries out a comparison between the absolute values of two inputted values, and calculates a product of a smaller one of the two values and the signs (±) of them, and the subtraction unit 11a subtracts the constant $\beta_m$ selected by the subtraction constant selecting unit 16 from the resultant value calculated by the plurality of comparison units 9, and then delivers the subtraction result to the column processing unit 6.

Next, the operation of the decoding apparatus in accordance with this embodiment of the present invention will be explained.

A flow of the fundamental operation of the LDPC code decoding apparatus in accordance with this embodiment 11 is the same as that shown in the flow chart of FIG. 11 in above-mentioned embodiment 4. Therefore, the operation of the LDPC code decoding apparatus will be explained with reference to FIG. 11.

First, the received LLR calculating unit 2 inputs received information (in step ST1), and calculates a received LLR from this received information (in step ST2). Next, in an initialization step (in step ST3), the received LLR calculating unit 2 sets the calculated received LLR to the intermediate-result holding unit 4 as an initial value $z_{m,n}^{(0)}(:=F_n)$. At this time, the control unit 7 initializes the number of iterations i of decoding to i=1, and delivers information about the modulation method and the row weight to the subtraction constant selecting unit 16. The subtraction constant selecting unit 16 determines $\beta_m$ for each row on the basis of this information, and delivers it to the subtraction unit 11a.

Next, in step ST4a, until the number of iterations changes from i=1 to i=the last decoding time (i.e., a maximum number of iterations $I_{max}$), an iterative decoding process of step 1 by means of the row processing unit 5 and column processing unit 6, and a decision process of step 2 according to the above-mentioned equation (7) by means of the decoded result judgment unit 8 are repeatedly carried out.

A decoding operation at the ith iteration will be explained as an example.

First, in step 1, the row processing unit 5 performs the row processing on the check matrix H (=[$H_{m,n}$]) of an LDP code to be decoded in the decoding operation at the ith iteration. To be more specific, the row processing unit performs the row processing on each row having an element of 1 which is included in the 1st to Nth columns of the check matrix H according to the relation shown by the above-mentioned equation (11) and using the above-mentioned equation (24), and makes the intermediate-result holding unit 4 hold the processed result.

When the row processing unit 5, in step 1, completes the row processing, the column processing unit 6 performs the column processing on the check matrix H of the LDPC code to be decoded in the decoding operation at the ith iteration. To be more specific, the column processing unit 6 performs the column processing on each column which is included in the 1st to Nth columns of the check matrix H according to the relation shown by the above-mentioned equation (16), and makes the intermediate-result holding unit 4 hold the processed result.

In step 2, the decoded result judgment unit 8 carries out a hard decision of a posterior value $z_n^{(i)}$ which is calculated by the column processing unit 6 at the ith iteration, determines a decoded result, and performs a parity check on the decoded result. At this time, if the result of the parity check indicates NG, the control unit 7 increments the number of iterations i by one, and then makes the row processing unit and column processing unit 6 carry out the process of step 1. In contrast, if the condition shown by the above-mentioned equation (7) is satisfied, the control unit make them shift to a process of step 3 which will be mentioned later.

Thus, the control unit 7 controls the row processing unit 5 and column processing unit 6 to repeat the process of step 1 until the result of the parity check indicates O.K. or the number of iterations reaches its maximum $I_{max}$ which is set up, as shown in the above-mentioned equation (7).

When the result of the parity check by the decoded result judgment unit 8 indicates O.K. or the number of iterations i set up by the control unit 7 reaches its maximum $I_{max}$, the control unit 7, in step 3 (in step ST5), makes the row processing unit 5 and column processing unit 6 end their decoding processings, and the decoded result judgment unit 8 outputs a decoded sequence as shown by the above-mentioned equation (6) as a decoded result.

As mentioned above, because the decoding apparatus according to this embodiment 11 sets up an offset factor based on the Offset BP algorithm for each row according to the modulation method and the code construction, in a case in which, for example, the input code is multi-level modulated or is an irregular LDPC code, the decoding apparatus can make the probability information propagated approach that acquired according to the Sum-Product algorithm, and can further improve the decoding performance as compared with the case of using the prior art Offset BP algorithm.

In above-mentioned embodiment 11, the LDPC code decoding apparatus which performs column processing on all the bits of the encoded signal after completing all row processings on the encoded signal at an arbitrary iteration of the iterative decoding, and which applies a factor $\beta_m$ (i.e., an offset factor) determined for each row to the Offset BP algorithm is mentioned above as an example. As an alternative, the LDPC code decoding apparatus can be so constructed as to apply a factor $\beta_m$ which is determined for each row to another decoding algorithm, like the correction-type Min-Sum algorithm with subtraction as shown in above-mentioned embodiment 6, or another decoding algorithm of performing a calculation and an update of probability information with row processing and column processing on a received signal in batches of one 1 bit or two or more predetermined bits according to either of those algorithms.

Embodiment 12

Figure 20:
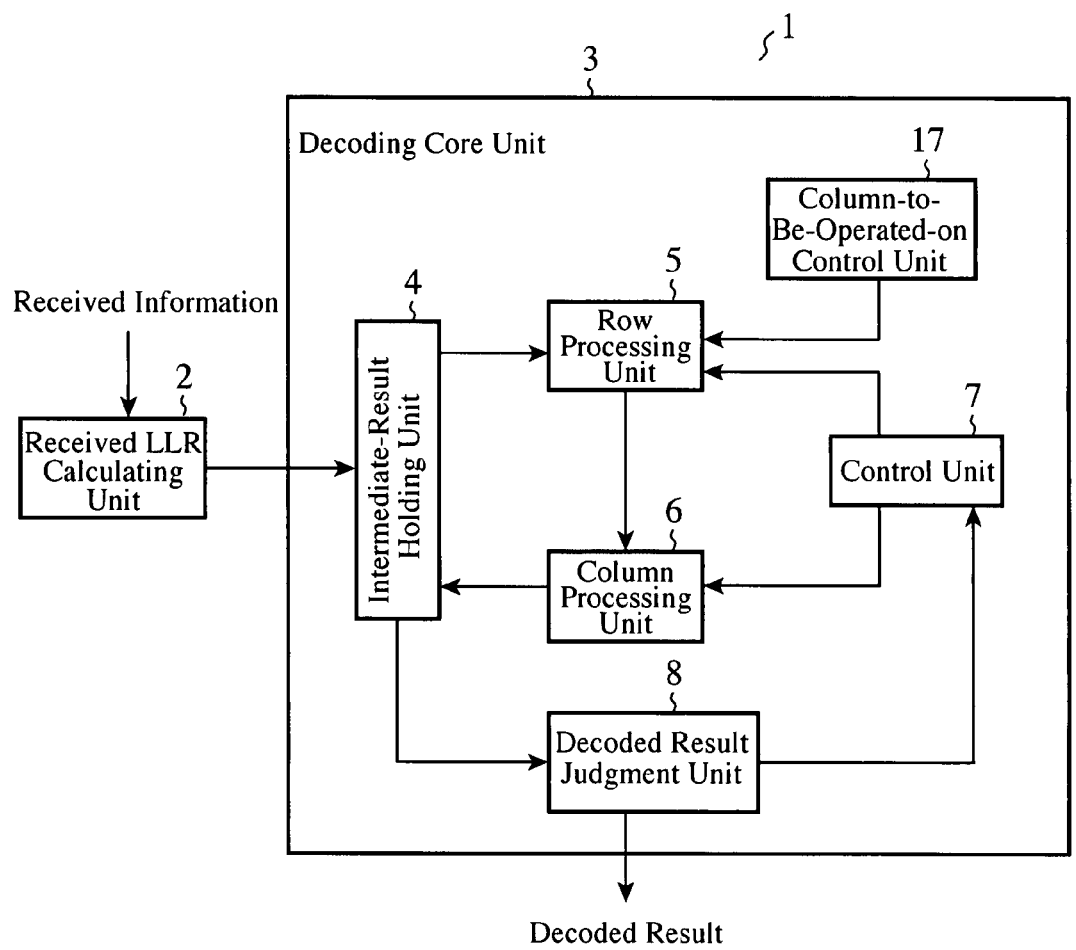
FIG. 20 is a block diagram showing the structure of an LDPC code decoding apparatus in accordance with embodiment 12 of the present invention.

FIG. 20 is a block diagram showing the structure of an LDPC code decoding apparatus in accordance with embodiment 12 of the present invention. The LDPC code decoding apparatus 1 in accordance with this embodiment 12 is provided with a received LLR calculating unit 2 and a decoding core unit 3, like that according to above-mentioned embodiment 1 shown in FIG. 1. The LDPC code decoding apparatus in accordance with this embodiment differs from that according to above-mentioned embodiment 1 in that it has a column-to-be-operated-on control unit 17. The column-to-be-operated-on control unit 17 determines columns on which a row processing unit 5 and a column processing unit 6 perform arithmetic operations on the basis of a group division, and controls decoding processing which is based on the group division.

The LDPC code decoding apparatus in accordance with the embodiment 12 performs a calculation and an update of probability information with row processing and column processing on a received signal in batches of two or more predetermined bits, as in the case of using the prior art Group Shuffled BP algorithm, and divides the received code into some groups each of which is a combination of two or more bits on the basis of the construction of the code.

Hereafter, the group division on the basis of the code construction according to this embodiment will be explained.

First, the reason why a decoding algorithm of carrying out a calculation and an update of probability information with row processing and column processing in batches of 1 bit brings the decoding to completion with a smaller number of iterations than with that in the case of using another algorithm of not carrying out a calculation and an update of probability information with row processing and column processing in batches of 1 bit is because the calculated probability information is immediately updated, and the propagation of the probability information is efficiently carried out by using the updated probability information for the next decoding operation with the same number of iterations.

Although the same goes for a case of using the Group Shuffled BP algorithm of carrying out a calculation and an update of probability information with row processing and column processing in batches of two or more bits, in accordance with the prior art Group Shuffled BP algorithm, if columns included in the same group have 1 in the same row, they are processed using probability information which has not been updated.

The decoding apparatus in accordance with this embodiment divides the received signal into some groups each of which is a combination of two or more bits so that columns included in each identical group do not have 1 in the same row according to a decoding algorithm of carrying out a calculation and an update of probability information with row processing and column processing on the received signal in batches of two or more bits, like the Group Shuffled BP algorithm. As a result, the decoding apparatus can carry out the propagation of the probability information more efficiently and can also reduce the number of iterations, as compared with a case in which columns included in each same group have 1 in the same row.

Figures 21, 22:
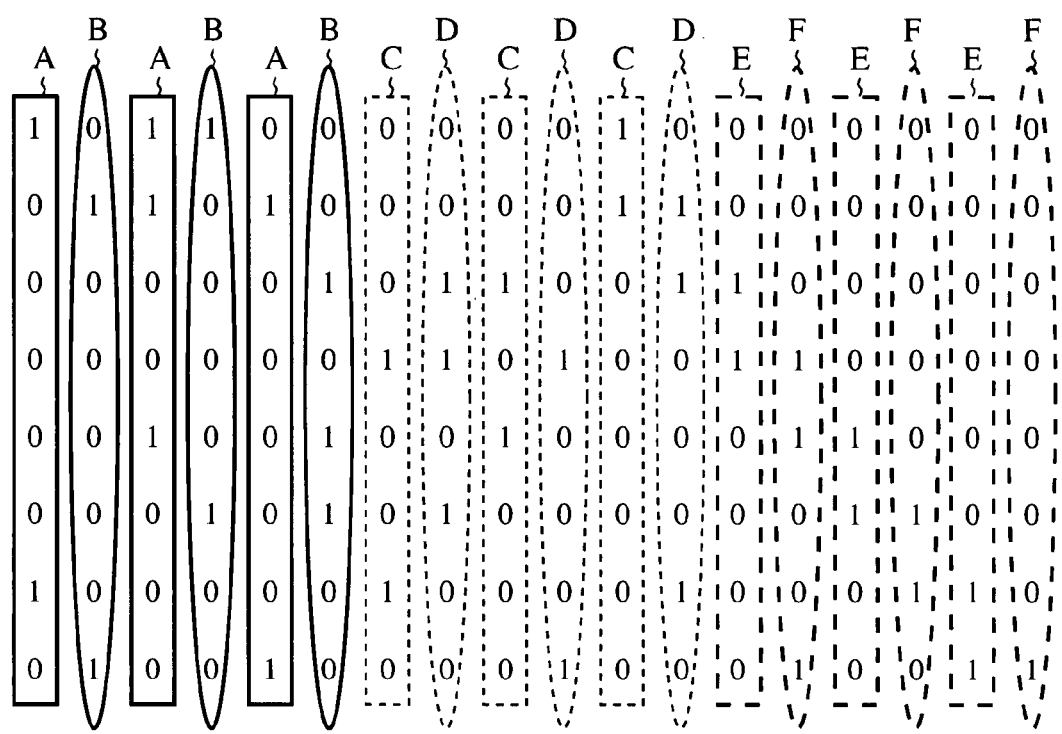
FIG. 21 is a diagram showing an example of the construction of an LDPC coded matrix.
FIG. 22 is a diagram showing an example of a group division of an LDPC code matrix in the LDPC code decoding apparatus in accordance with embodiment 12.

FIG. 21 is a figure showing the structure of an example of an LDPC coded matrix. In the LDPC coded matrix shown in this figure, elements in an upper-right portion in the matrix which is enclosed by a triangle are all zero. FIG. 22 is a diagram showing an example of the group division of the LDPC code matrix in the LDPC code decoding apparatus in accordance with embodiment 12. In the LDPC matrix as shown in FIG. 21, the coded matrix can be used in common with a decoded matrix, and there are many practical advantages.

When carrying out a group division of such a matrix coded with an LDPC code, and then carrying out a calculation and an update of probability information with row processing and column processing on the received signal in batches of two or more bits, the decoding apparatus carries out the group division so that the parity bit portion of the matrix does not run in a line, as shown in FIG. 22. In the example of FIG. 22, the decoding apparatus carries out the group division of the LDPC matrix for every other row so that the parity bit portion of the matrix does not run in a line. Reference symbols A, B, C, D, E, and F shown in the figure denote groups 1, 2, 3, 4, 5, and 6 which are the first to sixth groups, respectively.

The LDPC code decoding apparatus in accordance with this embodiment 12 executes the Group Shuffled BP algorithm of carrying out a group division of the LDPC coded matrix on the basis of the code construction, as shown in FIG. 22. Hereafter, the Group Shuffled BP algorithm will be explained briefly.

First, in an initialization step, the number of iterations i is set to i=1, a maximum number of iterations is expressed as $I_{max}$, and an initial value $z_{m,n}^{(0)}$ of a log-likelihood ratio LLR (Log Likelihood Ratio) is defined as $F_n(z_{m,n}^{(0)}:=F_n)$. The check matrix H of the LDPC code to be decoded is a binary m×n matrix $H=[H_{m,n}]$ (n is an integer equal to or larger than 0 and smaller than N, and m is an integer equal to or larger than 0 and smaller than M), and $H_{m,n}$ is an element in the mth row and nth column of the matrix H.

Next, in step 1, a row process of computing the above-mentioned equations (2) and (3) under the condition shown by the above-mentioned equation (25) is carried out. Here, N(m) and M(n) are subsets of the set [1,N], and they are defined as follows: $N(m):=\{n:H_{m,n}=1\}$ and $M(n):=\{m:H_{m,n}=1\}$. That is, N(m) means a set of column indices which have 1 in the mth row of the check matrix H, and M(n) means a set of column indices which have 1 in the mth row of the LDPC check matrix H.

[Equation 17]

$$1 \leq g \leq G \ (g: \text{Integer}, G=N/N_g)$$

$$n \in GR(g), m \in M(n) \quad (25)$$

In addition, a set which is acquired by removing an element a from a set A is expressed as A\a. In other words, N(m)\n shows a set of column indices in which the nth column is removed from the set N(m), and M(n)\m shows a set of row indices in which the mth row is removed from the set M(n). $z_{m,n}^{(i)}$ is an LLR which is updated at the ith iteration, and $\epsilon_{m,n}^{(i)}$ is an LLR at the ith iteration which is sent from a check node to a bit node.

Furthermore, in step 1, a column process of computing the above-mentioned equations (4) and (5) under the condition shown by the above-mentioned equation (25) is carried out. Here, $z_{m,n}^{(i)}$ is an LLR at the ith iteration, which is sent from the bit node to the check node. Furthermore, $z_n^{(i)}$ is a posterior value at the ith iteration.

Next, in step 2, a decoded result judgment unit carries out a hard decision of the posterior value $z_n^{(i)}$ and creates a decoded sequence shown by the above-mentioned equation (6). Then, if the conditions shown by the above-mentioned equation (7) are satisfied, the decoded result judgment unit shifts to a process of step 3 which will be mentioned later, whereas when neither of these two conditions is satisfied, the decoded result judgment unit increments the number of iterations i and returns to the process of step 2. In step 3, the decoded result judgment unit outputs the decoded sequence according to the above-mentioned equation (6) acquired in step 2 as a decoded result.

Note that each symbol follows the above-mentioned equations. GR(g) shows a combination of columns which construct the gth group. In the example shown in FIG. 22, GR(g) is shown concretely as follows.

In group 1 (GR (1)), 2k+1=1, 3, 5, 7, . . . , and $N_g-1$, and k is equal to or larger than 0 and smaller than $N_g$.

In group 2 (GR(2)), 2k+2=2, 4, 6, 8, . . . , and $N_g$, and k is equal to or larger than 0 and smaller than $N_g$.

In group 3 (GR (3)), 2k+1=$N_g$+1, $N_g$+3, $N_g$+5, . . . , and $2N_g-1$, and k is equal to or larger than Ng and smaller than $2N_g$.

In group G (GR (G)), 2k+2=G·$N_g$−$2N_g$+2, . . . , and G·$N_g$, and k is equal to or larger than $(G/2-1) \cdot N_g$ and smaller than $G \cdot N_g$.

As mentioned above, the LDPC code decoding apparatus in accordance with this embodiment 12 has the same fundamental structure of as that of above-mentioned embodiment 1 shown in FIG. 1, with the exception that it has the column-to-be-operated-on control unit 17. That is, the LDPC code decoding apparatus is provided with a received LLR calculating unit 2 which calculates a received LLR from received information and a decoding core unit 3, and carries out decoding of an LDPC code according to the Group Shuffled BP algorithm of carrying out a group division for every bit by means of the decoding core unit 3.

The decoding core unit 3 is provided with an intermediate-result holding unit 4, the row processing unit 5, the column processing unit 6, a control unit 7, the decoded result judgment unit 8, and the column-to-be-operated-on control unit 17. The intermediate-result holding unit 4 holds intermediate results of the decoding processing carried out by the row processing unit 5 and column processing unit 6, as previously explained in above-mentioned embodiment 1. The row processing unit 5 carries out row processing using the above-mentioned equations (2) and (3) under the condition shown by the above-mentioned equation (25), and the column processing unit 6 carries out column processing using the above-mentioned equations (4) and (5) under the condition shown by the above-mentioned equation (25).

The control unit 7 performs control of decoding iterations, such as a setup of a maximum number of iterations. The decoded result judgment unit 8 calculates a decoded sequence which is a decoded result from a hard decision of a posterior value calculated by the column processing unit 6 using the above-mentioned equation (6), as in the case of step 1 of the above-mentioned Group Shuffled BP algorithm, and performs a parity check on the decoded result so as to judge whether or not the decoded result is correct from the condition shown by the above-mentioned equation (7). As mentioned above, the column-to-be-operated-on control unit 17 carries out the group division of the LDPC coded matrix, and controls the columns on which the row processing unit 5 and column processing unit 6 perform arithmetic operations.

Next, the operation of the decoding apparatus in accordance with this embodiment of the present invention will be explained.

Figure 23:
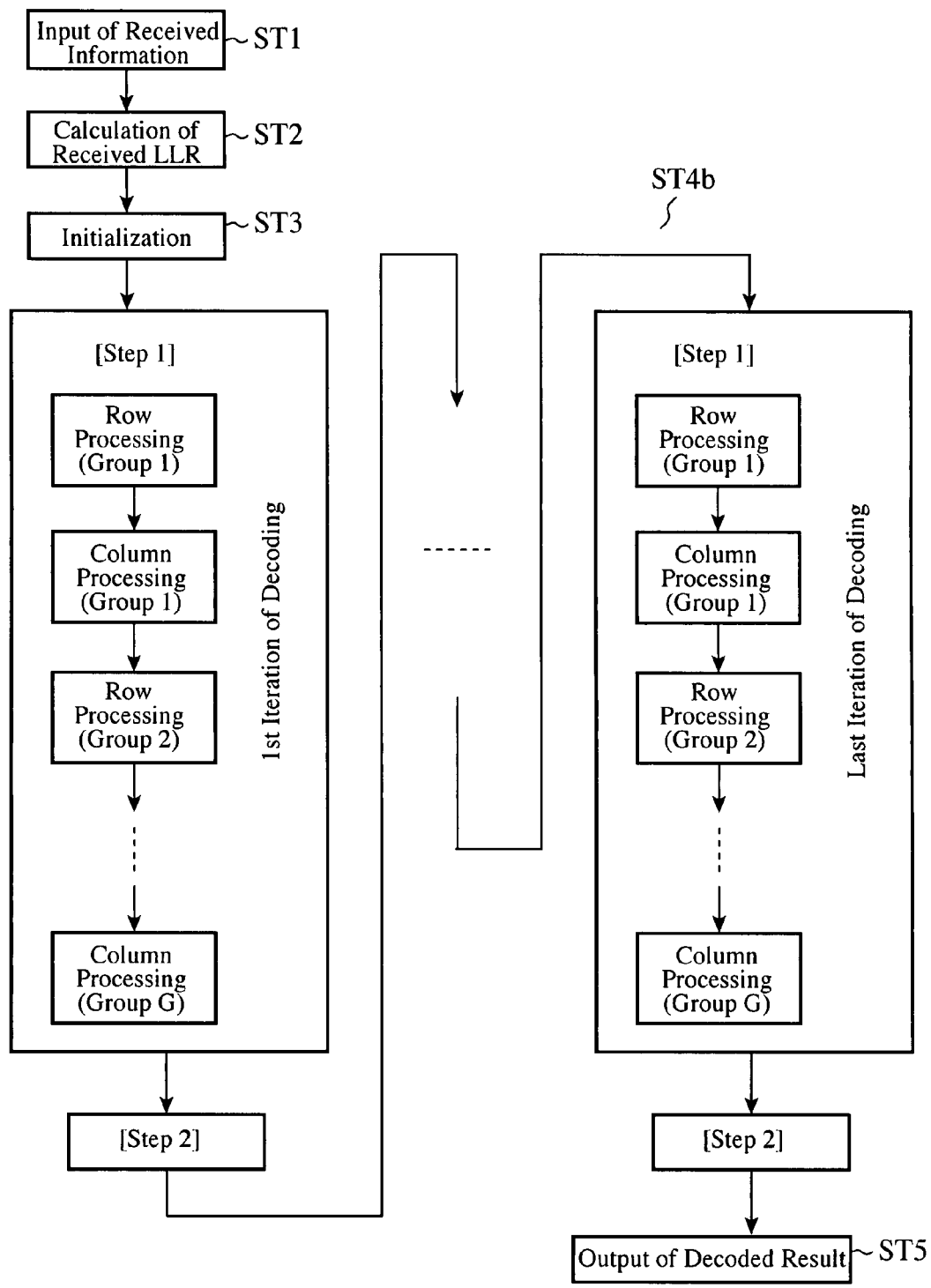
FIG. 23 is a flow chart showing the operation of the LDPC code decoding apparatus in accordance with embodiment 12.

FIG. 23 is a flow chart showing the operation of the LDPC code decoding apparatus in accordance with embodiment 12, and a decoding operation using the coded matrix as shown in FIG. 22 will be explained, as an example, with reference to FIG. 23.

First, the received LLR calculating unit 2 inputs received information (in step ST1), and calculates a received LLR from this received information (in step ST2). Next, in an initialization step (in step ST3), the received LLR calculating unit 2 sets the calculated received LLR to the intermediate-result holding unit 4 as an initial value $z_{m,n}^{(0)}(:=F_n)$. At this time, the control unit 7 initializes the number of iterations i of decoding to i=1.

Next, in step ST4b, until the number of iterations changes from i=1 to i=the last decoding time (i.e., a maximum number of iterations $I_{max}$), an iterative decoding process of step 1 by means of the row processing unit 5 and column processing unit 6 and a decision process of step 2 according to the above-mentioned equation (7) by means of the decoded result judgment unit 8 are repeatedly carried out for each group which corresponds to every row specified by the column-to-be-operated-on control unit 17.

A decoding operation at the ith iteration will be explained as an example.

First, for the check matrix H of the LDPC code to be decoded (=[$H_{m,n}$]), as shown in FIG. 22, the column-to-be-operated-on control unit 17 delivers the numbers of all columns included in group 1 to which the symbol A is attached in the figure to the row processing unit 5 and column processing unit 6. As a result, the row processing unit 5 performs the row processing on each row which has 1 in a column included in group 1, and delivers the processed result to the column processing unit 6. On the other hand, the column processing unit 6 performs the column processing on each column included in group 1, and makes the intermediate-result holding unit 4 hold the processed result.

The column-to-be-operated-on control unit 17 then delivers the numbers of all columns included in group 2 to which the symbol B is attached in the figure to the row processing unit 5 and column processing unit 6. As a result, the row processing unit 5 performs the row processing on each row which has 1 in a column included in group 2, and delivers the processed result to the column processing unit 6. On the other hand, the column processing unit 6 performs the column processing on each column included in group 2, and makes the intermediate-result holding unit 4 hold the processed result.

After that, every time when the column-to-be-operated-on control unit 17 delivers the number of all columns included in each group which is specified by g=3 or larger in the above-mentioned equation (25) to the row processing unit 5 and column processing unit 6 one after another, the row processing unit 5 delivers the processed result to the column processing unit 6, and the column processing unit 6 makes the intermediate-result holding unit 4 hold the processed result.

Finally, the column-to-be-operated-on control unit 17 delivers the numbers of all columns included in group g to the row processing unit 5 and column processing unit 6. As a result, the row processing unit 5 performs the row processing on each row which has 1 in a column included in group g, and delivers the processed result to the column processing unit 6. On the other hand, the column processing unit 6 performs the column processing on each column included in group g, and makes the intermediate-result holding unit 4 hold the processed result.

In the example of FIG. 22, the column-to-be-operated-on control unit 17 delivers the numbers of all columns included in group 6 to which the symbol F is attached in the figure to the row processing unit 5 and column processing unit 6. As a result, the row processing unit 5 performs the row processing on each row which has 1 in a column included in group 2, and delivers the processed result to the column processing unit 6. On the other hand, the column processing unit 6 performs the column processing on each column included in group 6, and makes the intermediate-result holding unit 4 hold the processed result.

In the above-mentioned processing, the row processing unit 5 performs the operations shown in the above-mentioned equations (2) and (3) for the relation shown in the above-mentioned equation (22), and, when performing the processing after g=1, the row processing unit 5 therefore performs the row processing on a column having an already-updated LLR at the ith iteration, not using the received LLR but using the updated LLR.

In step 2, the decoded result judgment unit 8 carries out a hard decision of a posterior value $z_n^{(i)}$ which is calculated by the column processing unit 6 at the ith iteration, determines a decoded result, and performs a parity check on the decoded result. At this time, if the result of the parity check indicates NG, the control unit 7 increments the number of iterations i by one, and then makes the row processing unit 5 and column processing unit 6 carry out the process of step 1. In contrast, if the condition shown by the above-mentioned equation (7) is satisfied, the control unit make them shift to a process of step 3 which will be mentioned later.

Thus, the control unit 7 controls the row processing unit 5 and column processing unit 6 to repeat the process of step 1 until the result of the parity check indicates O.K. or the number of iterations reaches its maximum $I_{max}$ which is set up, as shown in the above-mentioned equation (7).

When the result of the parity check by the decoded result judgment unit 8 indicates O.K. or the number of iterations i set up by the control unit 7 reaches its maximum $I_{max}$, the control unit 7, in step 3 (in step ST5), makes the row processing unit 5 and column processing unit 6 end their decoding processings, and the decoded result judgment unit 8 outputs a decoded sequence as shown by the above-mentioned equation (6) as a decoded result.

Figure 24:
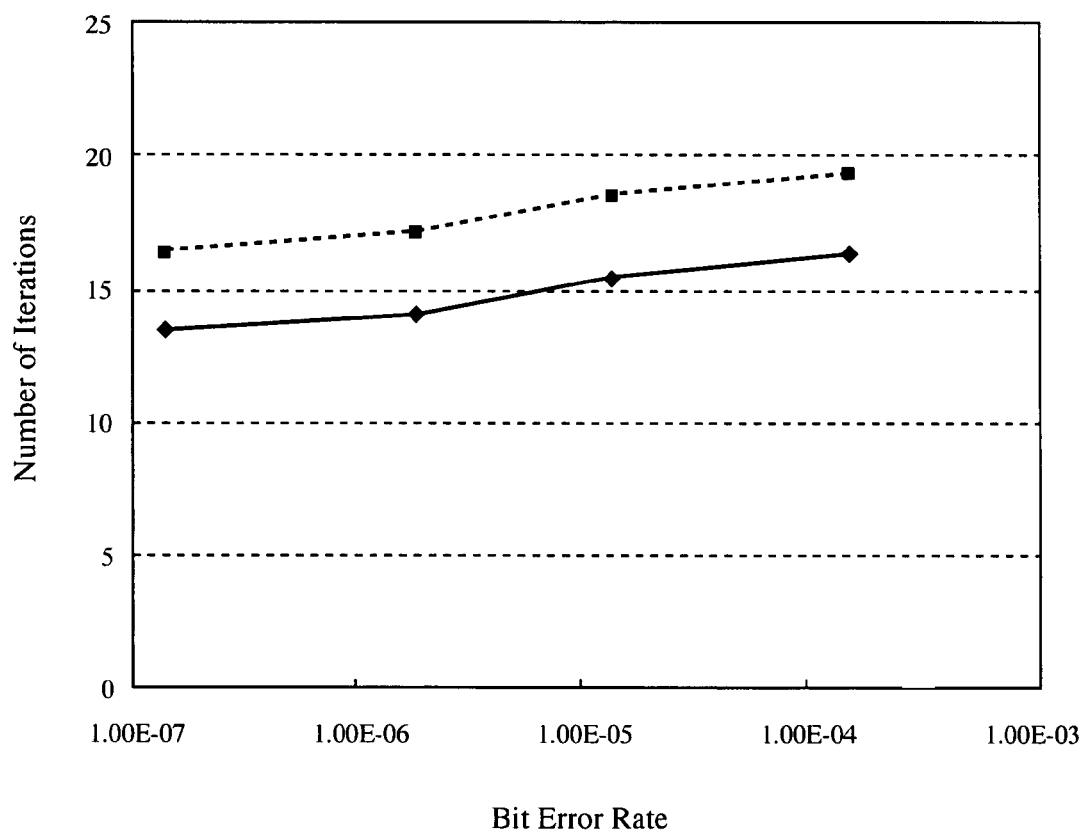
FIG. 24 is a graph in which a relation between a bit error rate and an average of the number of times that decoding is iterated is plotted.

FIG. 24 is a graph in which a relation between a bit error rate and an average of the number of iterations required for the parity check result to indicate O.K. at this bit error rate is plotted in each of a case in which the LDPC code decoding apparatus in accordance with embodiment 12 decodes the received signal by carrying out a group division of the coded matrix on the basis of the code construction, as mentioned above, and a case in which a group division of the coded matrix is carried out and the received signal is decoded according to the prior art Group Shuffled BP algorithm. In the figure, a dashed line which connects between points shows the relation in accordance with the prior art Group Shuffled BP algorithm, and a solid line which connects between points shows the relation in accordance with the algorithm of this embodiment 12.

In FIG. 24, the LDPC code is an irregular LDPC code having an upper right triangular area with all its elements 0, and has a code length of 64,800, a coding rate of ½, a column weight of 7, and a row weight of 8, and the maximum number of iterations $I_{max}$ is 20 times. Assume that the communication path is an AWGN (Additive White Gaussian Noise) communication path, and the modulation method is a QPSK (Quadrature Phase Shift Keying) method.

As mentioned above, the decoding apparatus in accordance with embodiment 12 carries out the decoding processing according to the above-mentioned Group Shuffled BP algorithm of carrying a group division of the LDPC matrix for every row on the basis of the code construction. In contrast, in accordance with the prior art Group Shuffled BP algorithm, the LDPC matrix is divided into some groups from the first bit of the head of the LDPC matrix in batches of a predetermined number of bits, as usual.

It can be seen from FIG. 24 that the decoding processing in accordance with this embodiment 12 can reduce the number of iterations of decoding required for the parity check to indicate O.K. remarkably, as compared with the case of using the prior art Group Shuffled BP algorithm. This is an example of comparison with the prior art Group Shuffled BP algorithm. This embodiment 12 can also be applied to a decoding algorithm of performing a calculation and an update of probability information with row processing and column processing on the received signal in batches of a predetermined number of bits, like the prior art Shuffled BP algorithm, so as to reduce the number of iterations similarly.

As mentioned above, when decoding an LDPC code having 1s in adjacent columns according to the decoding algorithm of carrying out a group division of the LDPC coded matrix, and performing a calculation and an update of probability information with row processing and column processing on the received signal in batches of a predetermined number of bits, like the Group Shuffled BP algorithm, the decoding apparatus according to this embodiment 12 carries out the decoding processing by carrying out the group division of the LDPC coded matrix for every row on the basis of the construction of the LDPC code and performing the row processing on each row having 1 in each column included in each group, and also performing the column processing on each column included in the group. Therefore, because the decoding apparatus according to this embodiment does not divide any adjacent columns into the same group, it can carry out the propagation of the probability information efficiently. As a result, as shown in FIG. 24, the number of iterations can be reduced, as compared with the prior art Group Shuffled BP algorithm of carrying out a group division from the leading bit of the LDPC coded matrix.

Embodiment 13

In above-mentioned embodiment 12, the LDPC code decoding apparatus which carries out a group division of an LDPC coded matrix for every row on the basis of the construction of an LDPC code is shown. An LDPC code decoding apparatus in accordance with this embodiment 13 carries out a group division of a target for decoding processing on the basis of a modulation method of a received signal.

The LDPC code decoding apparatus in accordance with this embodiment 13 has fundamentally the same structure as that of the LDPC code decoding apparatus in accordance with above-mentioned embodiment 12 shown in FIG. 20, and carries out a group division of the received signal on the basis of the modulation method by means of a column-to-be-operated-on control unit 17 and performs the decoding processing on the received signal for each group of the received signal by means of a row processing unit 5 and a column processing unit 6.

Furthermore, assuming a modulation method, the group division according to this embodiment 13 is carried out in the same way as that according to above-mentioned embodiment 12. That is, when performing the decoding processing by carrying out a group division and then performing a calculation and an update of probability information with row processing and column processing on the received signal, as in the case of using the Group Shuffled BP algorithm, the decoding apparatus in accordance with this embodiment 13 divides the coded matrix into groups 1 to 6 for every row, as shown in FIG. 22 explained in above-mentioned embodiment 12, on the basis of the modulation method of the received signal.

Here, as can be seen from a distribution of received values in a case of a modulation method of 4PAM Gray Mapping type shown in above-mentioned FIG. 17, in a case in which the modulation method is a multi-level one, the error rate differs for each bit of the received signal. In the case of FIG. 17, the MSBs of the received signal have a low bit error rate, and the LSBs of the received signal have a high bit error rate. In this case, the decoding of the MSBs can be completed with a smaller number of iterations as compared with the decoding of the LSBs.

The decoding apparatus in accordance with this embodiment 13 is so constructed as to divide the received signal into groups each including only MSBs and groups each including only LSBs, and to perform an arithmetic operation on the groups each including only MSBs first and, after that, perform an arithmetic operation on the groups each including only LSBs in a case of the modulation method of 4PAM type shown in FIG. 17.

In the above-mentioned example, the group division is carried out as in the case of using the prior art Group Shuffled BP algorithm. This process of carrying out a group division of a target for the decoding processing on the basis of the modulation method according to this embodiment can also be applied to another decoding algorithm of performing a calculation and an update of probability information with row processing and column processing on the received signal in batches of a predetermined number of bits.

The modulation method of 4PAM type as shown in FIG. 17 is mentioned as an example. Also in a case of a multi-level modulation method which causes a difference in the bit error rate among the bits of the received signal, a group division of a target for the decoding processing can be similarly carried out according to the difference in the bit error rate.

The operation algorithm in accordance with this embodiment 13 is the same as that of above-mentioned embodiment 12. The operation algorithm in accordance with this embodiment will be explained concretely.

First, in an initialization step, the number of iterations i is set to i=1, a maximum number of iterations is expressed as $I_{max}$, and an initial value $z_{m,n}^{(0)}$ of a log-likelihood ratio LLR (Log Likelihood Ratio) is defined as $F_n(z_{m,n}^{(0)}:=F_n)$. The check matrix H of an LDPC code to be decoded is a binary m×n matrix $H=[H_{m,n}]$ (n is an integer equal to or larger than 0 and smaller than N, and m is an integer equal to or larger than 0 and smaller than M), and $H_{m,n}$ is an element in the mth row and nth column of the matrix H.

Next, in step 1, a row process of computing the above-mentioned equations (2) and (3) under the condition shown by the above-mentioned equation (25) is carried out. Here, N(m) and M(n) are subsets of the set [1,N], and they are defined as follows: $N(m):=\{n:H_{m,n}=1\}$ and $M(n):=\{m:H_{m,n}=1\}$. That is, N(m) means a set of column indices which have 1 in the mth row of the check matrix H, and M(n) means a set of column indices which have 1 in the mth row of the LDPC check matrix H.

In addition, a set which is acquired by removing an element a from a set A is expressed as A\a. In other words, N(m)\n shows a set of column indices in which the nth column is removed from the set N(m), and M(n)\m shows a set of row indices in which the mth row is removed from the set M(n). $z_{m,n}^{(i)}$ is an LLR which is updated at the ith iteration, and $\epsilon_{m,n}^{(i)}$ is an LLR at the ith iteration which is sent from a check node to a bit node.

Furthermore, in step 1, a column process of computing the above-mentioned equations (4) and (5) under the condition shown by the above-mentioned equation (25) is carried out. Here, $z_{m,n}^{(i)}$ is an LLR at the ith iteration, which is sent from the bit node to the check node. Furthermore, $z_n^{(i)}$ is a posterior value at the ith iteration.

Next, in step 2, a decoded result judgment unit carries out a hard decision of the posterior value $z_n^{(i)}$ and creates a decoded sequence shown by the above-mentioned equation (6). Then, if the conditions shown by the above-mentioned equation (7) are satisfied, the decoded result judgment unit shifts to a process of step 3 which will be mentioned later, whereas when neither of these two conditions is satisfied, the decoded result judgment unit increments the number of iterations i and returns to the process of step 2. In step 3, the decoded result judgment unit outputs the decoded sequence according to the above-mentioned equation (6) acquired in step 2 as a decoded result.

Note that each symbol follows the above-mentioned equations. GR(g) shows a combination of columns which construct the gth group. GR(g) is shown concretely as follows.

In group 1 (GR (1)), $2k+1=1, 3, 5, 7, \ldots,$ and $N_g-1$, and k is equal to or larger than 0 and smaller than $N_g$.

In group 2 (GR(2)), $2k+1=N_g+1, N_g+3, N_g+5, \ldots,$ and $2N_g-1$, and k is equal to or larger than 0 and smaller than $N_g$.

In group (G/2) (GR(G/2)), $2k-1=G \cdot N_g-2N_g-1, \ldots,$ and $G \cdot N_g-1$, and k is equal to or larger than $(G/2-1) \cdot N_g$ and smaller than $G \cdot N_g$.

In group (G/2+1) (GR(G/2+1)), $2k+2=2, 4, 6, 8, \ldots,$ and Ng, and k is equal to or larger than 0 and smaller than $N_g$.

In group G (GR(G)), $2k+2=G \cdot N_g-2N_g+2, \ldots,$ and $G \cdot N_g$, and k is equal to or larger than $(G/2-1) \cdot N_g$ and smaller than $G \cdot N_g$.

In the example of FIG. 22, group 1 to which a symbol A is attached, group 3 to which a symbol C is attached, and group 5 to which a symbol E is attached are groups including only MSBs, and group 2 to which a symbol B is attached, group 4 to which a symbol D is attached, and group 6 to which a symbol F is attached are groups including only LSBs.

Next, the operation of the decoding apparatus in accordance with this embodiment of the present invention will be explained.

A flow of the fundamental operation of the LDPC code decoding apparatus in accordance with this embodiment 13 is the same as that shown in the flow chart of FIG. 3 in above-mentioned embodiment 1. Therefore, the operation of the LDPC code decoding apparatus will be explained with reference to FIG. 23.

First, the received LLR calculating unit 2 inputs received information (in step ST1), and calculates a received LLR from this received information (in step ST2). Next, in an initialization step (in step ST3), the received LLR calculating unit 2 sets the calculated received LLR to the intermediate-result holding unit 4 as an initial value $z_{m,n}^{(0)}(:=F_n)$. At this time, the control unit 7 initializes the number of iterations i of decoding to i=1.

Next, in step ST4b, until the number of iterations changes from i=1 to i=the last decoding time (i.e., a maximum number of iterations $I_{max}$), an iterative decoding process of step 1 of processing each group including only LSBs after processing each group including only MSBs by means of the row processing unit 5 and column processing unit 6 and a decision process of step 2 according to the above-mentioned equation (7) by means of the decoded result judgment unit 8 are repeatedly carried out for each above-mentioned group which corresponds to every row specified by the column-to-be-operated-on control unit 17.

A decoding operation at the ith iteration will be explained as an example.

First, in step 1, for the check matrix H of the LDPC code to be decoded ($=[H_{m,n}]$), the column-to-be-operated-on control unit 17 delivers the numbers of all columns included in group 1 including only MSBs to which the symbol A is attached in FIG. 22 to the row processing unit 5 and column processing unit 6. As a result, the row processing unit 5 performs the row processing on each row which has 1 in a column included in group 1, and delivers the processed result to the column processing unit 6. The column processing unit 6 performs the column processing on each column included in group 1, and makes the intermediate-result holding unit 4 hold the processed result.

The column-to-be-operated-on control unit 17 then delivers the numbers of all columns included in group 3 including only MSBs to which the symbol C is attached in FIG. 22 to the row processing unit 5 and column processing unit 6. As a result, the row processing unit 5 performs the row processing on each row which has 1 in a column included in group 3, and delivers the processed result to the column processing unit 6. The column processing unit 6 performs the column processing on each column included in group 3, and makes the intermediate-result holding unit 4 hold the processed result.

After that, every time when the column-to-be-operated-on control unit 17 delivers the number of all columns included in each group including only MSBs which is specified by g=3 or larger in the above-mentioned equation (25) to the row processing unit 5 and column processing unit 6 one after another, the row processing unit 5 delivers the processed result to the column processing unit 6, and the column processing unit 6 makes the intermediate-result holding unit 4 hold the processed result.

In the example of FIG. 22, the column-to-be-operated-on control unit 17 delivers the numbers of all columns included in group 5 including only MSBs to which the symbol E is attached to the row processing unit 5 and column processing unit 6. As a result, the row processing unit 5 performs the row processing on each row which has 1 in a column included in group 5, and delivers the processed result to the column processing unit 6. The column processing unit 6 performs the column processing on each column included in group 5, and makes the intermediate-result holding unit 4 hold the processed result.

After that, the column-to-be-operated-on control unit 17 delivers the numbers of all columns included in group 2 including only LSBs to which the symbol B is attached in FIG. 22 to the row processing unit 5 and column processing unit 6. As a result, the row processing unit 5 performs the row processing on each row which has 1 in a column included in group 2, and delivers the processed result to the column processing unit 6. The column processing unit 6 performs the column processing on each column included in group 2, and makes the intermediate-result holding unit 4 hold the processed result.

The column-to-be-operated-on control unit 17 then delivers the numbers of all columns included in group 4 including only LSBs to which the symbol D is attached in FIG. 22 to the row processing unit 5 and column processing unit 6. As a result, the row processing unit 5 performs the row processing on each row which has 1 in a column included in group 4, and delivers the processed result to the column processing unit 6. The column processing unit 6 performs the column processing on each column included in group 4, and makes the intermediate-result holding unit 4 hold the processed result.

After that, every time when the column-to-be-operated-on control unit 17 delivers the number of all columns included in each group including only LSBs which is specified by g=3 or larger in the above-mentioned equation (25) to the row processing unit 5 and column processing unit 6 one after another, the row processing unit 5 delivers the processed result to the column processing unit 6, and the column processing unit 6 makes the intermediate-result holding unit 4 hold the processed result.

In the example of FIG. 22, the column-to-be-operated-on control unit 17 delivers the numbers of all columns included in group 6 including only LSBs to which the symbol F corresponding to group G is attached to the row processing unit 5 and column processing unit 6. As a result, the row processing unit 5 performs the row processing on each row which has 1 in a column included in group 6, and delivers the processed result to the column processing unit 6. The column processing unit 6 performs the column processing on each column included in group 6, and makes the intermediate-result holding unit 4 hold the processed result.

In the above-mentioned processing, the row processing unit 5 performs arithmetic operations according to the above-mentioned equations (2) and (3) for the relation shown in the above-mentioned equation (25), and, when performing the processing after g=1, the row processing unit 5 therefore performs the row processing on a column having an already-updated LLR at the ith iteration, not using the received LLR but using the updated LLR.

In step 2, the decoded result judgment unit 8 carries out a hard decision of a posterior value $z_n^{(i)}$ which is calculated by the column processing unit 6 at the ith iteration, determines a decoded result, and performs a parity check on the decoded result. At this time, if the result of the parity check indicates NG, the control unit 7 increments the number of iterations i by one, and then makes the row processing unit 5 and column processing unit 6 carry out the process of step 1. In contrast, if the condition shown by the above-mentioned equation (7) is satisfied, the control unit make them shift to a process of step 3 which will be mentioned later.

Thus, the control unit 7 controls the row processing unit 5 and column processing unit 6 to repeat the processes of steps 1 and 2 until the result of the parity check indicates O.K. or the number of iterations reaches its maximum $I_{max}$ which is set up, as shown in the above-mentioned equation (7).

When the result of the parity check by the decoded result judgment unit 8 indicates O.K. or the number of iterations i set up by the control unit 7 reaches its maximum $I_{max}$, the control unit 7, in step 3 (in step ST5), makes the row processing unit 5 and column processing unit 6 end their decoding processings, and the decoded result judgment unit 8 outputs a decoded sequence as shown by the above-mentioned equation (6) as a decoded result.

As mentioned above, when decoding the received signal, which is modulated with the modulation method of 4PAM type and transmitted thereto and received thereby, according to the Group Shuffled BP algorithm, the decoding apparatus according to this embodiment 13 divides the received signal into groups each including only MSBs and groups each including only LSBs and performs an arithmetic operation on the groups each including only MSBs having a low bit error rate first. Therefore, by performing the decoding processing on LSBs having a high bit error rate after receiving high-reliability probability information associated with MSBs, the decoding apparatus according to this embodiment can perform the decoding operation on LSBs more efficiently and can carry out the decoding processing with a smaller number of iterations, as compared with prior art decoding apparatus.

Embodiment 14

An LDPC code decoding apparatus in accordance with this embodiment 14 controls the sequence of decoding operations on the basis of the construction of an input code when performing a calculation and an update of probability information with row processing and column processing on the received signal in batches of one 1 bit or two or more predetermined bit.

Although the LDPC code decoding apparatus in accordance with this embodiment 14 has fundamentally the same structure as that of the LDPC code decoding apparatus in accordance with above-mentioned embodiment 12 shown in FIG. 20, it differs from that of above-mentioned embodiment 12 in that a column-to-be-operated-on control unit 17 makes a row processing unit 5 and a column processing unit 6 perform decoding processing while controlling the sequence of decoding operations on the basis of the code construction.

An outline of the control of the sequence of decoding operations on the basis of the code construction will be explained by taking the Shuffled BP algorithm as an example of the decoding algorithm which the decoding apparatus of this embodiment uses. The reason why the Shuffled BP algorithm makes it possible to bring the decoding to completion with a smaller number of iterations than the Sum-Product algorithm is because the transmission of the probability information which is calculated and delivered during the decoding processing is carried out more efficiently than in the case of using the Sum-Product algorithm. Therefore, if the input code is an irregular LDPC code, the decoding apparatus of this embodiment ranks the columns of the input code in order of decreasing column weight and decodes the input code according to the Shuffled BP algorithm.

For example, in a case in which a row number which is ranked in the gth place is expressed as O(g), the decoding apparatus sequentially selects a column O(1) having the largest column weight, a column O(2) having the second largest column weight, a column O(3) having the third largest column weight, and so on in order of decreasing column weight, and carries out the decoding processing according to the Shuffled BP algorithm.

The Shuffled BP algorithm with ranking is carried out as follows.

First, in an initialization step, the number of iterations i is set to i=1, a maximum number of iterations is expressed as $I_{max}$, and an initial value $z_{m,n}^{(0)}$ of a log-likelihood ratio LLR (Log Likelihood Ratio) is defined as $F_n(z_{m,n}^{(0)}:=F_n)$. The check matrix H of an LDPC code to be decoded is a binary m×n matrix $H=[H_{m,n}]$ (n is an integer equal to or larger than 0 and smaller than N, and m is an integer equal to or larger than 0 and smaller than M), and $H_{m,n}$ is an element in the mth row and nth column of the matrix H.

Next, in step 1, a row process of computing the above-mentioned equations (2) and (3) under the condition shown by the above-mentioned equation (26) is carried out. Here, N(m) and M(n) are subsets of the set [1,N], and they are defined as follows: $N(m):=\{n:H_{m,n}=1\}$ and $M(n):=\{m:H_{m,n}=1\}$. That is, N(m) means a set of column indices which have 1 in the mth row of the check matrix H, and M (n) means a set of column indices which have 1 in the mth row of the LDPC check matrix H.

[Equation 18]

$1 \leq g \leq N$ (g: Integer)

$n=O(g), m \in M(n)$ (26)

In addition, a set which is acquired by removing an element a from a set A is expressed as A\a. In other words, N(m)\n shows a set of column indices in which the nth column is removed from the set N(m), and M(n)\m shows a set of row indices in which the mth row is removed from the set M(n). $z_{m,n}^{(i)}$ is an LLR which is updated at the ith iteration, and $\epsilon_{m,n}^{(i)}$ is an LLR at the ith iteration which is sent from a check node to a bit node.

Furthermore, in step 1, a column process of computing the above-mentioned equations (4) and (5) under the condition shown by the above-mentioned equation (25) is carried out. Here, $z_{m,n}^{(i)}$ is an LLR at the ith iteration, which is sent from the bit node to the check node. Furthermore, $z_n^{(i)}$ is a posterior value at the ith iteration.

Next, in step 2, a decoded result judgment unit carries out a hard decision of the posterior value $z_n^{(i)}$ and creates a decoded sequence shown by the above-mentioned equation (6). Then, if the conditions shown by the above-mentioned equation (7) are satisfied, the decoded result judgment unit shifts to a process of step 3 which will be mentioned later, whereas when neither of these two conditions is satisfied, the decoded result judgment unit increments the number of iterations i and returns to the process of step 2. In step 3, the decoded result judgment unit outputs the decoded sequence according to the above-mentioned equation (6) acquired in step 2 as a decoded result. Note that each symbol follows the above-mentioned equations. Furthermore, O(g) shows the column which is ranked in the gth place.

As mentioned above, the LDPC code decoding apparatus in accordance with this embodiment 14 has the same fundamental structure of as that of above-mentioned embodiment 1 shown in FIG. 1, with the exception that it has the column-to-be-operated-on control unit 17. That is, the LDPC code decoding apparatus is provided with a received LLR calculating unit 2 which calculates a received LLR from received information and a decoding core unit 3, and carries out decoding of an LDPC code according to the Shuffled BP algorithm of controlling the sequence of decoding operations on the basis of the code construction by means of the decoding core unit 3.

The decoding core unit 3 is provided with an intermediate-result holding unit 4, the row processing unit 5, the column processing unit 6, a control unit 7, the decoded result judgment unit 8, and the column-to-be-operated-on control unit 17. The intermediate-result holding unit 4 holds intermediate results of the decoding processing carried out by the row processing unit 5 and column processing unit 6, as previously explained in above-mentioned embodiment 1. The row processing unit 5 carries out row processing using the above-mentioned equations (2) and (3) under the condition shown by the above-mentioned equation (26), and the column processing unit 6 carries out column processing using the above-mentioned equations (4) and (5) under the condition shown by the above-mentioned equation (25).

The control unit 7 performs control of decoding iterations, such as a setup of a maximum number of iterations. The decoded result judgment unit 8 calculates a decoded sequence which is a decoded result from a hard decision of a posterior value calculated by the column processing unit 6 using the above-mentioned equation (6), as in the case of step 1 of the above-mentioned Shuffled BP algorithm, and performs a parity check on the decoded result so as to judge whether or not the decoded result is correct from the condition shown by the above-mentioned equation (7). The column-to-be-operated-on control unit 17 carries out control of the sequence of decoding operations on columns of the LDPC coded matrix in order of decreasing column weight, as mentioned above, and makes the row processing unit 5 and column processing unit 6 carry out the decoding operation.

Next, the operation of the decoding apparatus in accordance with this embodiment of the present invention will be explained.

A flow of the fundamental operation of the LDPC code decoding apparatus in accordance with this embodiment 14 is the same as that shown in the flow chart of FIG. 23 in above-mentioned embodiment 12. Therefore, the operation of the LDPC code decoding apparatus will be explained with reference to FIG. 23.

First, the received LLR calculating unit 2 inputs received information (in step ST1), and calculates a received LLR from this received information (in step ST2). Next, in an initialization step (in step ST3), the received LLR calculating unit 2 sets the calculated received LLR to the intermediate-result holding unit 4 as an initial value $z_{m,n}^{(0)}(:=F_n)$. At this time, the control unit 7 initializes the number of iterations i of decoding to i=1.

Next, in step ST4b, until the number of iterations changes from i=1 to i=the last decoding time (i.e., a maximum number of iterations $I_{max}$), an iterative decoding process of step 1 of performing iterative decoding by means of the row processing unit 5 and column processing unit 6 and a decision process of step 2 according to the above-mentioned equation (7) by means of the decoded result judgment unit 8 are repeatedly performed on the columns of the matrix which are specified by the column-to-be-operated-on control unit 17 in order of decreasing column weight.

A decoding operation at the ith iteration will be explained as an example.

First, in step 1, for the check matrix H of the LDPC code to be decoded (=$[H_{m,n}]$), the column-to-be-operated-on control unit 17 delivers the number of a column having the largest column weight on which the row processing unit 5 and column processing unit 6 perform arithmetic operations for the first time to the row processing unit 5 and column processing unit 6. As a result, the row processing unit 5 performs the row processing on each row which has 1 in the column specified by the column-to-be-operated-on control unit 17, on which the row processing unit 5 and column processing unit 6 perform arithmetic operations for the first time, and delivers the processed result to the column processing unit 6. The column processing unit 6 performs the column processing on the column, on which the row processing unit 5 and column processing unit 6 perform arithmetic operations for the first time, and makes the intermediate-result holding unit 4 hold the processed result.

Next, the column-to-be-operated-on control unit 17 delivers the number of a column having the second largest column weight on which the row processing unit 5 and column processing unit 6 perform arithmetic operations for the second time to the row processing unit 5 and column processing unit 6. As a result, the row processing unit 5 performs the row processing on each row which has 1 in the column specified by the column-to-be-operated-on control unit 17, on which the row processing unit 5 and column processing unit 6 perform arithmetic operations for the second time, and delivers the processed result to the column processing unit 6. The column processing unit 6 performs the column processing on the column, on which the row processing unit 5 and column processing unit 6 perform arithmetic operations for the second time, and makes the intermediate-result holding unit 4 hold the processed result.

After that, every time when the column-to-be-operated-on control unit 17 delivers the number of a column which is specified by g=3 or larger in the above-mentioned equation (25) to the row processing unit 5 and column processing unit 6 one after another in order of decreasing column weight, the row processing unit 5 delivers the processed result to the column processing unit 6, and the column processing unit 6 makes the intermediate-result holding unit 4 hold the processed result.

Finally, the column-to-be-operated-on control unit 17 delivers the number of a column on which the row processing unit 5 and column processing unit 6 perform arithmetic operations for the gth time to the row processing unit 5 and column processing unit 6. As a result, the row processing unit 5 performs the row processing on each row which has 1 in the column on which the row processing unit 5 and column processing unit 6 perform arithmetic operations for the gth time, and delivers the processed result to the column processing unit 6. On the other hand, the column processing unit 6 performs the column processing on the column on which the row processing unit 5 and column processing unit 6 perform arithmetic operations for the gth time, and makes the intermediate-result holding unit 4 hold the processed result.

In the above-mentioned processing, the row processing unit 5 performs the arithmetic operations according to the above-mentioned equations (2) and (3) for the relation shown in the above-mentioned equation (26), and, when performing the processing after g=1, the row processing unit 5 therefore performs the row processing on a column having an already-updated LLR at the ith iteration, not using the received LLR but using the updated LLR.

In step 2, the decoded result judgment unit 8 carries out a hard decision of a posterior value $z_n^{(i)}$ which is calculated by the column processing unit 6 at the ith iteration, determines a decoded result, and performs a parity check on the decoded result. At this time, if the result of the parity check indicates NG, the control unit 7 increments the number of iterations i by one, and then makes the row processing unit 5 and column processing unit 6 carry out the process of step 1. In contrast, if the condition shown by the above-mentioned equation (7) is satisfied, the control unit make them shift to a process of step 3 which will be mentioned later.

Thus, the control unit 7 controls the row processing unit 5 and column processing unit 6 to repeat the processes of steps 1 and 2 until the result of the parity check indicates O.K. or the number of iterations reaches its maximum $I_{max}$ which is set up, as shown in the above-mentioned equation (7).

When the result of the parity check by the decoded result judgment unit 8 indicates O.K. or the number of iterations i set up by the control unit 7 reaches its maximum $I_{max}$, the control unit 7, in step 3 (in step ST5), makes the row processing unit 5 and column processing unit 6 end their decoding processings, and the decoded result judgment unit 8 outputs a decoded sequence as shown by the above-mentioned equation (6) as a decoded result.

As mentioned above, the LDPC code decoding apparatus in accordance with this embodiment 14 controls the sequence of decoding operations on the basis of the construction of an input code when performing a calculation and an update of probability information with row processing and column processing on the received signal in batches of one 1 bit or two or more predetermined bit. Therefore, the LDPC code decoding apparatus makes it possible for the probability information computed previously to propagate quickly, and therefore can reduce the number of iterations. Furthermore, because the LDPC code decoding apparatus in accordance with this embodiment controls the sequence of decoding operations on the basis of the construction of an input code, it does not need to rank the code information whenever it receives the code information.

In above-mentioned embodiment 14, an example of carrying out control of the sequence of decoding operations according to the Shuffled BP algorithm is shown. As an alternative, this embodiment can be similarly applied to another decoding algorithm of performing a calculation and an update of probability information with row processing and column processing on the received signal in batches of one bit or a predetermined number of bits.

Embodiment 15

An LDPC code decoding apparatus in accordance with this embodiment 15 controls the sequence of decoding operations on the basis of the modulation method of a received signal when performing a calculation and an update of probability information with row processing and column processing on the received signal in batches of one 1 bit or two or more predetermined bit.

Although the LDPC code decoding apparatus in accordance with this embodiment 15 has fundamentally the same structure as that of the LDPC code decoding apparatus in accordance with above-mentioned embodiment 12 shown in FIG. 20, it differs from that of above-mentioned embodiment 12 in that a column-to-be-operated-on control unit 17 makes a row processing unit 5 and a column processing unit 6 perform decoding processing while controlling the sequence of decoding operations on the basis of the modulation method of the received signal.

An outline of the control of the sequence of decoding operations on the basis of the modulation method will be explained by taking the Shuffled BP algorithm as an example of the decoding algorithm which the decoding apparatus of this embodiment uses. In a case in which the modulation method is a multi-level one, the error rate differs for each bit of the received signal. For example, in a case of a modulation method of 4PAM Gray Mapping type shown in above-mentioned FIG. 17, the MSBs of the received signal have a low bit error rate, and the LSBs of the received signal have a high bit error rate when modulation signal points are assigned sequentially to the code from the leading bit of the code.

When decoding such a received signal, probability information which is calculated during a decoding process of decoding MSBs has a feature that the reliability is high. Therefore, when decoding such a received signal according to the Shuffled BP algorithm, the LDPC code decoding apparatus makes it possible for probability information having high reliability to propagate to the decoding of LSBs at any time by decoding the received signal sequentially from MSBs.

For example, in a case in which a row number which is ranked in the gth place is expressed as O(g), the decoding apparatus selects all columns which corresponding to MSBs first, then selects all columns which correspond to LSBs in order of O(1)=1, O(2)=3, O(3)=5, O(4)=7, ..., 2n+1, ..., N−1, 2, 4, 6, ..., 2n, ..., and N, and carries out the decoding processing according to the Shuffled BP algorithm.

As mentioned above, the LDPC code decoding apparatus in accordance with this embodiment 15 has the same fundamental structure of as that of above-mentioned embodiment 1 shown in FIG. 1, with the exception that it has the column-to-be-operated-on control unit 17. That is, the LDPC code decoding apparatus is provided with a received LLR calculating unit 2 which calculates a received LLR from received information and a decoding core unit 3, and carries out decoding of an LDPC code according to the Shuffled BP algorithm of controlling the sequence of decoding operations on the basis of the modulation method of the received signal by means of the decoding core unit 3.

The decoding core unit 3 is provided with an intermediate-result holding unit 4, the row processing unit 5, the column processing unit 6, a control unit 7, a decoded result judgment unit 8, and the column-to-be-operated-on control unit 17. The intermediate-result holding unit 4 holds intermediate results of the decoding processing carried out by the row processing unit 5 and column processing unit 6, as previously explained in above-mentioned embodiment 1. The row processing unit 5 carries out row processing using the above-mentioned equations (2) and (3) under the condition shown by the above-mentioned equation (26), and the column processing unit 6 carries out column processing using the above-mentioned equations (4) and (5) under the condition shown by the above-mentioned equation (25).

The control unit 7 performs control of decoding iterations, such as a setup of a maximum number of iterations. The decoded result judgment unit 8 calculates a decoded sequence which is a decoded result from a hard decision of a posterior value calculated by the column processing unit 6 using the above-mentioned equation (6), as in the case of step 1 of the above-mentioned Shuffled BP algorithm, and performs a parity check on the decoded result so as to judge whether or not the decoded result is correct from the condition shown by the above-mentioned equation (7). The column-to-be-operated-on control unit 17 carries out control of the sequence of decoding operations on columns of the LDPC coded matrix on the basis of the modulation method of the received signal, as mentioned above, so as to select all columns which correspond to bits having a low bit error, and then select columns which correspond to bits having a high bit error, and makes the row processing unit 5 and column processing unit 6 carry out the decoding operation.

Next, the operation of the decoding apparatus in accordance with this embodiment of the present invention will be explained.

A flow of the fundamental operation of the LDPC code decoding apparatus in accordance with this embodiment 15 is the same as that shown in the flow chart of FIG. 23 in above-mentioned embodiment 12. Therefore, the operation of the LDPC code decoding apparatus will be explained with reference to FIG. 23.

First, the received LLR calculating unit 2 inputs received information (in step ST1), and calculates a received LLR from this received information (in step ST2). Next, in an initialization step (in step ST3), the received LLR calculating unit 2 sets the calculated received LLR to the intermediate-result holding unit 4 as an initial value $z_{m,n}^{(0)}(:=F_n)$. At this time, the control unit 7 initializes the number of iterations i of decoding to i=1.

Next, in step ST4b, until the number of iterations changes from i=1 to i=the last decoding time (i.e., a maximum number of iterations $I_{max}$), an iterative decoding process of step 1 of performing iterative decoding by means of the row processing unit 5 and column processing unit 6 and a decision process of step 2 according to the above-mentioned equation (7) by means of the decoded result judgment unit 8 are repeatedly performed on the columns which are selected by the column-to-be-operated-on control unit 17 on the basis of the modulation method of the received signal.

A decoding operation at the ith iteration will be explained as an example.

First, in step 1, for the check matrix H of the LDPC code to be decoded (=[$H_{m,n}$]), the column-to-be-operated-on control unit 17 delivers the number of a leading column which is specified thereby on the basis of the modulation method and which corresponds to MSB of the received signal, as a column on which the row processing unit 5 and column processing unit 6 perform arithmetic operations for the first time, to the row processing unit 5 and column processing unit 6. As a result, the row processing unit 5 performs the row processing on each row which has 1 in the column specified by the column-to-be-operated-on control unit 17, on which the row processing unit 5 and column processing unit 6 perform arithmetic operations for the first time, and delivers the processed result to the column processing unit 6. The column processing unit 6 performs the column processing on the column on which the row processing unit 5 and column processing unit 6 perform arithmetic operations for the first time, and makes the intermediate-result holding unit 4 hold the processed result.

Next, the column-to-be-operated-on control unit 17 delivers the number of a column which is specified thereby on the basis of the modulation method and which corresponds to the next MSB of the received signal, as a column on which the row processing unit 5 and column processing unit 6 perform arithmetic operations for the second time, to the row processing unit 5 and column processing unit 6. As a result, the row processing unit 5 performs the row processing on each row which has 1 in the column specified by the column-to-be-operated-on control unit 17, on which the row processing unit 5 and column processing unit 6 perform arithmetic operations for the second time, and delivers the processed result to the column processing unit 6. The column processing unit 6 performs the column processing on the column on which the row processing unit 5 and column processing unit 6 perform arithmetic operations for the second time, and makes the intermediate-result holding unit 4 hold the processed result.

After that, every time when the column-to-be-operated-on control unit 17 delivers the number of a column which is specified by g=3 or larger in the above-mentioned equation (25) and which corresponds to MSB to the row processing unit 5 and column processing unit 6 one after another, the row processing unit 5 delivers the processed result to the column processing unit 6, and the column processing unit 6 makes the intermediate-result holding unit 4 hold the processed result.

After the arithmetic operations on the columns which correspond to the MSBs of the received signal are completed, the column-to-be-operated-on control unit 17 delivers the number of a leading column which is specified thereby on the basis of the modulation method and which corresponds to LSB of the received signal, as a column on which the row processing unit 5 and column processing unit 6 perform arithmetic operations for the first time after the completion of the arithmetic operations on the columns corresponding to MSBs, to the row processing unit 5 and column processing unit 6. As a result, the row processing unit 5 performs the row processing on each row which has 1 in the column which corresponds to the LSB on which the row processing unit 5 and column processing unit 6 perform arithmetic operations for the first time, and delivers the processed result to the column processing unit 6. The column processing unit 6 performs the column processing on the column and makes the intermediate-result holding unit 4 hold the processed result.

Next, the column-to-be-operated-on control unit 17 delivers the number of the next column which is specified thereby on the basis of the modulation method and which corresponds to LSB of the received signal, as a column on which the row processing unit 5 and column processing unit 6 perform arithmetic operations for the second time, to the row processing unit 5 and column processing unit 6. As a result, the row processing unit 5 performs the row processing on each row which has 1 in the column which corresponds to the LSB on which the row processing unit 5 and column processing unit 6 perform arithmetic operations for the second time, and delivers the processed result to the column processing unit 6. The column processing unit 6 performs the column processing on the column and makes the intermediate-result holding unit 4 hold the processed result.

After that, every time when the column-to-be-operated-on control unit 17 delivers the number of a column which is specified by g=3 or larger in the above-mentioned equation (26) and which corresponds to LSB to the row processing unit 5 and column processing unit 6 one after another, the row processing unit 5 delivers the processed result to the column processing unit 6, and the column processing unit 6 makes the intermediate-result holding unit 4 hold the processed result.

In the above-mentioned processing, the row processing unit 5 performs the arithmetic operations according to the above-mentioned equations (2) and (3) for the relation shown in the above-mentioned equation (26), and, when performing the processing after g=1, the row processing unit 5 therefore performs the row processing on a column having an already-updated LLR at the ith iteration, not using the received LLR but using the updated LLR.

In step 2, the decoded result judgment unit 8 carries out a hard decision of a posterior value $z_n^{(i)}$ which is calculated by the column processing unit 6 at the ith iteration, determines a decoded result, and performs a parity check on the decoded result. At this time, if the result of the parity check indicates NG, the control unit 7 increments the number of iterations i by one, and then makes the row processing unit 5 and column processing unit 6 carry out the process of step 1. In contrast, if the condition shown by the above-mentioned equation (7) is satisfied, the control unit make them shift to a process of step 3 which will be mentioned later.

Thus, the control unit 7 controls the row processing unit 5 and column processing unit 6 to repeat the processes of steps 1 and 2 until the result of the parity check indicates O.K. or the number of iterations reaches its maximum $I_{max}$ which is set up, as shown in the above-mentioned equation (7).

When the result of the parity check by the decoded result judgment unit 8 indicates O.K. or the number of iterations i set up by the control unit 7 reaches its maximum $I_{max}$, the control unit 7, in step 3 (in step ST5), makes the row processing unit 5 and column processing unit 6 end their decoding processings, and the decoded result judgment unit 8 outputs a decoded sequence as shown by the above-mentioned equation (6) as a decoded result.

As mentioned above, the LDPC code decoding apparatus in accordance with this embodiment 15 controls the sequence of decoding operations on the basis of the modulation method of the received signal when performing a calculation and an update of probability information with row processing and column processing on the received signal in batches of one 1 bit or two or more predetermined bit. For example, when decoding the received signal, which is modulated with the modulation method of 4PAM type and transmitted thereto and received thereby, according to the Shuffled BP algorithm, the decoding apparatus according to this embodiment performs arithmetic operations on MSBs of the received signals first after ranking them above LSBs. Therefore, the LDPC code decoding apparatus makes it possible for high-reliability probability information to propagate to LSBs and for the decoding of LSBs to advance quickly, and therefore can reduce the number of iterations.

In above-mentioned embodiment 15, an example of carrying out control of the sequence of decoding operations according to the Shuffled BP algorithm is shown. As an alternative, this embodiment can be similarly applied to another decoding algorithm of performing a calculation and an update of probability information with row processing and column processing on the received signal in batches of one bit or a predetermined number of bits.

Furthermore, in above-mentioned embodiment 15, the modulation method of 4PAM type is shown as an example. As an alternative, a multi-level modulation method which causes a difference in the bit error rate can be used. In this case, all the bits of the received signal can be ranked similarly in order of increasing error rate and decreasing reliability.

Embodiment 16

Figure 25:
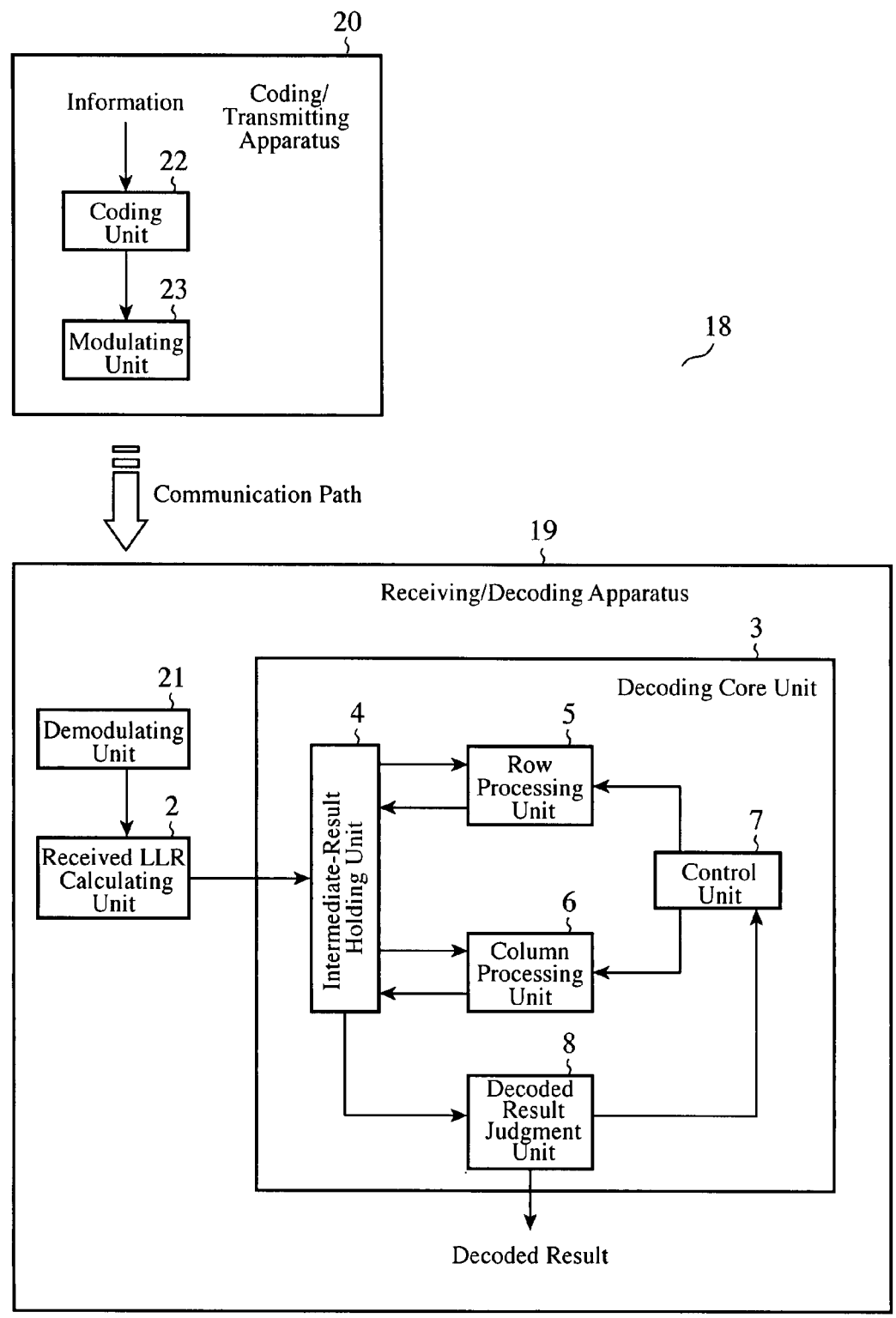
FIG. 25 is a block diagram showing the structure of a communications apparatus in accordance with embodiment 16 of the present invention.

FIG. 25 is a block diagram showing the structure of a communications apparatus in accordance with embodiment 16 of the present invention. As shown in the figure, the communications apparatus 18 in accordance with this embodiment 16 is provided with a receiving/decoding apparatus (i.e., a receiving/decoding unit) 19 and a coding/transmitting apparatus (i.e., a coding/transmitting unit) 20. The receiving/decoding apparatus 19 is provided with a demodulating unit 21 for receiving and demodulating an LDPC coded signal transmitted by the coding/transmitting apparatus 20 in addition to the fundamental structure shown in FIG. 1.

The coding/transmitting apparatus 20 is provided with a coding unit 22 and a modulating unit 23. The coding unit 22 inputs information which the coding/transmitting apparatus should transmit, and encodes an LDPC code. The modulating unit 23 inputs coded data from the coding unit 22, modulates the coded data, and transmits it to the receiving/decoding apparatus 19 as a modulation signal.

In the communications apparatus 18 in accordance with the embodiment 16, an encoded signal is transmitted and received between the receiving/decoding apparatus 19 and the coding/transmitting apparatus 20 with modulation signal points adapted to the code construction of the LDPC code being assigned to check bits, and a calculation and an update of probability information with row processing and column processing is performed on the received signal in batches of one 1 bit or two or more predetermined bit according to the control of the sequence of decoding operations on the basis of the construction of the input code according to a decoding algorithm like the Shuffled BP algorithm.

FIG. 26 is a diagram showing the structure of an LDPC code which the communications apparatus in accordance with embodiment 16 uses. As shown in FIG. 26, the LDPC code is a check matrix with 8 rows and 16 columns, and has an upper right triangular area with all its elements 0 and a symmetrical structure in which check bits on opposite sides of the main diagonal have the same value. FIG. 27 is a diagram showing an example of assignment of bits in a case of modulating an LDPC code with a modulation method of 4PAM type and transmitting or receiving it in the communications apparatus in accordance with embodiment 16. In FIG. 27, when assigning bits to the check bits which are the elements of a matrix with M rows and N columns, bits except LSBs are assigned to the 1st to $(n_1-1)$th columns, respectively, and bits except MSBs are assigned to the $n_1$th to Nth columns, respectively. An outline of embodiment 16 will be explained with reference to these figures.

As mentioned above, the reason why the Shuffled BP algorithm makes it possible to bring the decoding to completion with a smaller number of iterations than the Sum-Product algorithm is because the transmission of probability information which is calculated and delivered during the decoding processing is carried out more efficiently than in the case of using the Sum-Product algorithm.

Therefore, in a case in which an LDPC code, as shown in FIG. 26, having an upper right triangular area with all its elements 0 and check bits having a symmetrical structure is modulated with a modulation method of 4PAM type and is transmitted and received, LSBs having a high error rate are assigned to the check bits, and transmitted and received, as shown in FIG. 27. The decoding side decodes the received code according to the Shuffled BP algorithm, and decodes the LSBs which are the check bits at the beginning of the decoding processing.

As shown in FIG. 27, in a case in which modulation signal points are assigned to the check bits, the decoding of the LSBs is sequentially carried out from the heads of the LSBs which are the check bits. The row processing in the decoding of the LDPC code is carried out using information on columns other than the target columns in the same way that the row processing shown in above-mentioned embodiment 15 is carried out. For this reason, when performing an arithmetic operation on the $n_1$th column which is the head of the LSBs, the decoding apparatus can perform the arithmetic operation using only high-reliability information which MSBs have.

Furthermore, because the decoding apparatus can perform an arithmetic operation on the $(n_1+1)$th column using only information which MSBs have and information on the $n_1$th row on which an arithmetic operation has been performed, the decoding apparatus performs the arithmetic operation on the $(n_1+1)$th always using only the high-reliability information.

For example, in a case in which a row number which is ranked in the gth place is expressed as O(g), in the example of FIG. 27, the decoding apparatus ranks the columns of the check matrix in such a manner that it assigns O(1) to the $n_1$th column (LSB), O(2) to the $(n_1+1)$th column (LSB), and O(N$-n_1$) to the Nth column (LSB), sequentially selects the columns, and sequentially performs the decoding processing on the selected columns according to the Shuffled BP algorithm. For O(N$-n_1+1$) and subsequent column numbers, the decoding apparatus performs an arithmetic operation on the 1st to $(n_1-1)$th columns corresponding to bits except LSBs.

Next, a concrete example of the communications apparatus 18 in accordance with embodiment 16 in which an encoded signal is transmitted and received with modulation signal points adapted to the code construction of the LDPC code being assigned to the check bits, and the LDPC code on which the above-mentioned control of the sequence of decoding operations is performed with the above-mentioned process equations is transmitted and received will be explained with reference to FIG. 25. As shown in FIG. 25, the communications apparatus 18 in accordance with embodiment 16 is provided with the coding/transmitting apparatus 20 and receiving/decoding apparatus 21. The coding/transmitting apparatus 20 is provided with a coding unit 22 for coding an LDPC code, and a modulating unit 23 for assigning modulation signal points which are adapted to the code construction to the check bits.

The receiving/decoding apparatus 19 of the communications apparatus 18 in accordance with embodiment 16 is provided with a demodulating unit 21 for demodulating a modulated signal, a received LLR calculating unit 2 for calculating a received LLR from received information, and a decoding core unit 3. The decoding core unit 3 decodes the LDPC code according to the Shuffled BP algorithm of carrying out the control of the sequence of decoding operations on the basis of the code construction.

The decoding core unit 3 is provided with an intermediate-result holding unit 4, a row processing unit 5, a column processing unit 6, a control unit 7, and a decoded result judgment unit 8. The intermediate-result holding unit 4 holds intermediate results of the decoding processing carried out by the row processing unit 5 and column processing unit 6, as previously explained in above-mentioned embodiment 1. The row processing unit 5 carries out row processing using the above-mentioned equations (2) and (3) under the condition shown by the above-mentioned equation (26), and the column processing unit 6 carries out column processing using the above-mentioned equations (4) and (5) under the condition shown by the above-mentioned equation (25).

The control unit 7 performs control of decoding iterations, such as a setup of a maximum number of iterations. The decoded result judgment unit 8 calculates a decoded sequence which is a decoded result from a hard decision of a posterior value calculated by the column processing unit 6 using the above-mentioned equation (6), as in the case of step 1 of the above-mentioned Shuffled BP algorithm, and performs a parity check on the decoded result so as to judge whether or not the decoded result is correct from the condition shown by the above-mentioned equation (7).

Next, the operation of the decoding apparatus in accordance with this embodiment of the present invention will be explained.

Figure 28:
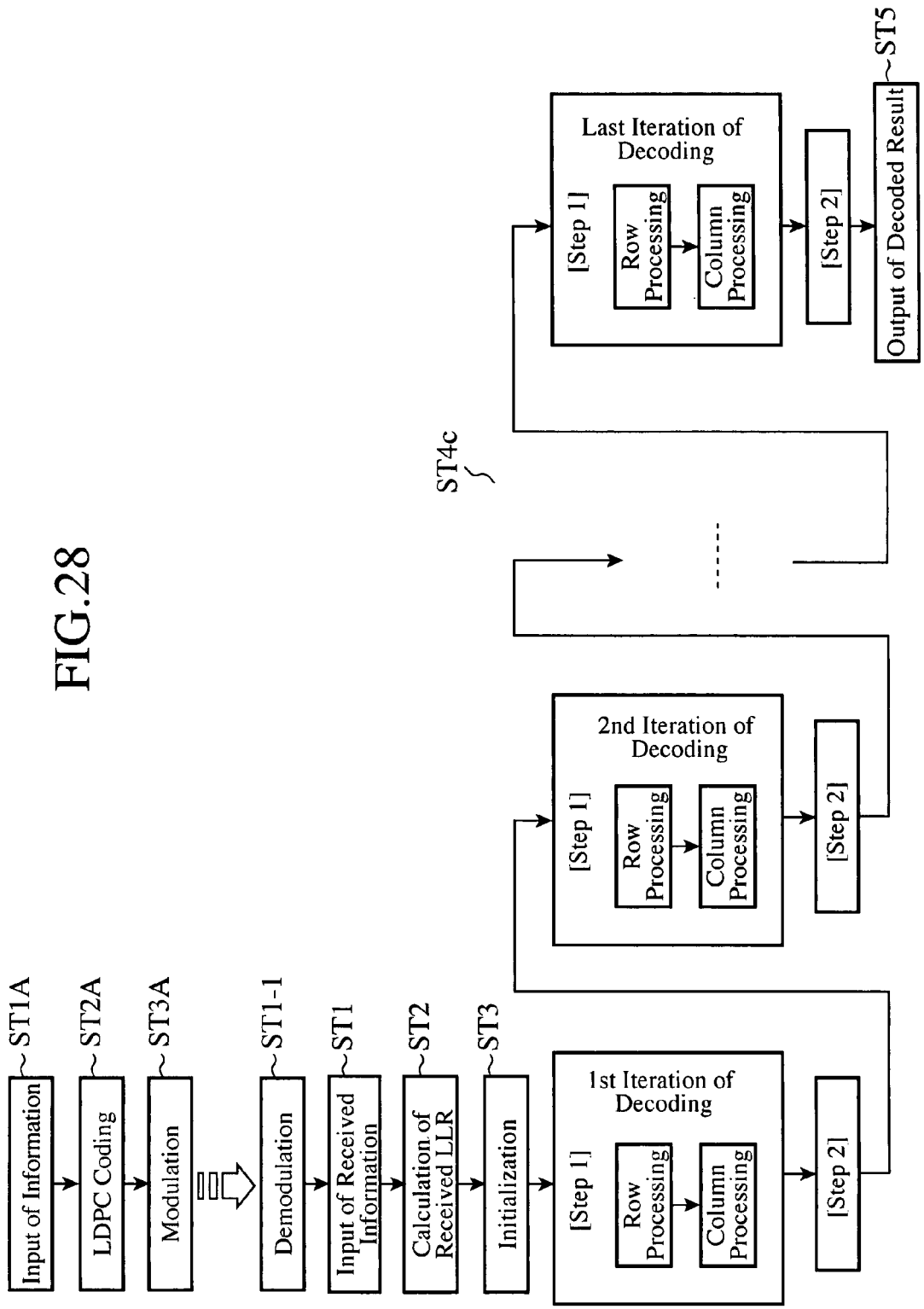
FIG. 28 is a flow chart showing the operation of the communications apparatus in accordance with embodiment 16.

FIG. 28 is a flow chart showing the operation of the communications apparatus in accordance with embodiment 16, and the operation of the communications apparatus will be explained with reference to this figure.

First, when receiving the information which should be transmitted (in step ST1A), the coding unit 22 of the coding/transmitting apparatus 20 carries out LDPC coding using both a generator matrix which is calculated on the basis of the check matrix H of the LDPC code and the inputted information so as to create coded data (in step ST2A). When receiving the coded data from the coding unit 22, the modulating unit 23 carries out a 4PAM modulation of the inputted coded data according to the bit assignment performed on the LDPC code as shown in FIG. 27, and transmits the modulated data to the receiving/decoding apparatus 19 (in step ST3A).

The demodulating unit 21 of the receiving/decoding apparatus 19 demodulates the received signal from the coding/transmitting apparatus 20 (in step ST1-1), and outputs received information which is the demodulated result to the received LLR calculating unit 2. When receiving the received information (in step ST1), the received LLR calculating unit 2 calculates a received LLR from the received information (in step ST2). Next, in an initialization step (in step ST3), the received LLR calculating unit 2 sets the calculated received LLR to the intermediate-result holding unit 4 as an initial value $z_{m,n}^{(0)}(:=F_n)$. At this time, the control unit 7 initializes the number of iterations i of decoding to i=1.

Next, in step ST4c, until the number of iterations changes from i=1 to i=the last decoding time (i.e., a maximum number of iterations $I_{max}$), an iterative decoding process of step 1 by means of the row processing unit 5 and column processing unit 6, and a decision process of step 2 according to the above-mentioned equation (7) by means of the decoded result judgment unit 8 are repeatedly carried out.

A decoding operation at the ith iteration will be explained as an example.

First, the row processing unit 5 performs the row processing on the 1st and 2nd rows of the check matrix H $(=[H_{m,n}])$ of an LDPC code to be decoded at the time of g=1 in the above-mentioned equation (26), and delivers the processed results to the column processing unit 6. The column processing unit 6 performs the column processing on the $n_1$th column of the check matrix, and makes the intermediate-result holding unit 4 hold the processed result.

Next, at the time of g=2 in the above-mentioned equation (26), the row processing unit 5 performs the row processing on the 2nd and 3rd rows, and delivers the processed results to the column processing unit 6. The column processing unit 6 then performs the column processing on the $(n_1+1)$th column of the check matrix, and makes the intermediate-result holding unit 4 hold the processed result.

Next, every time when the row processing unit 5 performs the row processing on the 4th or subsequent row of the check matrix one after another in the same way as mentioned above at the time of g=3 or larger in the above-mentioned equation (26), the row processing unit 5 delivers the processed result to the column processing unit 6. Furthermore, every time when the column processing unit 6 performs the column processing on the $(n_1+2)$th or subsequent column of the check matrix one after another, the column processing unit 6 makes the intermediate-result holding unit 14 hold the processed result.

After that, at the time of $g=N-n_1-1$ in the above-mentioned equation (26), the row processing unit 5 performs the row processing on the (M−1)th and Mth rows of the check matrix, and delivers the processed results to the column processing unit 6. The column processing unit 6 then performs the column processing on the (N−1)th column of the check matrix, and makes the intermediate-result holding unit 4 hold the processed result.

Next, at the time of $g=(N-n_1)$ in the above-mentioned equation (26), the row processing unit 5 performs the row processing on the Mth row of the check matrix, and delivers the processed result to the column processing unit 6. The column processing unit 6 then performs the column processing on the Nth column of the check matrix, and makes the intermediate-result holding unit 4 hold the processed result.

After that, in the decoding processing at the time of $g=(N-n_1+1)$ to N in the above-mentioned equation (26) which follows the above-mentioned decoding processing, the column processing unit 6 performs an arithmetic operation on each of columns corresponding to bits except LSBs. For example, when the 1st column to which a bit except LSB is assigned is the target on which an arithmetic operation is to be performed, the row processing unit 5 performs the row processing on each row which has 1 in the 1st column of the check matrix, and delivers the processed result to the column processing unit 6. The column processing unit similarly performs the column processing on the 1st column of the check matrix, and makes the intermediate-result holding unit 4 hold the processed result.

In the above-mentioned processing, the row processing unit 5 follows the above-mentioned equation (2), and, when performing the processing after $g=1$, therefore performs the row processing on a column having an already-updated LLR at the ith iteration, not using the received LLR but using the updated LLR.

In step 2, the decoded result judgment unit 8 carries out a hard decision of a posterior value $z_n^{(i)}$ which is calculated by the column processing unit 6 at the ith iteration, determines a decoded result, and performs a parity check on the decoded result. At this time, if the result of the parity check indicates NG, the control unit 7 increments the number of iterations i by one, and then makes the row processing unit 5 and column processing unit 6 carry out the process of step 1. In contrast, if the condition shown by the above-mentioned equation (7) is satisfied, the control unit make them shift to a process of step 3 which will be mentioned later.

Thus, the control unit 7 controls the row processing unit 5 and column processing unit 6 to repeat the processes of steps 1 and 2 until the result of the parity check indicates O.K. or the number of iterations reaches its maximum $I_{max}$ which is set up, as shown in the above-mentioned equation (7).

When the result of the parity check by the decoded result judgment unit 8 indicates O.K. or the number of iterations i set up by the control unit 7 reaches its maximum $I_{max}$, the control unit 7, in step 3 (in step ST5), makes the row processing unit 5 and column processing unit 6 end their decoding processings, and the decoded result judgment unit 8 outputs a decoded sequence as shown by the above-mentioned equation (6) as a decoded result.

As mentioned above, when multi-level-modulating data with an LDPC code having a check matrix having an upper right triangular area with all its elements 0 and check bits having a symmetrical structure, and transmitting and receiving the coded data, the communications apparatus according to this embodiment 16 transmits and receives the coded data by assigning modulation signal points which are adapted to the code construction to the check bits and performs arithmetic operations on the LSBs of the received signal first after ranking them above MSBs when decoding the received signal according to the Shuffled BP algorithm. Therefore, the communications apparatus makes it possible for high-reliability probability information to propagate to LSBs and for the decoding of LSBs to advance quickly, and therefore can reduce the number of iterations.

In above-mentioned embodiment 16, an example of carrying out the control of the sequence of decoding operations of the Shuffled BP algorithm is shown. As an alternative, this embodiment can be similarly applied to another decoding algorithm of performing a calculation and an update of probability information with row processing and column processing on the received signal in batches of one bit or a predetermined number of bits. Furthermore, the multi-level modulation method of 4PAM type is previously explained as an example, though another multi-level modulation method which causes a variation in the error rate for every bit is similarly used.

Furthermore, in above-mentioned embodiment 16, the modulation method of 4PAM type is shown as an example. As an alternative, another multi-level modulation method which causes a difference in the bit error rate can be used. In this case, when bits having a high error rate are assigned to the check bits, LSBs having a high error rate can be sequentially decoded first prior to any other bits.

Embodiment 17

A decoding apparatus according to this embodiment 17 is so constructed as to parallelize decoding operations when carrying out decoding processing according to an algorithm, like the Shuffled BP algorithm, of performing a calculation and an update of probability information with row processing and column processing on a received signal in batches of one 1 bit or two or more predetermined bits.

Figure 29:
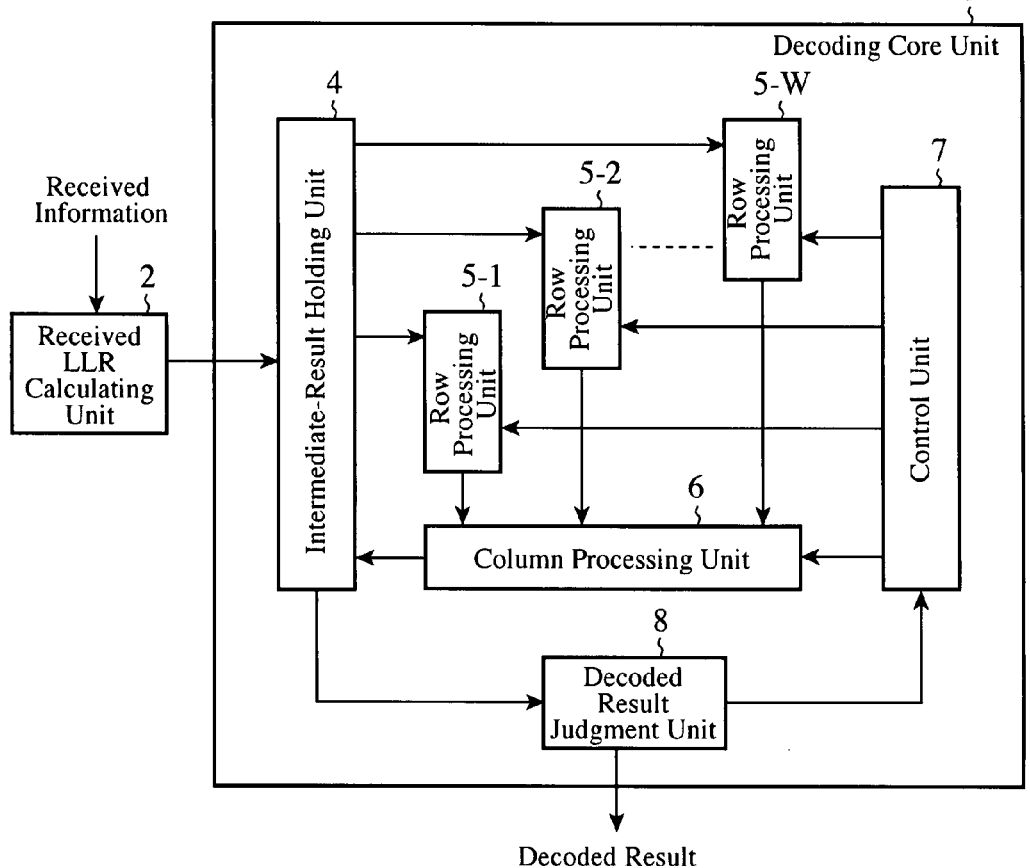
FIG. 29 is a block diagram showing the structure of an LDPC code decoding apparatus in accordance with embodiment 17 of the present invention.

FIG. 29 is a block diagram showing the structure of the LDPC code decoding apparatus in accordance with embodiment 17 of the present invention. The LDPC code decoding apparatus 1 in accordance with embodiment 17 is provided with a received LLR calculating unit 2 and a decoding core unit 3, like those according to the above-mentioned embodiments. The decoding core unit 3 in accordance with this embodiment 17 includes a plurality of row processing units 5-1 to 5-w which carry put row processing in parallel according to the magnitude of a row weight, and a column processing unit 6 which carries out column processing according to processed results from those row processing units, in addition to a decoded intermediate-result holding unit 4, a control unit 7, and a decoded result judgment unit 8.

That is, in general, according to the Shuffled BP algorithm, the row processing is performed on each row which has 1 in a selected column, and the column processing is then performed on the column. In contrast, the LDPC code decoding apparatus 1 in accordance with embodiment 17 performs in parallel arithmetic operations during the row processing and the column processing when carrying out the decoding processing according to the Shuffled BP algorithm.

Next, the operation of the decoding apparatus in accordance with this embodiment of the present invention will be explained.

First, the received LLR calculating unit 2 inputs received information, and calculates a received LLR from this received information. Next, in an initialization step, the received LLR calculating unit 2 sets the calculated received LLR to the intermediate-result holding unit 4 as an initial value $z_{m,n}^{(0)}(:=F_n)$. At this time, the control unit 7 initializes the number of iterations i of decoding to i=1.

Next, until the number of iterations changes from i=1 to i=the last decoding time (i.e., a maximum number of iterations $I_{max}$), an iterative decoding process of step 1 including the row processing according to the above-mentioned equations (2) and (3) by means of the plurality of row processing units 5-1 to 5-w, and the column processing according to the above-mentioned equations (4) and (5) by means of the column processing unit 6, and a decision process of step 2 according to the above-mentioned equation (7) by means of the decoded result judgment unit 8 are repeatedly carried out.

A decoding operation at the ith iteration will be explained as an example.

Figure 30:
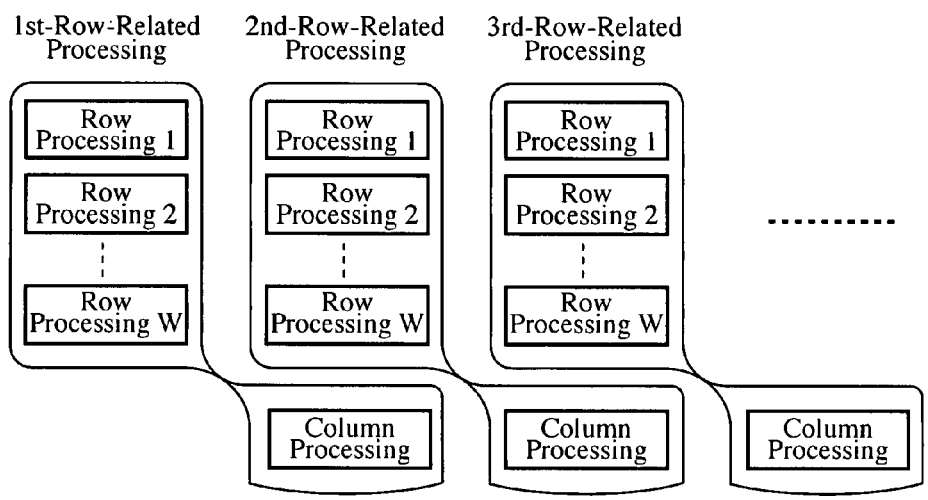
FIG. 30 is a block diagram for explaining an example of decoding operations performed by a row processing unit and a column processing unit shown in FIG. 29.

FIG. 30 is a block diagram for explaining decoding operations performed by the plurality of row processing units and column processing unit shown in FIG. 29. A flow of the decoding operations will be explained with reference to this figure.

First, the plurality of row processing units 5-1 to 5-w perform in parallel the row operations on w rows each of which has 1 in the 1st column of the check matrix H ($=[H_{m,n}]$) of an LDPC code to be decoded at the time of g=1 in the above-mentioned equation (1), and deliver the processed results to the column processing unit 6.

Next, at the time of g=2, the column processing unit 6 performs the column processing on the 1st column of the check matrix, and makes the intermediate-result holding unit 4 hold the processed result. On the other hand, the plurality of row processing units 5-1 to 5-w perform in parallel the row operations on w rows each of which has 1 in the 2nd column of the check matrix, and deliver the processed results to the column processing unit 6.

Next, at the time of g=3, the column processing unit 6 performs the column processing on the 2nd column of the check matrix, and makes the intermediate-result holding unit 4 hold the processed result. The plurality of row processing units 5-1 to 5-w perform in parallel the row operations on w rows each of which has 1 in the 3rd column of the check matrix, and deliver the processed results to the column processing unit 6.

Similarly, at the time of g=4 or larger, the plurality of row processing units 5-1 to 5-w perform in parallel the row operations on w rows each of which has 1 in the 4th or subsequent column of the check matrix one after another, and deliver the processed results to the column processing unit 6. On the other hand, the column processing unit 6 performs the column processing on the 3rd or subsequent column of the check matrix one after another, and makes the intermediate-result holding unit 4 hold the processed result. Thus, because the decoding apparatus parallelizes the decoding operations, it can reduce the processing time.

In step 2, the decoded result judgment unit 8 carries out a hard decision of a posterior value $z_n^{(i)}$ which is calculated by the column processing unit 6 at the ith iteration, determines a decoded result, and performs a parity check on the decoded result. At this time, if the result of the parity check indicates NG, the control unit 7 increments the number of iterations i by one, and then makes the row processing units 5 and column processing unit 6 carry out the process of step 1. In contrast, if the condition shown by the above-mentioned equation (7) is satisfied, the control unit make them shift to a process of step 3 which will be mentioned later.

Thus, the control unit 7 controls the row processing units 5 and column processing unit 6 to repeat the processes of steps 1 and 2 which are based on the above-mentioned equation (8) until the result of the parity check indicates O.K. or the number of iterations reaches its maximum $I_{max}$ which is set up, as shown in the above-mentioned equation (7).

When the result of the parity check by the decoded result judgment unit 8 indicates O.K. or the number of iterations i set up by the control unit 7 reaches its maximum $I_{max}$, the control unit 7, in step 3 (in step ST5), makes the row processing units 5 and column processing unit 6 end their decoding processings, and the decoded result judgment unit 8 outputs a decoded sequence as shown by the above-mentioned equation (6) as a decoded result.

In the case in which the row and column processings are parallelized, as mentioned above, it can be assumed that the results of the row processing on the immediately previous row cannot be reflected through the next row processing, and therefore efficient transmission of probability transmission which is a feature of the Shuffled BP algorithm is delayed. However, in general, elements which have 1 in the LDPC code matrix appear very seldom, and adjacent columns of the LDPC code matrix do not almost have 1s. For this reason, if the check matrix is the one of a general LDPC code, there is no large influence on the probability transmission.

Figure 31:
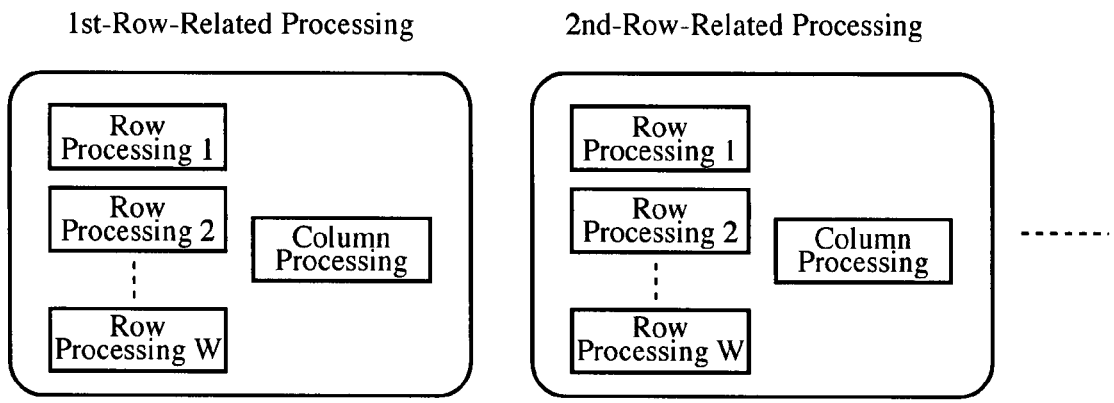
FIG. 31 is a block diagram for explaining another example of the decoding operations performed by the row processing unit and column processing unit shown in FIG. 29.

FIG. 31 is a block diagram for explaining another example of the decoding operations performed by the row processing units and column processing unit shown in FIG. 29. As mentioned above, according to the general Shuffled BP algorithm, because adjacent columns of the LDPC code matrix do not almost have 1s, there is no large influence on the probability transmission. In a case in which 1s are adjacent to each other in the check bit portion, as in the case of the LDPC code matrix of FIG. 21 shown in above-mentioned embodiment 12, only the row processing parallelized has only to be carried out, as shown in FIG. 31.

A decoding operation at the ith iteration will be explained concretely as an example.

First, at the time of g=1 in the above-mentioned equation (1), the plurality of row processing units 5-1 to 5-w perform in parallel the row operations on w rows each of which has 1 in the 1st column of the check matrix H ($=[H_{m,n}]$) of an LDPC code to be decoded, and deliver the processed results to the column processing unit 6. The column processing unit 6 performs the column processing on the 1st column of the check matrix, and makes the intermediate-result holding unit 4 hold the processed result.

Next, at the time of g=2, the plurality of row processing units 5-1 to 5-w perform in parallel the row operations on w rows each of which has 1 in the 2nd column of the check matrix, and deliver the processed results to the column processing unit 6. The column processing unit 6 performs the column processing on the 2nd column of the check matrix, and makes the intermediate-result holding unit 4 hold the processed result.

Next, at the time of g=3, the plurality of row processing units 5-1 to 5-w perform in parallel the row operations on w rows each of which has 1 in the 3rd column of the check matrix, and deliver the processed results to the column processing unit 6. The column processing unit 6 performs the column processing on the 3rd column of the check matrix, and makes the intermediate-result holding unit 4 hold the processed result.

Similarly, at the time of g=4 or larger, the plurality of row processing units 5-1 to 5-w perform in parallel the row operations on w rows each of which has 1 in the 4th or subsequent column of the check matrix one after another, and deliver the processed results to the column processing unit 6. On the other hand, the column processing unit 6 performs the column processing on the 4th or subsequent column of the check matrix one after another, and makes the intermediate-result holding unit 4 hold the processed result.

As mentioned above, because the decoding apparatus according to this embodiment 17 is provided with the plurality of row processing units 5-1 to 5-$w$, and column processing unit 6 which carry out in parallel the decoding operations according to the Shuffled BP algorithm, the processing time required for the decoding operations can be reduced and therefore the delay which is caused by the decoding processing can be reduced.

In above-mentioned embodiment 17, the example in which the arithmetic operations in the row processing and column processing according to the Shuffled BP algorithm are parallelized is shown. Similarly, this embodiment can be applied to another decoding algorithm of performing a calculation and an update of probability information with row processing and column processing on the received signal in batches of one bit or a predetermined number of bits.

Embodiment 18

A decoding apparatus in accordance with this embodiment 18 performs decoding operations in parallel on the basis of the code construction of LDPC codes having cyclic construction when decoding LDPC codes having cyclic construction according to a decoding algorithm of performing a calculation and an update of probability information with row processing and column processing on a received signal in batches of one bit or a predetermined number of bits, like the Shuffled BP algorithm.

Although the LDPC code decoding apparatus in accordance with this embodiment 18 has fundamentally the same structure as that of the LDPC code decoding apparatus in accordance with above-mentioned embodiment 17 shown in FIG. 29, a plurality of row processing units carry out different processes because the LDPC code decoding apparatus in accordance with this embodiment performs the decoding operations in parallel on the basis of the code construction of LDPC codes having cyclic construction. Hereinafter, a structure of carrying out the decoding operations in parallel using the feature of the code construction of quasi-cyclic codes according to the Shuffled BP algorithm will be explained concretely as an example.

Figure 32:
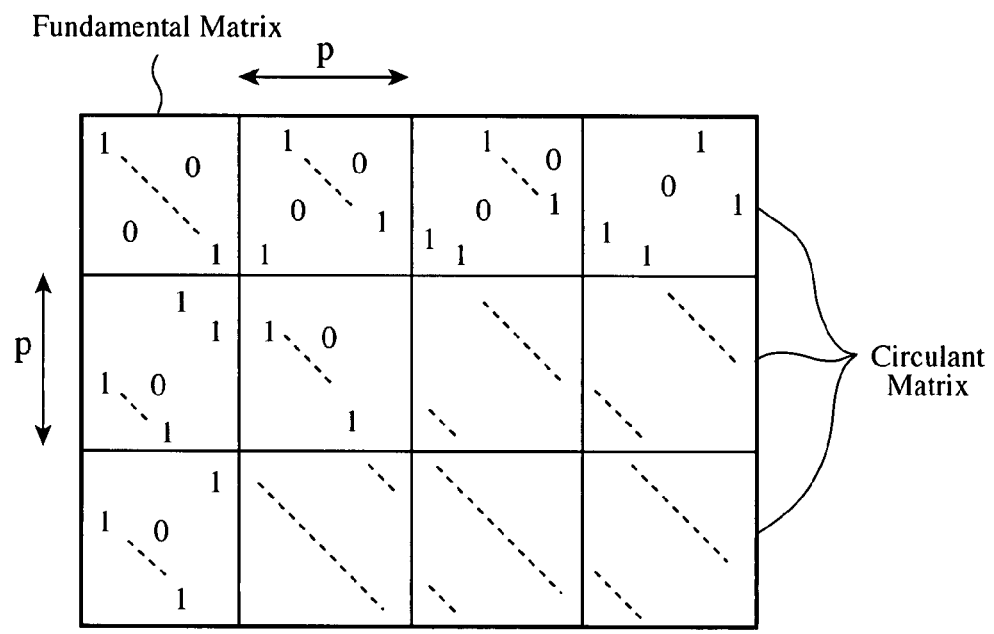
FIG. 32 is a schematic diagram of a quasi-cyclic code.

As shown in schematic diagram of FIG. 32, a quasi-cyclic code consists of a combination of a fundamental matrix $I(0)$ which is a unit matrix, and matrices $I(1), I(2), I(3), \ldots,$ and $I(k)$ which are cyclic permutations of the fundamental matrix. The thus-constructed quasi-cyclic code is expressed as $H=[H_{m,n}]$, where, n is an integer equal to or larger than 0 and smaller than N, m is an integer equal to or larger than 0 and smaller than M, and $H_{m,n}$ is an element in the mth row and nth column of the matrix H. A subset $N(m)$ of the set $[1,N]$ is defined as $N(m)=\{n:H_{m,n}=1\}$, and a subset $M(n)$ of the set $[1,N]$ is defined as $M(n)=\{m:H_{m,n}=1\}$.

That is, $N(m)$ means a set of the indices of columns in each of which 1 appears in the mth row of the check matrix H, and $M(n)$ means a set of the indices of rows in each of which 1 appears in the nth row of the check matrix H. The unit matrix has a size of ($p \times p$). In the example of FIG. 32, N=4p and M=3p, and the quasi-cyclic code has the following features.
(Feature 1)
$M(n)=\{m:H_{m,n}=1\}$ (n is equal to or larger than 1 and equal to or smaller than p) do not have 1 in the same row.
$M(n)=\{m:H_{m,n}=1\}$ (n is equal to or larger than p and equal to or smaller than 2p) do not have 1 in the same row.
$M(n)=\{m:H_{m,n}=1\}$ (n is equal to or larger than 2p and equal to or smaller than 3p) do not have 1 in the same row.

(Feature 2)
$N(m)=\{n:H_{m,n}=1\}$ (m is equal to or larger than 1 and equal to or smaller than p) do not have 1 in the same column.
$N(m)=\{n:H_{m,n}=1\}$ (m is equal to or larger than p and equal to or smaller than 2p) do not have 1 in the same column.
$N(m)=\{n:H_{m,n}=1\}$ (m is equal to or larger than 2p and equal to or smaller than 3p) do not have 1 in the same column.

When decoding such a quasi-cyclic code according to the Shuffled BP algorithm, the decoding apparatus can carry out the column processing in parallel when n is equal to or larger than 1 and equal to or smaller than p from the viewpoint of feature 1, but does not retrieve the same column to carry out the row processing in parallel when m is equal to or larger than 1 and equal to or smaller than p from the viewpoint of feature 2. Therefore, in a case in which the decoding apparatus is implemented via hardware, there is provided an advantage of not accessing the same memory.

The LDPC code decoding apparatus in accordance with this embodiment 18 is provided with a received LLR calculating unit 2 which calculates a received LLR from received information and a decoding core unit 3, as mentioned above, and carries out the decoding operations in parallel using the features of the code construction of quasi-cyclic codes by means of the decoding core unit 3. The decoding core unit 3 is provided with a intermediate-result holding unit 4, a plurality of row processing units 5-1 to 5-$p$, a column processing unit 6, a control unit 7, and a decoded result judgment unit 8.

The intermediate-result holding unit 4 holds intermediate results of the decoding processing carried out by the plurality of row processing units 5-1 to 5-$p$ and column processing unit 6, as previously explained in above-mentioned embodiment 17. The plurality of row processing units 5-1 to 5-$p$ are disposed for p rows which correspond to all the rows of the unit matrix of a quasi-cyclic code as shown in FIG. 32. That is, the plurality of row processing units are disposed in parallel so as to match the size of the fundamental matrix having cyclic construction. The column processing unit 6 carries out the column processing.

The control unit 7 performs control of decoding iterations, such as a setup of a maximum number of iterations. The decoded result judgment unit 8 calculates a decoded sequence which is a decoded result from a hard decision of a posterior value calculated by the column processing unit 6 using the above-mentioned equation (6), and performs a parity check on the decoded result so as to judge whether or not the decoded result is correct from the condition shown by the above-mentioned equation (7).

Next, the operation of the decoding apparatus in accordance with this embodiment of the present invention will be explained.

First, when the received LLR calculating unit 2 inputs received information, it calculates a received LLR from this received information. Next, in an initialization step, the received LLR calculating unit 2 sets the calculated received LLR to the intermediate-result holding unit 4 as an initial value $z_{m,n}^{(0)}(:=F_n)$. At this time, the control unit 7 initializes the number of iterations i of decoding to i=1.

Next, until the number of iterations changes from i=1 to i=the last decoding time (i.e., a maximum number of iterations $I_{max}$), an iterative decoding process of step 1 including the row processing by means of the plurality of row processing units 5-1 to 5-$p$, and the column process by means of the column processing unit 6, and a decision process of step 2 according to the above-mentioned equation (7) by means of the decoded result judgment unit 8 are repeatedly carried out.

A decoding operation at the ith iteration will be explained as an example.

Figure 33:
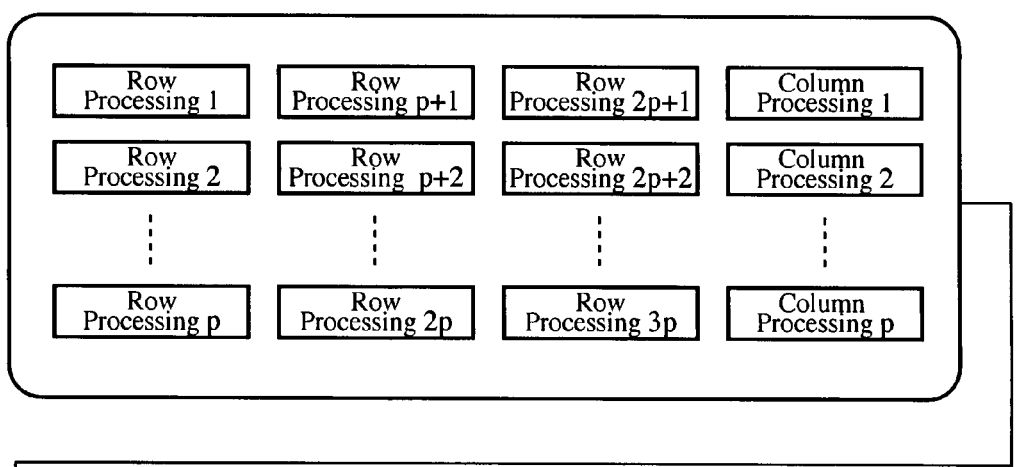
FIG. 33 is a block diagram for explaining decoding operations performed by a row processing unit and a column processing unit in accordance with embodiment 18 of the present invention.
Figure 33:
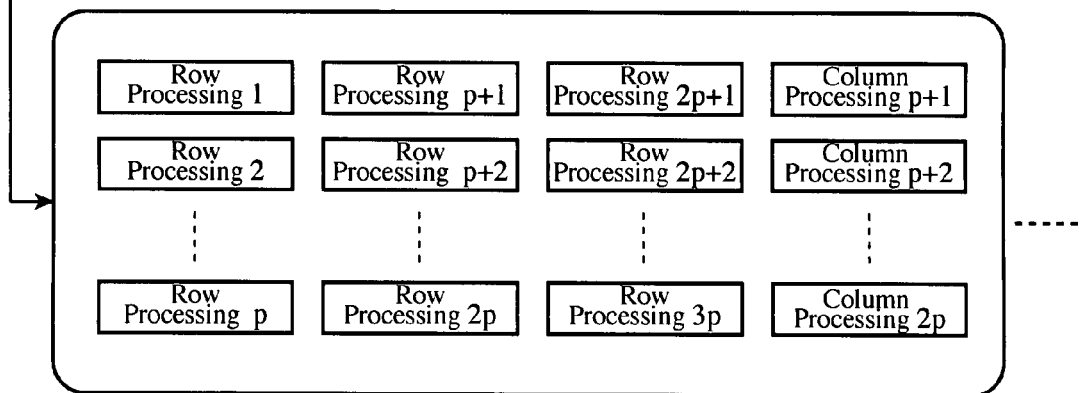

FIG. 33 is a block diagram for explaining the decoding operations carried out by the row processing units and the column processing unit in accordance with embodiment 18. A flow of the decoding operations will be explained with reference to this figure.

First, the plurality of row processing units 5-1 to 5-$p$ perform in parallel the row processing on the 1st to pth rows in each of theist to pth columns of the check matrix H ($=[H_{m,n}]$) of an LDPC code to be decoded, perform in parallel the row processing on the pth to 2pth rows in each of 1st to pth columns of the check matrix, perform in parallel the row processing on the 2pth to 3pth rows in each of the 1st to pth columns of the check matrix, and then delivers the processed results to the column processing unit 6.

In the row processing associated with the 1st to pth columns, the decoding apparatus performs arithmetic operations using the above-mentioned equations (2) and (3) under a condition shown by the following equation (27).

[Equation 19]

$$1 \leq n \leq p, m \in M(n) \quad (27)$$

Next, the column processing unit 6 performs in parallel the column processing on the 1st to pth columns by using, for example, the above-mentioned equations (4) and (5), and makes the intermediate-result holding unit 4 hold the processed results.

Next, the plurality of row processing units 5-1 to 5-$p$ perform in parallel the row processing on the 1st to pth rows in each of the pth to 2pth columns of the check matrix, perform in parallel the row processing on the pth to 2pth rows in each of the pth to 2pth columns in the check matrix, perform in parallel the row processing on the 2pth to 3pth rows in each of the pth to 2pth columns of the check matrix, and then delivers the processed results to the column processing unit 6. In the row processing associated with the pth to 2pth columns, the decoding apparatus changes n in the above-mentioned equation (27) from p to 2p and performs arithmetic operations using the above-mentioned equations (2) and (3) under the condition shown by the above-mentioned equation (27).

Next, the column processing unit 6 performs in parallel the column processing on the pth to 2pth columns by using, for example, the above-mentioned equations (4) and (5), and makes the intermediate-result holding unit 4 hold the processed results.

Next, the plurality of row processing units 5-1 to 5-$p$ perform in parallel the row processing on the 1st to pth rows in each of the 2pth to 3pth columns of the check matrix, perform in parallel the row processing on the pth to 2pth rows in each of the 2pth to 3pth columns in the check matrix, perform in parallel the row processing on the 2pth to 3pth rows in each of the 2pth to 3pth columns of the check matrix, and then delivers the processed results to the column processing unit 6. In the row processing associated with the 2pth to 3pth columns, the decoding apparatus changes n in the above-mentioned equation (27) from 2p to 3$p$ and performs arithmetic operations using the above-mentioned equations (2) and (3) under the condition shown by the above-mentioned equation (27).

Next, the column processing unit 6 performs in parallel the column processing on the 2pth to 3pth columns by using, for example, the above-mentioned equations (4) and (5), and makes the intermediate-result holding unit 4 hold the processed results.

Next, the plurality of row processing units 5-1 to 5-$p$ perform in parallel the row processing on the 1st to pth rows in each of the 3pth to 4pth columns of the check matrix, perform in parallel the row processing on the pth to 2pth rows in each of the 3pth to 4pth columns in the check matrix, perform in parallel the row processing on the 2pth to 3pth rows in each of the 3pth to 4pth columns of the check matrix, and then delivers the processed results to the column processing unit 6. In the row processing associated with the 3pth to 4pth columns, the decoding apparatus changes n in the above-mentioned equation (27) from 3p to 4$p$ and performs arithmetic operations using the above-mentioned equations (2) and (3) under the condition shown by the above-mentioned equation (27).

Next, the column processing unit 6 performs in parallel the column processing on the 3pth to 4pth columns by using, for example, the above-mentioned equations (4) and (5), and makes the intermediate-result holding unit 4 hold the processed results.

In the above-mentioned example of the decoding processing, the row processing is separately carried out for the 1st to pth rows, the pth to 2pth rows, and the 2pth to 3pth rows using feature 2 of quasi-cyclic codes, as previously mentioned. As an alternative, the row processing can be carried out in parallel for all of the 1st to 3pth rows.

In step 2, the decoded result judgment unit 8 carries out a hard decision of a posterior value $z_n^{(i)}$ which is calculated by the column processing unit 6 at the ith iteration, determines a decoded result, and performs a parity check on the decoded result. At this time, if the result of the parity check indicates NG, the control unit 7 increments the number of iterations i by one, and then makes the row processing unit 5 and column processing unit 6 carry out the process of step 1. In contrast, if the condition shown by the above-mentioned equation (7) is satisfied, the control unit make them shift to a process of step 3 which will be mentioned later.

Thus, the control unit 7 controls the row processing units 5 and column processing unit 6 to repeat the processes of steps 1 and 2 which are based on the above-mentioned equation (8) until the result of the parity check indicates O.K. or the number of iterations reaches its maximum $I_{max}$ which is set up, as shown in the above-mentioned equation (7).

When the result of the parity check by the decoded result judgment unit 8 indicates O.K. or the number of iterations i set up by the control unit 7 reaches its maximum $I_{max}$, the control unit 7, in step 3 (in step ST5), makes the row processing units 5 and column processing unit 6 end their decoding processings, and the decoded result judgment unit 8 outputs a decoded sequence as shown by the above-mentioned equation (6) as a decoded result.

As mentioned above, when decoding an LDPC code having cyclic construction, like a quasi-cyclic code, according to the Shuffled BP algorithm, the decoding apparatus according to this embodiment 18 uses the features of the cyclic construction. Therefore, the decoding apparatus can parallelize the row processing and the column processing, and therefore the processing time required for the decoding operations can be reduced and the delay which is caused by the decoding processing can be reduced.

In above-mentioned embodiment 18, the Shuffled BP algorithm is explained as an example. Similarly, this embodiment can be applied to another decoding algorithm of performing a calculation and an update of probability information with row processing and column processing on a received signal in batches of one bit or a predetermined number of bits. In addition, quasi-cyclic codes are mentioned as an example of LDPC codes having cyclic construction, though this embodiment can be similarly applied to LDPC codes having other cyclic construction.

Embodiment 19

A decoding apparatus according to this embodiment 19 has, as a decoding algorithm, a correction-type Max-Log-MAP algorithm of making a correction to a Max-Log-MAP algorithm using a correction term which can be computed only with a subtraction operation and a bit-shift operation on received information.

Figure 34:
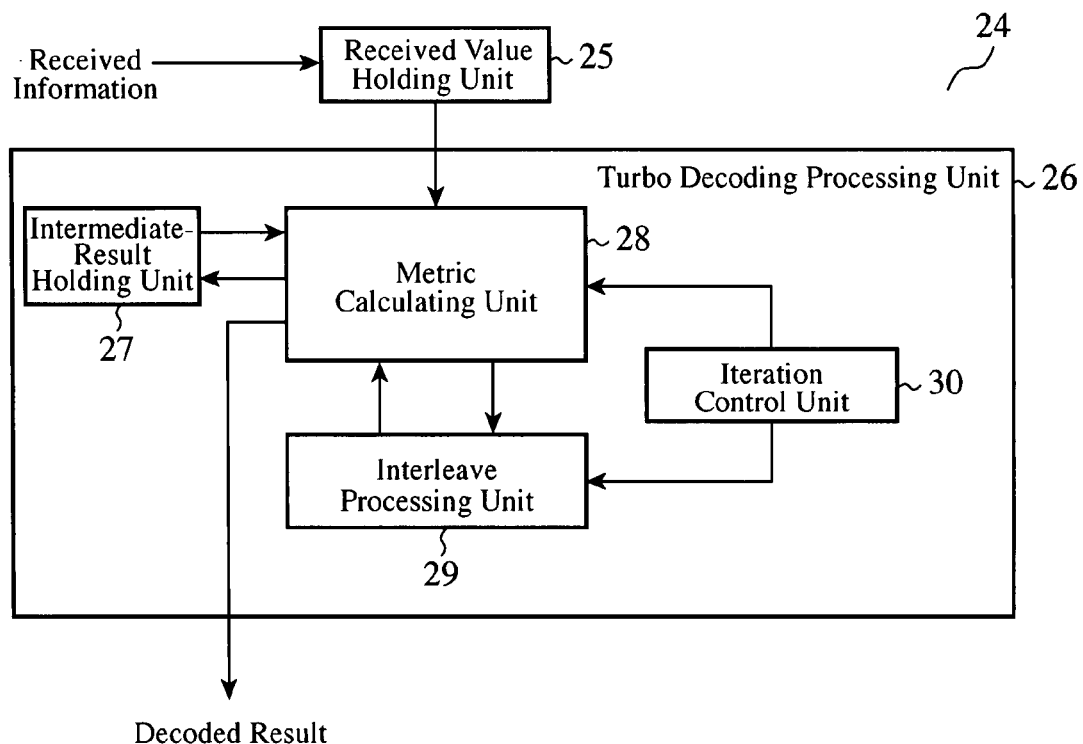
FIG. 34 is a block diagram showing the structure of a turbo code decoding apparatus in accordance with embodiment 19 of the present invention.

FIG. 34 is a block diagram showing the structure of the turbo code decoding apparatus in accordance with embodiment 19 of the present invention. The turbo code decoding apparatus 24 in accordance with this embodiment 19 is provided with a received value holding unit 25 and a turbo decoding processing unit 26. In a case of turbo codes, an information bit sequence di and a parity bit sequence $p^1_i$ of the information bit sequence, and a parity bit sequence $p^2_i$ of the information bit sequence interleaved are transmitted as encoded information. The received value holding unit 25 separately hold the received values $R_i$, $P^1_i$ and $P^2_i$ of the information bit sequences therein, and outputs them to the turbo decoding processing unit 26. The turbo decoding processing unit 26 is provided with an intermediate-result holding unit 27, a metric calculating unit 28, an interleave processing unit 29, and an iteration control unit 30.

The intermediate result holding unit 27 holds intermediate results of decoding processing carried out by the metric calculating unit 28 on the basis of the received values inputted from the received value holding unit 25. The metric calculating unit 28 carries out a calculation of a metric value according to the correction-type Max-Log-MAP algorithm of making a correction using the above-mentioned correction term, and outputs a decoded result. The interleave processing unit 29 carries out interleave processing according to the turbo coding. The iteration control unit 30 controls the iteration of the decoding processing carried out by the metric calculating unit 28 and interleave processing unit 29.

In the processing according to the Max-Log-MAP algorithm, the metric calculating unit 28 uses the following equation:

[Equation 20]

$$F(A_1,A_2)==\text{MAX}(A_1,A_2)$$

(MAX is an operation of selecting a maximum of two input values) (28)

In contrast, according to the correction-type Max-Log-MAP algorithm, the metric calculating unit carries out a calculation and an update of the metric value by correcting for a maximum value as follows:

[Equation 21]

$$F(A_1, A_2) = \max(A_1, A_2) + \delta \quad \left(\delta = C - \frac{1}{2}|A_1 - A_1|\right) \quad (29)$$

In the above-mentioned equation (29), the correction term δ for use in the Max-Log-MAP algorithm is an approximation term which can be acquired from a series expansion of an update equation based on the Log-MAP algorithm, and can be computed only with the difference between the absolute values of two inputs, a division by 2, and a subtraction from a constant C.

An example of the constant C is ln(2) which is acquired with a rough calculation using the update equation based on the Log-MAP algorithm, and it is also possible to improve the decoding performance by setting an appropriate value to the constant C. Furthermore, the division by 2 can be implemented with a 1-bit bit shift operation in a system, such as hardware, in which numbers are expressed as binary numbers.

The interleave processing unit 29 provides information required for carrying out a process of interleaving a turbo code to be decoded to the metric calculating unit 28, and the iteration control unit 30 controls the number of iterations and switches between a mode in which the interleave processing unit carries out the interleaving process and a mode in which the interleave processing unit does not carry out the interleaving process.

Next, the operation of the decoding apparatus in accordance with this embodiment of the present invention will be explained.

Figure 35:
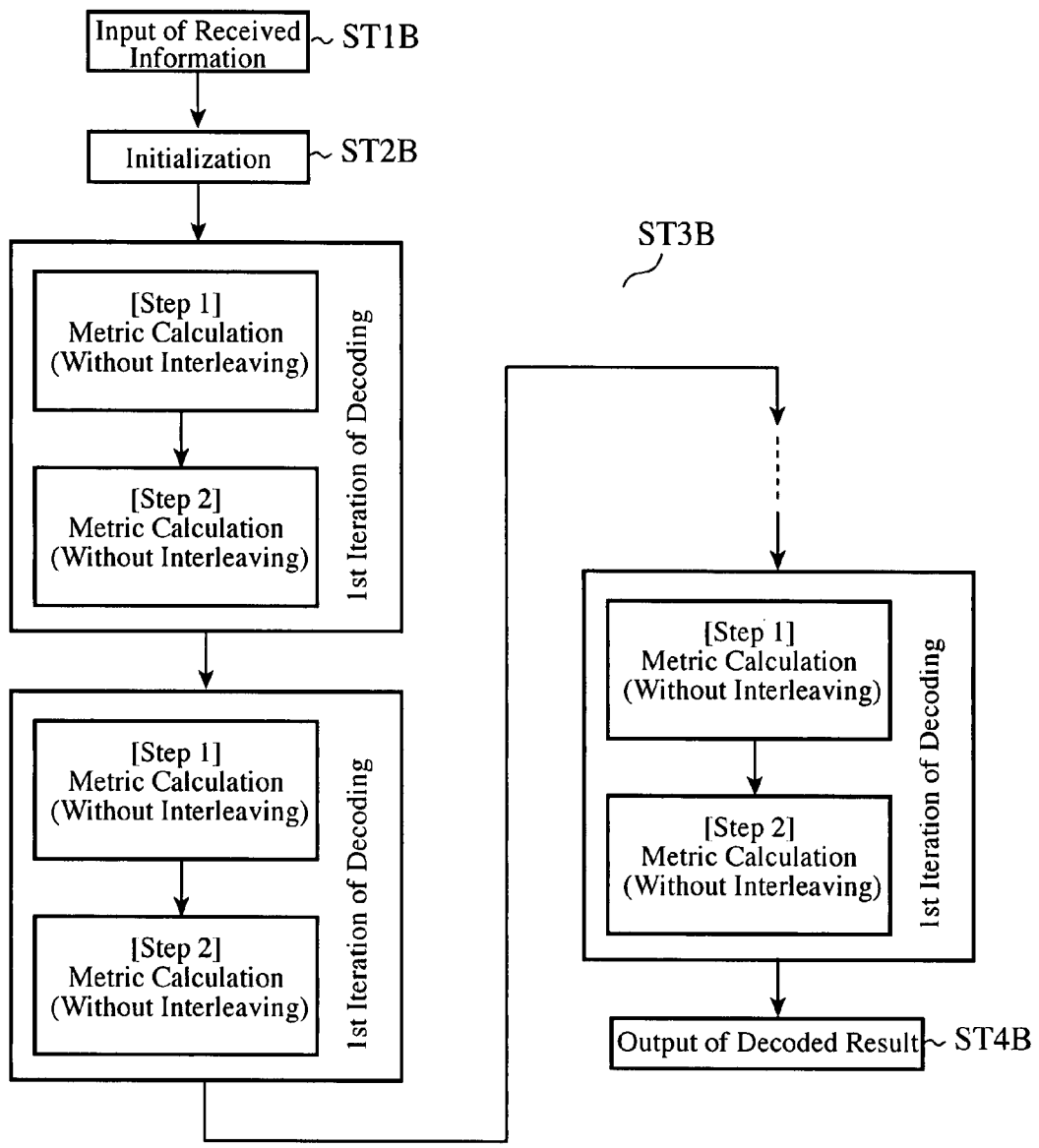
FIG. 35 is a flow chart showing the operation of the turbo code decoding apparatus in accordance with embodiment 19.

FIG. 35 is a flow chart showing the operation of the turbo code decoding apparatus in accordance with embodiment 19, and the operation of the turbo code decoding apparatus will be explained with reference to this figure.

First, the received value holding unit 25 separately holds, as received information, the received values $R_i$, $P^1_i$ and $P^2_i$ therein (in step ST1). Next, in an initialization step (in step ST2), the iteration control unit 30 initializes the number of iterations i of decoding to i=1.

Next, until the number of iterations changes from i=1 to i=the last decoding time (i.e., a maximum number of iterations $I_{max}$), an iterative decoding process of step 1 by means of the metric calculating unit and interleave processing unit is carried out repeatedly.

A decoding operation at the ith iteration will be explained as an example.

First, in step 1, the metric calculating unit 5 performs a metric calculation on the received values without interleaving when performing the decoding operation at the ith iteration on the turbo code to be decoded. To be more specific, the metric calculating unit performs a metric calculation on the received values $R_i$ and $P^1_i$ according to the Max-Log-MAP algorithm of making a correction using the above-mentioned equation (29), and makes the intermediate-result holding unit 27 hold the processed results. In order to carry out the metric calculation without interleaving, when retrieving the received values $R_i$ and $P^1_i$ from the received value holding unit, the metric calculating unit increments i sequentially to search through the contents of the received value holding unit from the head.

In step 2, the metric calculating unit 5 performs a metric calculation on the received values with interleaving when performing the decoding operation at the ith iteration on the turbo code to be decoded. To be more specific, the metric calculating unit performs a metric calculation on the received value $P^2_i$ and the interleaved received value $R_i$ according to the Max-Log-MAP algorithm of making a correction using the above-mentioned equation (29), and makes the intermediate-result holding unit 27 hold the processed results. In order to interleave the received value $R_i$, the metric calculating unit receives information on a number i from the interleave processing unit to retrieve the received value from the receiving value holding unit 25.

Thus, the iteration control unit 30 controls the metric calculating unit and interleave processing unit to repeat steps 1 and 2 until the number of iterations reaches its maximum $I_{max}$ which is set up thereby.

When the number of iterations i set up by the iteration control unit 30 reaches its maximum $I_{max}$, as step ST4, the iteration control unit 30 terminates the decoding processing carried out by the metric calculating unit 28 and interleave processing unit 29, and then makes the metric calculating unit output the decoded result.

As mentioned above, the decoding apparatus according to this embodiment 19 carries out the decoding processing according to the correction-type Max-Log-MAP algorithm of making a correction to a Max-Log-MAP algorithm using a correction term which can be computed only with a subtraction operation and a bit-shift operation on received information. Therefore, the degradation in the decoding performance can be reduced and the decoding performance can be remarkably improved, as compared with the case of using the prior art Log-MAP algorithm.

In addition, the calculation of the correction term on the basis of the received information can be implemented only with a subtraction operation and a 1-bit-shift operation, and the turbo code decoding apparatus 1 in accordance with embodiment 19 can be implemented via simple hardware.

Embodiment 20

Figure 36:
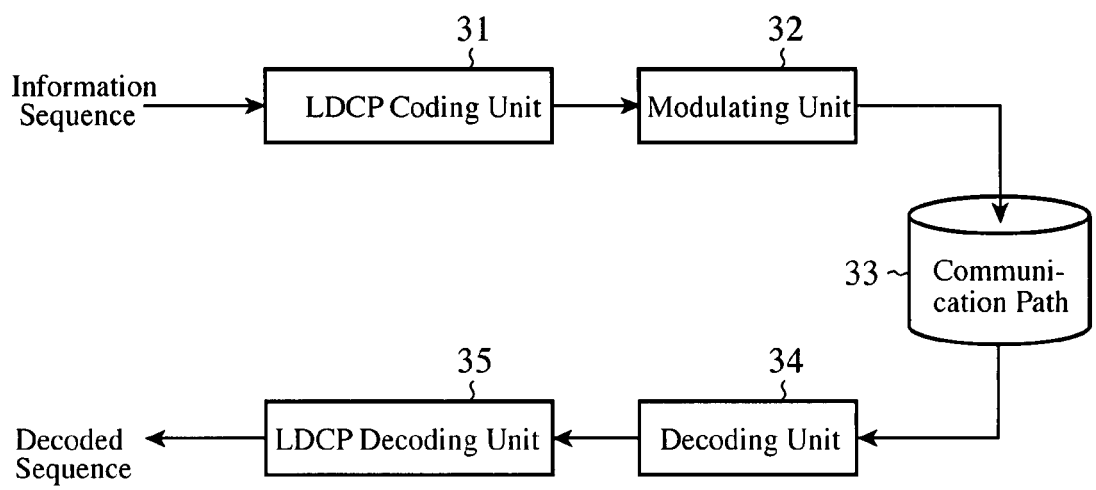
FIG. 36 is a diagram showing an example of the structure of a communications system of this embodiment including an LDPC decoding unit.

In this embodiment 20, a system which carries out decoding processing according to either of above-mentioned embodiments 1 to 19 will be explained. For example, the LDPC decoding processing in accordance with the present invention can be applied to communication equipment, such as a mobile communications apparatus (a terminal and a base station), a wireless LAN, an optical communications system, a satellite communications system, and a quantum encryption apparatus. Concretely, as shown in FIG. 36, the system is so constructed as to include an LDPC coding unit 31, a modulator 32, a communication path 33, a demodulating unit 34, and an LDPC decoding unit 35. This system includes, as the LDPC decoding unit 35 thereof, includes a decoding unit shown in either of above-mentioned embodiments 1 to 19, and carries out an error correction.

Figure 37:
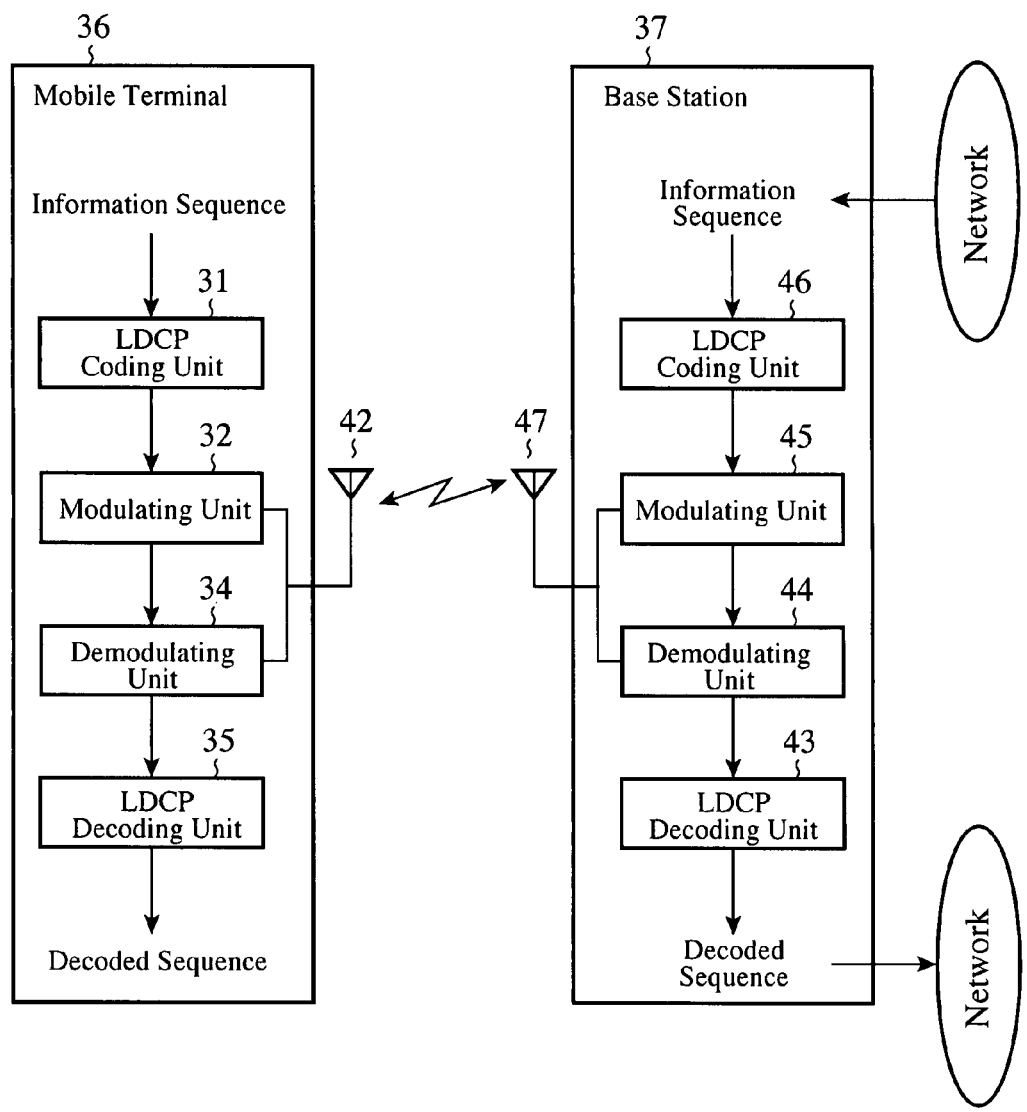
FIG. 37 is a diagram showing an example of the structure of a mobile communications system.

FIG. 37 is a diagram showing the structure of an example in which the decoding processing in accordance with the present invention is applied to a mobile communications system provided with a mobile terminal 36 and a base station 37 which communicates with this mobile terminal 36. As shown in the figure, the mobile terminal 36 is provided with an LDPC coding unit 31, a modulating unit 32, a demodulating unit 34, an LDPC decoding unit 35, and an antenna 42. The base station 37 is provided with an LDPC decoding unit 43, a demodulating unit 44, a modulating unit 45, an LDPC coding unit 46, and an antenna 47.

As each of the LDPC decoding units 35 and 43 of the mobile terminal 36 and base station 37, an LPDC decoding apparatus having a structure according to either of above-mentioned embodiments 1 to 19 is used.

In the mobile communications system constructed as mentioned above, when the mobile terminal 36 transmits data, the LDPC coding unit 37 encodes the data and the mobile terminal sends out the coded data onto a radio channel via the modulating unit 38 and antenna 41 thereof.

On the other hand, the base station 37 receives the signal containing an error which has occurred in the radio channel via the antenna 47 and demodulating unit 44 thereof, and then corrects for the received data demodulated using the LDPC decoding unit 43. In a case in which the mobile terminal 36 receives various data from the network, the base station 37 transmits various coded data to the mobile terminal 36 by carrying out the same processing as mentioned above, and the mobile terminal 36 receives and decodes the various data.

When transmitting coded data to the mobile terminal 36, the base station 37 encodes data using the LDPC coding unit 46, and sends out the coded data onto a radio channel via the modulating unit 45 and antenna 47 thereof. On the other hand, the mobile terminal 36 receives the signal containing an error which has occurred in the radio channel via the antenna 42 and demodulating unit 34 thereof, and then corrects for the received data demodulated using the LDPC decoding unit 35.

As mentioned above, the mobile communications system according to this embodiment 20 carries out the decoding processing shown in either of above-mentioned embodiments 1 to 19. Therefore, the present embodiment offers the same advantages as shown in either of above-mentioned embodiments 1 to 19 in the decoding processing carried out by each of the mobile terminal 36 and base station 37.

INDUSTRIAL APPLICABILITY

As mentioned above, the decoding method in accordance with the present invention is useful as a decoding technology for use in digital communications, and is suitable particularly for a communications apparatus which adopts an LDPC coding method as a coding method.

The invention claimed is:
1. A decoding apparatus comprising:
a decoder configured to calculate and update probability information with row processing and column processing according to a Min-Sum algorithm on a received low-density parity-check (LDPC) signal coded in batches of a predetermined bit size;
where said calculation of probability information includes calculating a correction term from said received signal; and
where said update of probability information includes performing an update operation in the row processing with an update equation for correcting for a first log-likelihood ratio, which is said probability information, with said correction term;
wherein said first log-likelihood ratio is calculated with the row processing; and
where said calculation and update includes dividing said first log-likelihood ratio by a predetermined constant so as to adjust a size of said first log-likelihood ratio to substantially a same size as that of a second log-likelihood ratio which is calculated according to a Sum-Product algorithm.

2. The decoding apparatus according to claim 1, wherein the predetermined bit size is at least 1 bit.

3. A decoding apparatus comprising:
a decoder configured to calculate and update probability information with row processing and column processing according to a Min-Sum algorithm on a received low-density parity-check (LDPC) signal coded in batches of a predetermined bit size;
where said calculation of probability information includes calculating a correction term from said received signal; and
where said update of probability information includes performing an update operation in the row processing with an update equation for correcting for a first log-likelihood ratio, which is said probability information, with said correction term;
wherein said first log-likelihood ratio is calculated with the row processing; and
where said calculation and update includes subtracting a predetermined constant from the first log-likelihood ratio so as to adjust a size of said first log-likelihood ratio to substantially a same size as that of a second log-likelihood ratio which is calculated according to a Sum-Product algorithm.

4. The decoding apparatus according to claim 3, wherein the predetermined bit size is at least 1 bit.

* * * * *